(12) United States Patent
Nian et al.

(10) Patent No.: US 12,557,619 B2
(45) Date of Patent: Feb. 17, 2026

(54) SEMICONDUCTOR STRUCTURE INCLUDING MULTIPLE BARRIER LAYERS AND METHOD FOR FORMING THE SAME

(71) Applicant: TAIWAN SEMICONDUCTOR MANUFACTURING COMPANY LTD., Hsinchu (TW)

(72) Inventors: Jun-Nan Nian, Tainan (TW); Yao-Hsiang Liang, Hsinchu (TW); Ju Po Tung, Tainan (TW); Chieh-Min Liu, Tainan (TW); Ming-Ching Chung, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 636 days.

(21) Appl. No.: 17/837,783

(22) Filed: Jun. 10, 2022

(65) Prior Publication Data

US 2023/0402320 A1    Dec. 14, 2023

(51) Int. Cl.
- *H01L 21/768* (2006.01)
- *H01L 23/532* (2006.01)
- *H01L 23/535* (2006.01)

(52) U.S. Cl.
CPC .. *H01L 21/76846* (2013.01); *H01L 21/76805* (2013.01); *H01L 21/76849* (2013.01); *H01L 21/76895* (2013.01); *H01L 23/53238* (2013.01); *H01L 23/535* (2013.01)

(58) Field of Classification Search
CPC ......... H01L 21/76846; H01L 21/76805; H01L 21/76849

USPC .......................................................... 257/751
See application file for complete search history.

(56) References Cited

U.S. PATENT DOCUMENTS

| | | | |
|---|---|---|---|
| 2004/0229458 A1* | 11/2004 | Sidhwa | C23C 16/06 257/E21.295 |
| 2005/0003655 A1* | 1/2005 | Cathey | C23C 16/403 438/643 |
| 2005/0181598 A1* | 8/2005 | Kailasam | H01L 21/76843 438/653 |
| 2007/0134932 A1* | 6/2007 | Seo | H01L 21/76841 438/758 |
| 2010/0320604 A1* | 12/2010 | Isobayashi | H01L 21/76805 257/E23.142 |

(Continued)

FOREIGN PATENT DOCUMENTS

JP    2007043018 A  *  2/2007  ......... H01L 21/3205

*Primary Examiner* — Eric W Jones
*Assistant Examiner* — Colin Russell McCutcheon
(74) *Attorney, Agent, or Firm* — WPAT LAW; Anthony King

(57) ABSTRACT

The present disclosure provides a semiconductor structure. The semiconductor structure includes: a substrate; a transistor on the substrate; a first dielectric layer over the transistor; a second dielectric layer over the first dielectric layer; a barrier layer extending from the second dielectric layer to the first dielectric layer; and a conductive structure separated from the second dielectric layer and the first dielectric layer by the barrier layer. The barrier layer includes: a first layer, including titanium or tantalum along inner sidewalls of the first dielectric layer and the second dielectric layer; a second layer, being an oxide of titanium or tantalum and over the first layer; and a third layer, including cobalt and over the second layer.

20 Claims, 53 Drawing Sheets

(56) References Cited

U.S. PATENT DOCUMENTS

| | | | |
|---|---|---|---|
| 2012/0119204 A1* | 5/2012 | Wong | H01L 29/51 |
| | | | 257/E21.409 |
| 2013/0001504 A1* | 1/2013 | Ninomiya | H10N 70/8833 |
| | | | 257/4 |
| 2014/0024535 A1* | 1/2014 | Iino | H01B 12/02 |
| | | | 118/58 |
| 2016/0379876 A1* | 12/2016 | Farooq | H01L 28/90 |
| | | | 257/532 |
| 2020/0126854 A1* | 4/2020 | Motoyama | H01L 21/76879 |
| 2020/0339618 A1* | 10/2020 | Lee | H01L 21/02274 |
| 2021/0036147 A1* | 2/2021 | Wang | H01L 29/1604 |
| 2021/0134951 A1* | 5/2021 | Chen | H01L 21/823857 |
| 2023/0271822 A1* | 8/2023 | de Boer | B81B 3/0021 |
| | | | 257/415 |

* cited by examiner

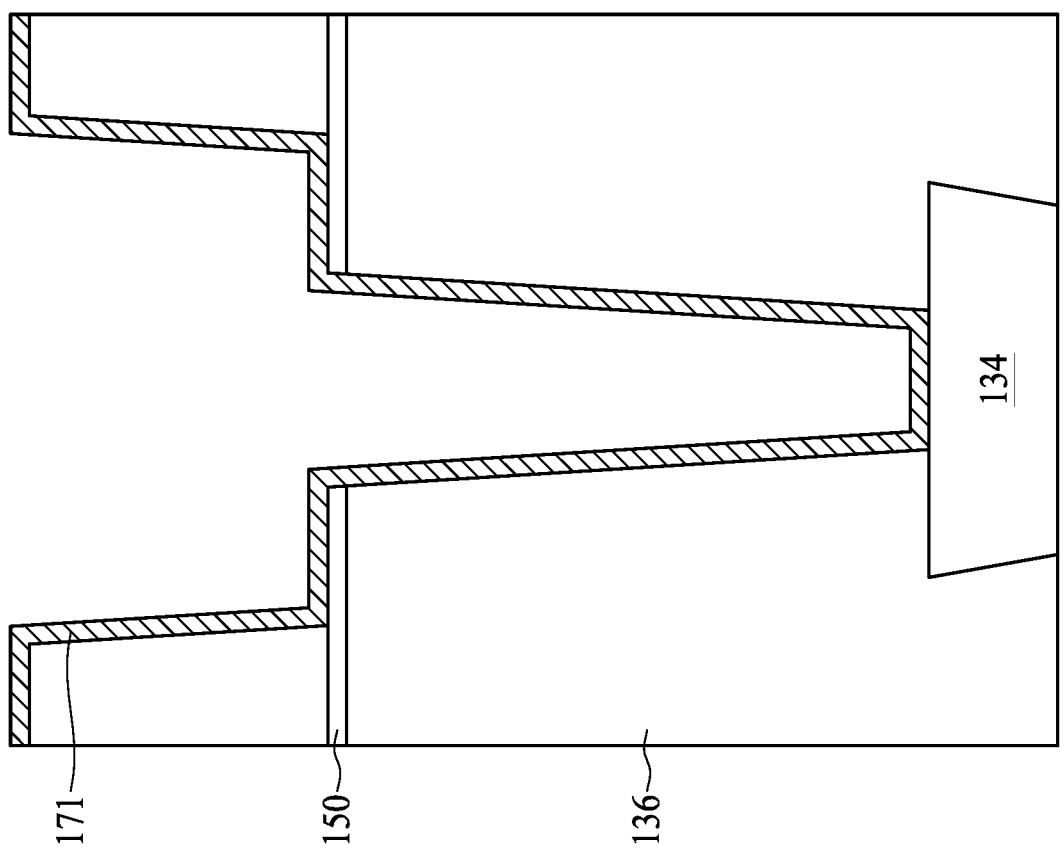

SEMICONDUCTOR STRUCTURE INCLUDING MULTIPLE BARRIER LAYERS AND METHOD FOR FORMING THE SAME

BACKGROUND

Copper interconnects are formed using "single-damascene" or "dual-damascene" fabrication methods, which are different from methods used to form aluminum interconnects. Briefly, a damascene metallization process forms conductive interconnects by deposition of conductive metals, i.e., copper or copper alloy, in via holes or trenches formed in a semiconductor wafer surface. However, use of copper has a disadvantage of high diffusivity in common dielectric materials such as silicon oxide, which causes corrosion of the copper with attendant serious problems of loss of adhesion, delamination, and consequent electrical failure of circuitry. Therefore, a copper diffusion barrier is required for the copper interconnects.

BRIEF DESCRIPTION OF THE DRAWINGS

Aspects of embodiments of the present disclosure are best understood from the following detailed description when read with the accompanying figures. It should be noted that, in accordance with standard practice in the industry, various structures are not drawn to scale. In fact, dimensions of the various structures can be arbitrarily increased or reduced for clarity of discussion.

FIGS. 4 to 10, 11A, 11B, 12 to 14, 15A, 15B, 16A to 16C, 17 to 25, 26A to 26C, 27 to 29, 30A, 30B, 31A, 31B, 32 to 41, 42A, 42B, 43A and 43B are schematic cross-sectional views illustrating sequential operations of the method shown in FIG. 3, in accordance with some embodiments of the present disclosure.

DETAILED DESCRIPTION

Figure 1:
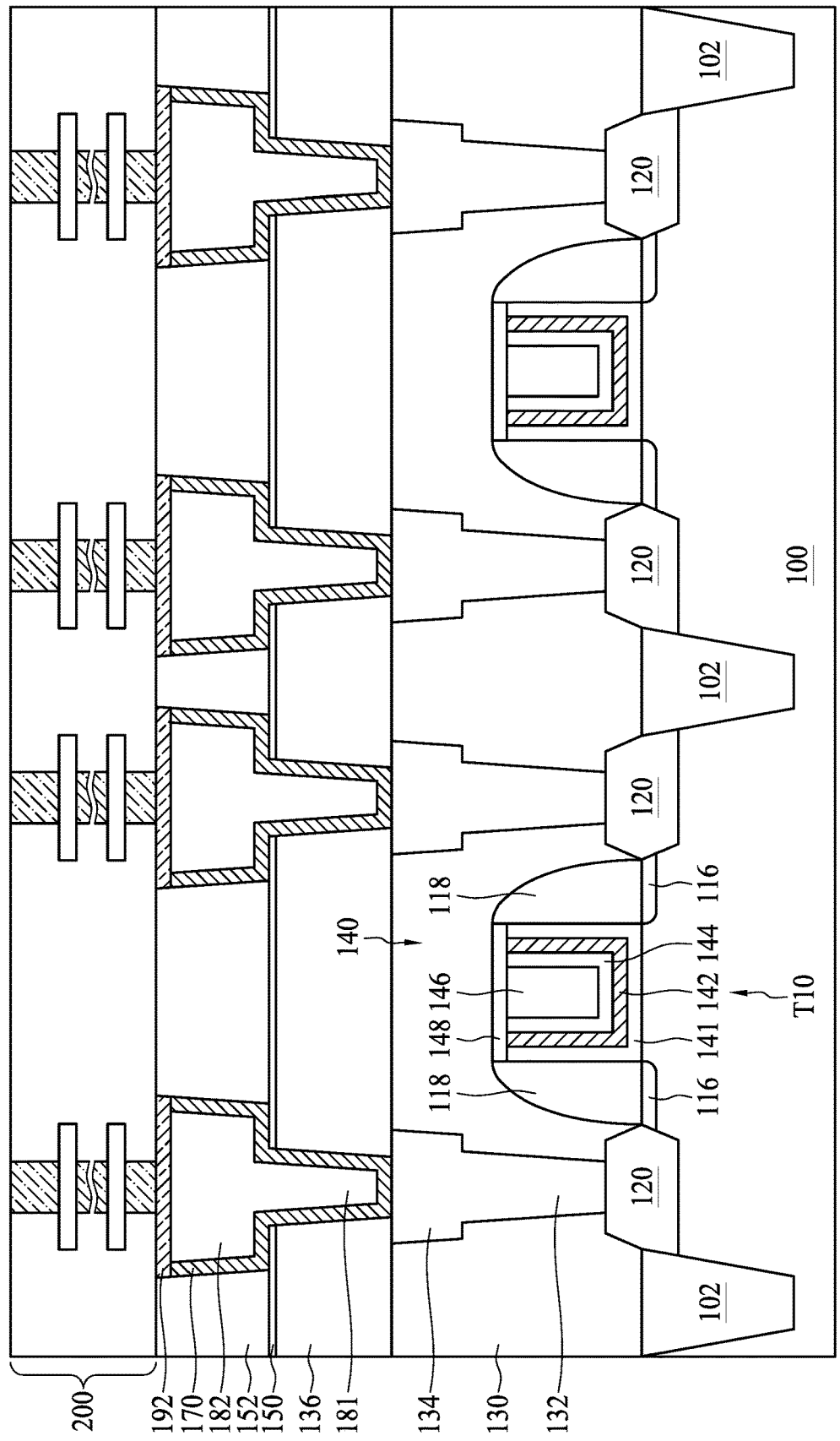
FIG. 1 is a schematic cross-sectional view of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Copper (Cu) interconnects are finding increasing applications in electronic devices, such as integrated circuits (ICs). The use of Cu and Cu alloys in such applications can result in several advantages over the use of aluminum (Al) and its related alloys. These advantages can include, for example, reduced resistivity, greater reliability, high chip yield count, and higher circuit density. Cu can also have use in interconnects made by damascene processes. For example, Cu damascene interconnects have been found to be useful in large scale ICs and ultra large scale integrated (ULSI) circuits.

However, since Cu has a tendency when used in interconnects to diffuse into surrounding dielectric materials such as silicon dioxide. Cu electromigration (EM), which frequently occurs in the back end of line (BEOL) of ICs, is a key issue that limits the lifetime of interconnects. Therefore, encapsulation of Cu is often required. One method of encapsulating Cu includes employing a conductive barrier layer or liner along the sidewalls and bottom surface of a Cu interconnect.

The present disclosure provides a method of forming a robust barrier layer which can effectively suppress Cu electromigration (EM).

FIG. 1 shows a semiconductor structure 10, in accordance with some embodiments of the present disclosure. The semiconductor structure includes multiple transistors T10 disposed on a substrate 100. The transistors T10 are separated by isolation structures 102 in the substrate 100. Each transistor T10 includes a functional gate structure 140 serving as a gate terminal and its corresponding epitaxial features 120 serving as source/drain terminals. Each functional gate structure 140 includes a gate dielectric layer 141 surrounded by lightly doped source/drain (LDD) regions 116 in the substrate 100, a barrier layer 142 on the gate dielectric layer 141, a work function tuning layer 144 on the barrier layer 142, and a conductive layer 146 on the work function tuning layer 144. In some embodiments, the functional gate structure 140 includes a cap layer 148 disposed on the conductive layer 146. In some other embodiments, the functional gate structure 140 does not include a cap layer. Each functional gate structure 140 is surrounded by a gate spacer 118. The gate spacer 118 at least covers portions of the LDD regions 116.

An inter-layer dielectric (ILD) layer 130 is disposed over the substrate 100. The ILD layer 130 covers portions of the isolation structures 102, the epitaxial features 120, the gate spacers 118 and the functional gate structures 140. Conductive contacts 132 and conductive lines 134 are disposed in the ILD layer 130. Each of the conductive contacts 132 is disposed on each of the epitaxial features 120. Each of the conductive lines 134 is disposed on each of the conductive lines 132. The conductive line 134, the conductive contact 132 and the epitaxial feature 120 may be electrically coupled. An IMD layer 136 is disposed on the ILD layer 130 and the conductive lines 134. An etch-stop layer (ESL) 150 is disposed on the IMD layer 136, and an IMD layer 152 is disposed on the ESL 150. Multiple barrier layers 170 extend from the IMD layer 152 to the IMD layer 136, and each barrier layer 170 contacts one epitaxial feature 120. Each barrier layer 170 encapsulates a conductive via 181 connected with a conductive line 182. The conductive lines 182 and the conductive vias 181 are electrically coupled to the epitaxial features 120 through the barrier layers 170. Neighboring conductive vias 181 or neighboring conductive lines 182 may have a pitch between about 10 nanometers (nm) and about 500 nm. A conductive cap layer 192 is disposed on each of the conductive lines 182. An interconnect structure 200 is disposed above the conductive lines 182. The interconnect structure 200 may include multiple higher-level metal layers such as conductive vias and conductive lines embedded in one or more dielectric layers. The interconnect structure 200 may be electrically coupled to the conductive lines 182, the conductive vias 181 and the epitaxial features 120.

Figure 2:
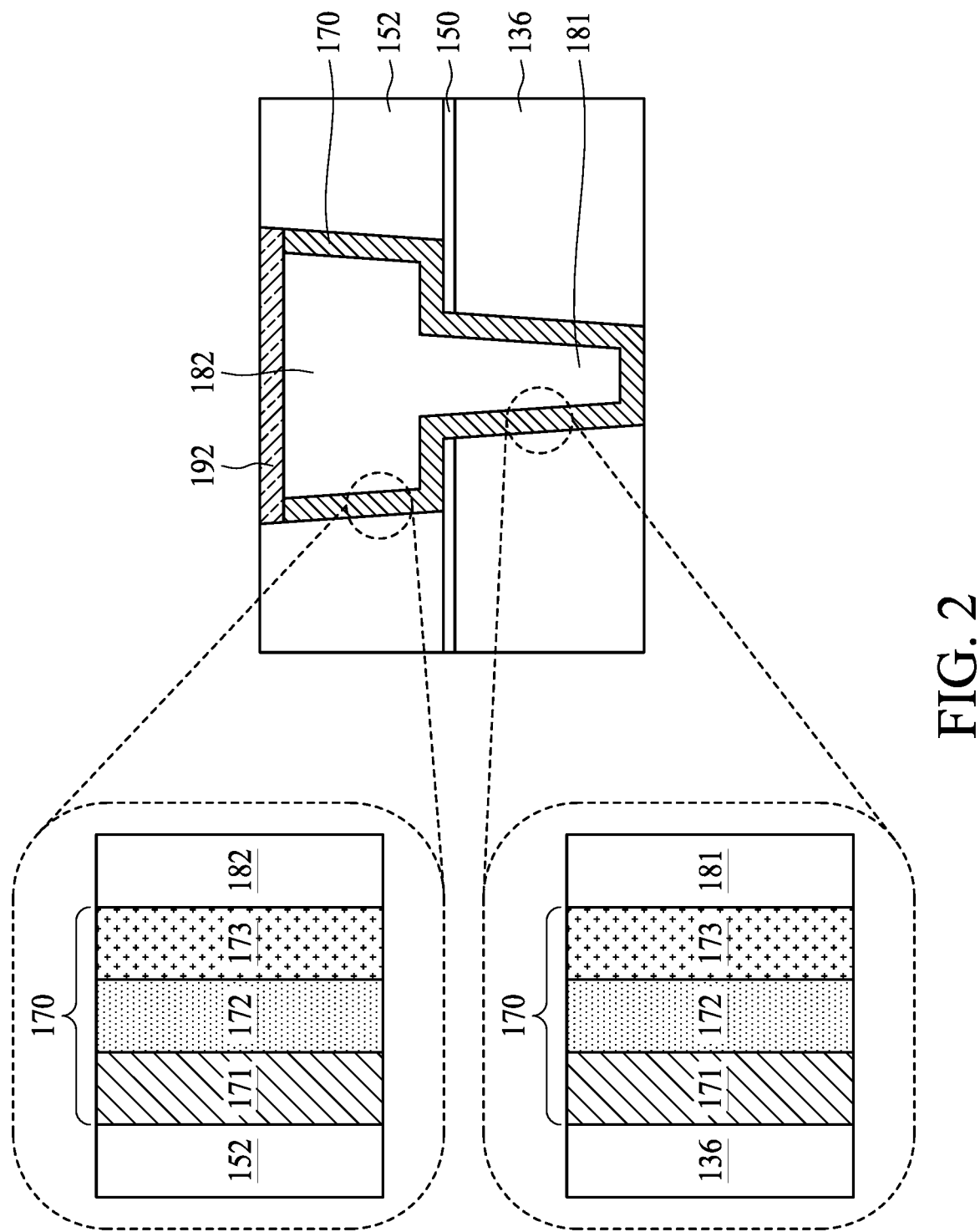
FIG. 2 is an enlarged view of a barrier layer in FIG. 1, in accordance with some embodiments of the present disclosure.

FIG. 2 is an enlarged view of the barrier layer 170 in FIG. 1, in accordance with some embodiments of the present disclosure. The barrier layer embedded in the IMD layer 136 separates the IMD layer 136 and the conductive via 181. The barrier layer embedded in the IMD layer 152 separates the IMD layer 152 and the conductive line 182. In some embodiments, the barrier layer 170 includes the first layer 171, the second layer 172 and the third layer 173. The first layer 171 is disposed on the IMD layer 136, the ESL 150 and the ILD 152. The second layer 172 is between the first layer 171 and the second layer 173. The third layer 173 is adjacent to the conductive via 181 or the conductive line 182. In some embodiments, the barrier layer 170, which separates a dielectric material and a conductive material, is used to suppress a copper electromigration from the conductive via 181 or the conductive line 182 to the IMD layer 136 or the ILD 152.

Figure 3:
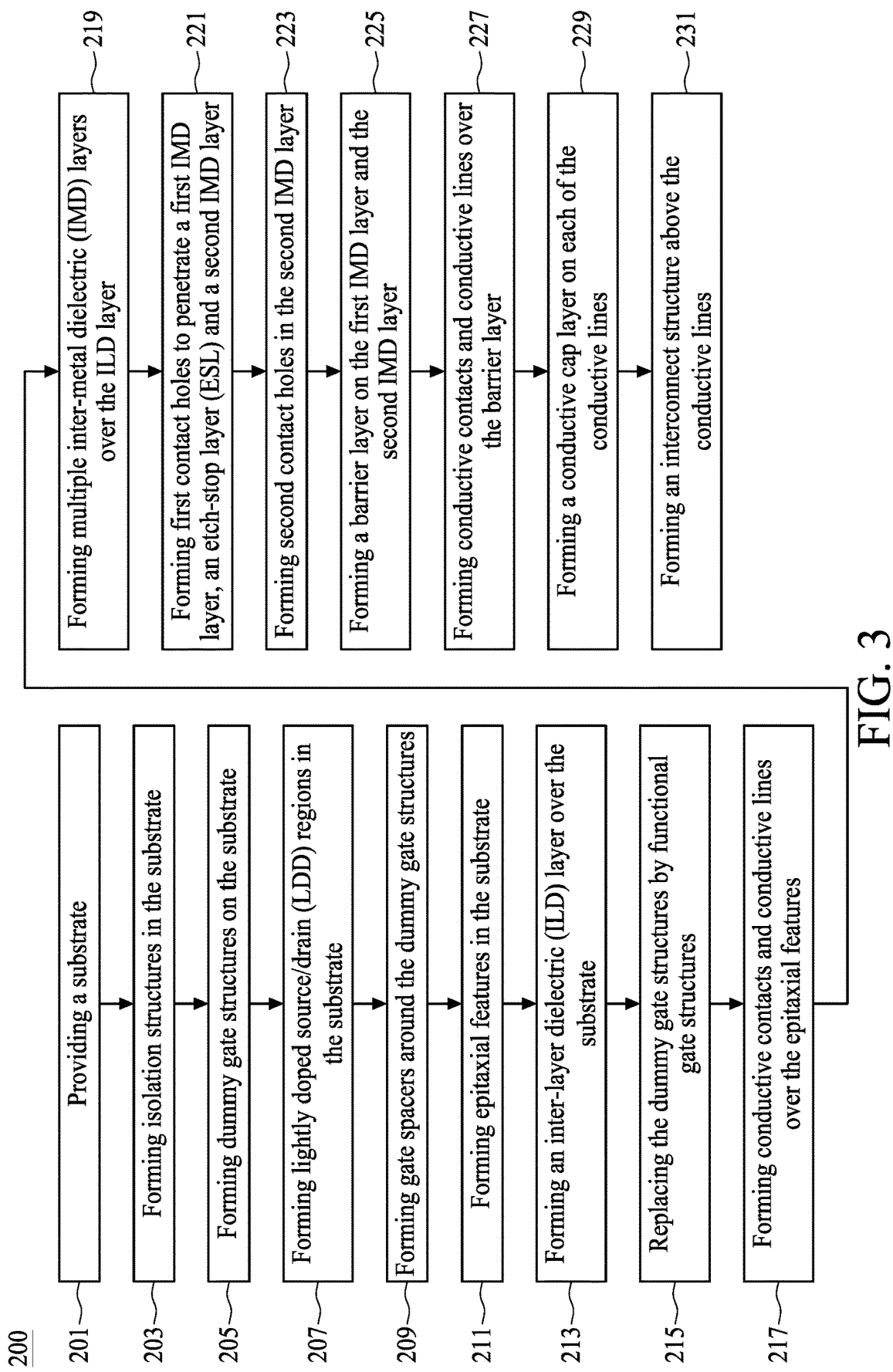
FIG. 3 is a flow diagram showing a method of fabricating a semiconductor structure, in accordance with some embodiments of the present disclosure.

FIG. 3 is a flow diagram showing a method 200 of fabricating a semiconductor structure, in accordance with some embodiments of the present disclosure. FIGS. 4 to 43B are schematic cross-sectional views illustrating sequential operations of the method 200 shown in FIG. 3, in accordance with some embodiments of the present disclosure.

Figure 4:
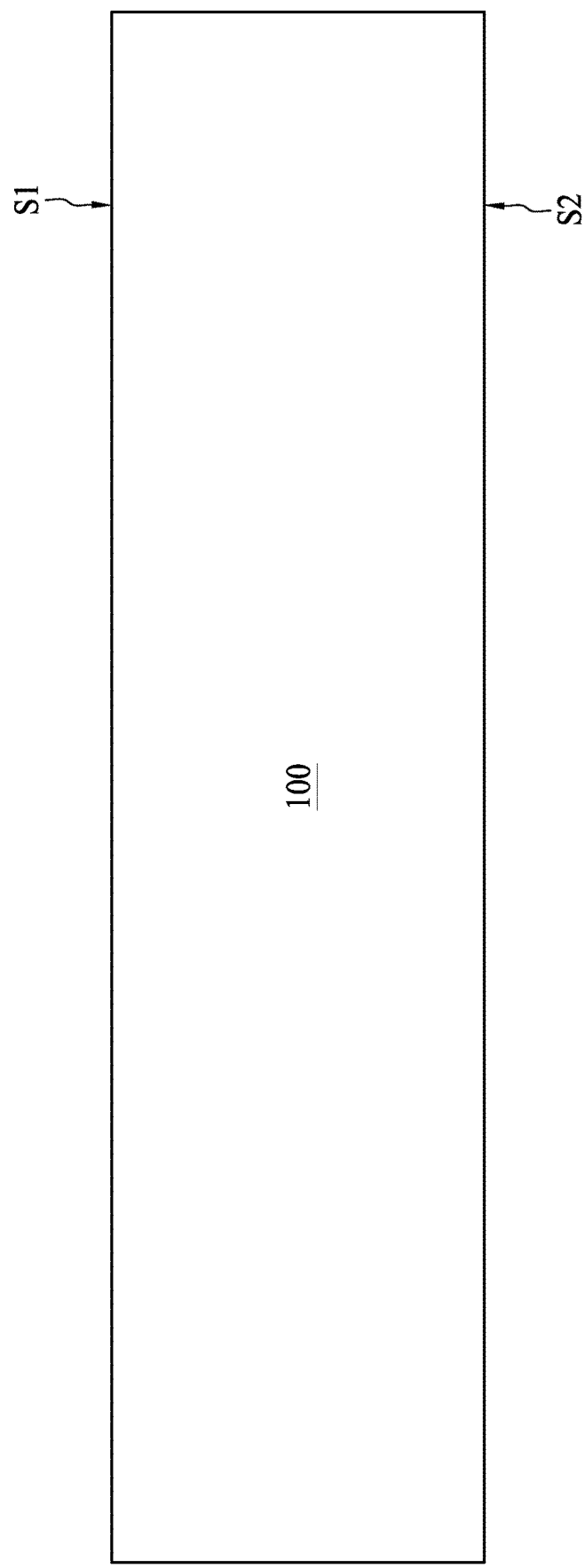

In operation 201 of FIG. 3, a substrate 100 is provided, as shown in FIG. 4. The substrate 100 may be a semiconductor substrate such as a bulk silicon wafer. In some embodiments, the substrate 100 is a semiconductor-on-insulator (SOI) substrate, a multi-layered or gradient substrate, or the like. The substrate 100 may include a semiconductor material such as Si, Ge, a compound or alloy semiconductor including SiC, SiGe, GaAs, GaP, GaAsP, AlInAs, AlGaAs, GaInAs, InAs, GaInP, InP, InSb, GaInAsP, or a combination thereof. The substrate 100 may be doped or undoped. The substrate has a top surface S1 and a back surface S2 opposite to the top surface S1. In some embodiments, the top surface S1 of the substrate 100 is an active side. In some embodiments, the back surface S2 of the substrate 100 is an active side.

Figure 5:
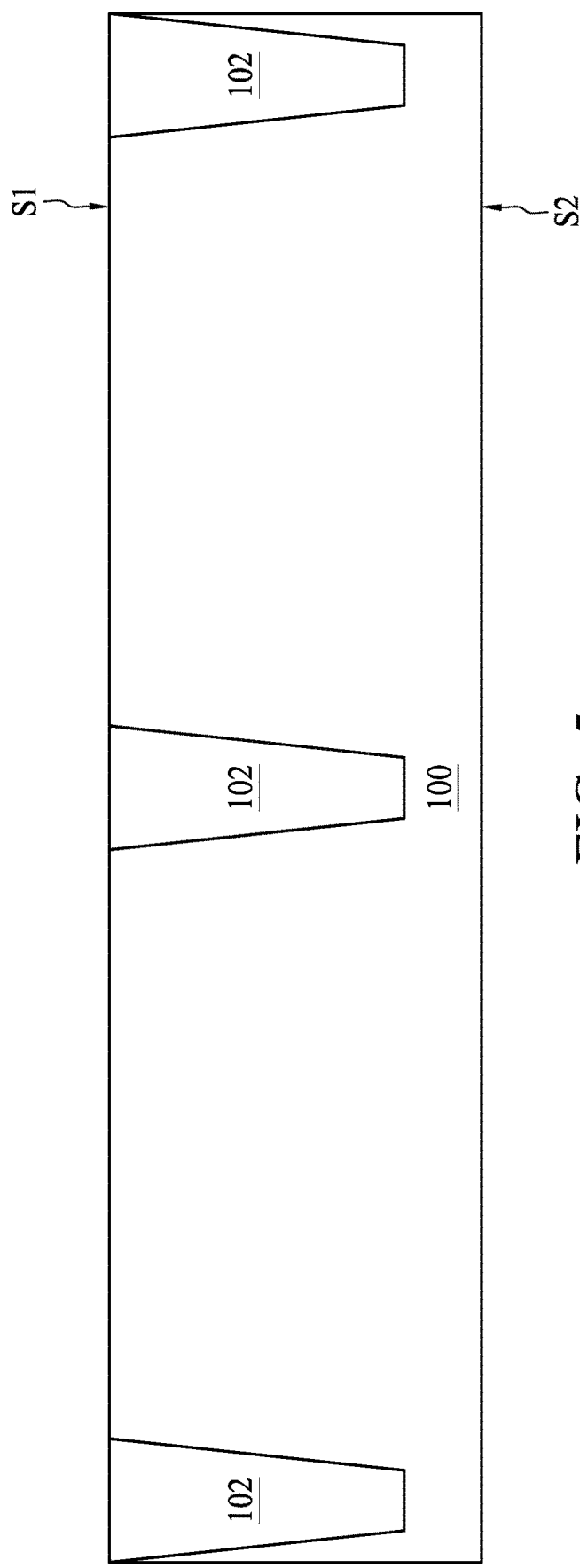

In operation 203 of FIG. 3, isolation structures 102 are formed in the substrate 100, as shown in FIG. 5. The isolation structures 102 may be shallow trench isolation (STI) regions. In some embodiments, the formation of the isolation structures 102 includes forming trenches in the substrate 100 by any acceptable etching operation, such as reactive ion etching (RIE), dry etching, or a combination thereof. The etching operation may be anisotropic. An insulating material is deposited to fill the trenches. The insulating material may be silicon oxide, silicon nitride, or a combination thereof. The insulating material may be deposited using chemical vapor deposition (CVD), atmospheric pressure CVD (APCVD), high density plasma CVD (HDP-CVD), or another suitable method. A planarization operation, such as a chemical mechanical polishing (CMP) operation, may be used to remove any excess insulating material over the top surface S1 of the substrate 100 such that top surfaces of the isolation structures 102 and the top surface S1 are coplanar.

Although not specifically illustrated, appropriate wells may be formed in the substrate 100. In some embodiments, a P-well is formed in the substrate 100 where an N-type device, such as an N-type FET, is to be formed. In some embodiments, an N-well is formed in the substrate 100 where a P-type device, such as a P-type FET, is to be formed. In some embodiments, both a P-well and an N-well are formed in the substrate 100. The wells may be formed using an ion-implantation operation. P-type dopants such as boron (B), gallium (Ga) and indium (In), or N-type dopants such as phosphorous (P) and arsenide (As), may be implanted into selected regions of the substrate 100 using an implant mask.

Figure 6:
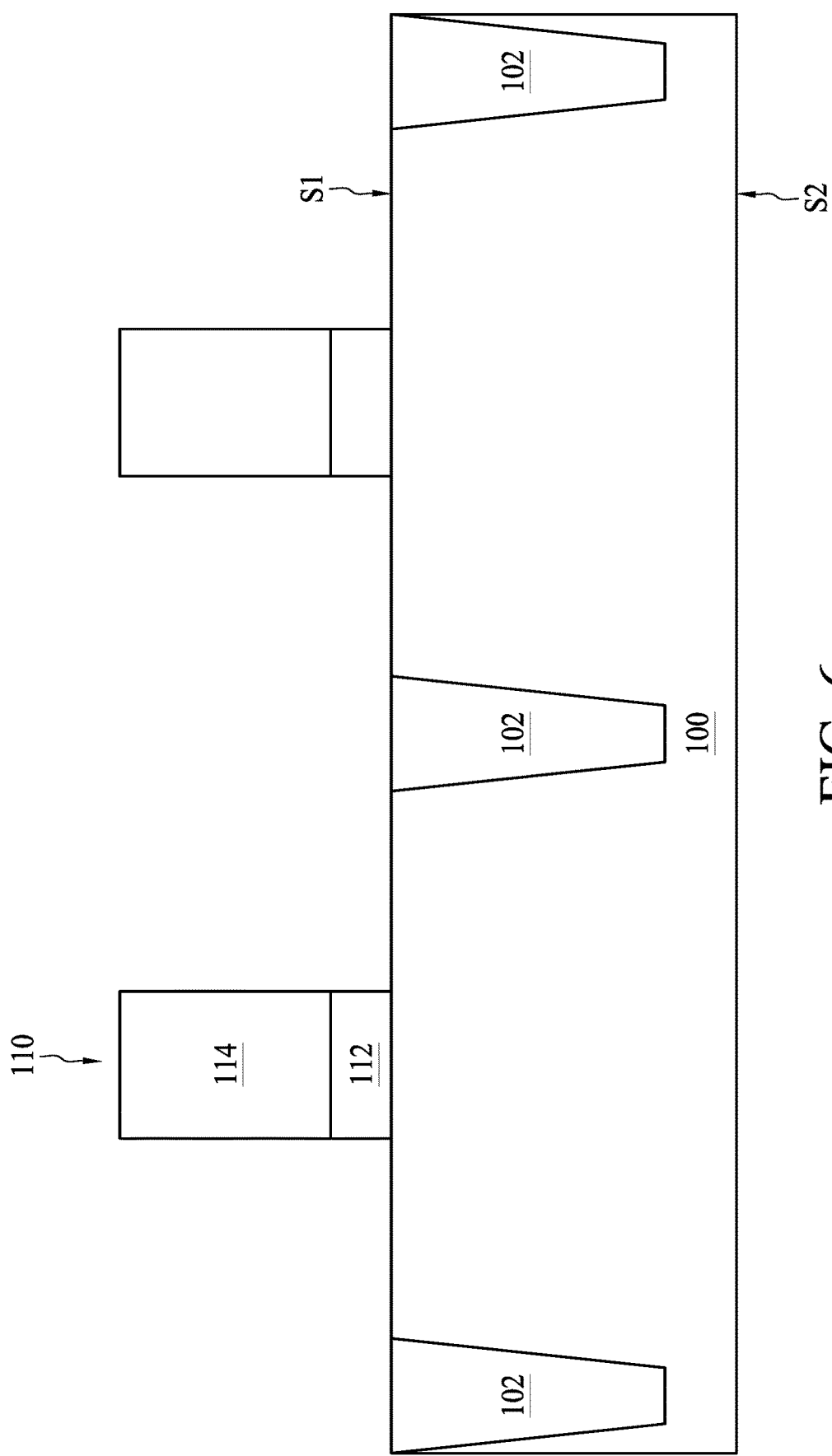

In operation 205 of FIG. 3, dummy gate structures 110 are formed on the substrate 100, as shown in FIG. 6. Each dummy gate structure 110 includes a dummy gate dielectric 112 and a dummy gate 114 disposed on the dummy gate dielectric 112. In some embodiments, the formation of the dummy gate structure 110 includes depositing or thermally growing a dielectric layer such as silicon oxide, silicon nitride, or a combination thereof on the substrate 100 using suitable operations, such as CVD, thermal oxidation or other suitable methods. A polysilicon layer is then formed over the dielectric layer using CVD or another suitable method. A patterned photoresist layer or a patterned nitride hardmask layer is formed on the polysilicon layer. An etching operation is performed on the polysilicon layer and the dielectric layer using the patterned photoresist layer or the nitride hardmask layer as an etching mask. The pattern of the etching mask may be respectively transferred to the polysilicon layer and the dielectric layer to form the dummy gate 114 and the dummy gate dielectric 112. The etching operation may include RIE, dry etching or other suitable methods.

Figure 7:
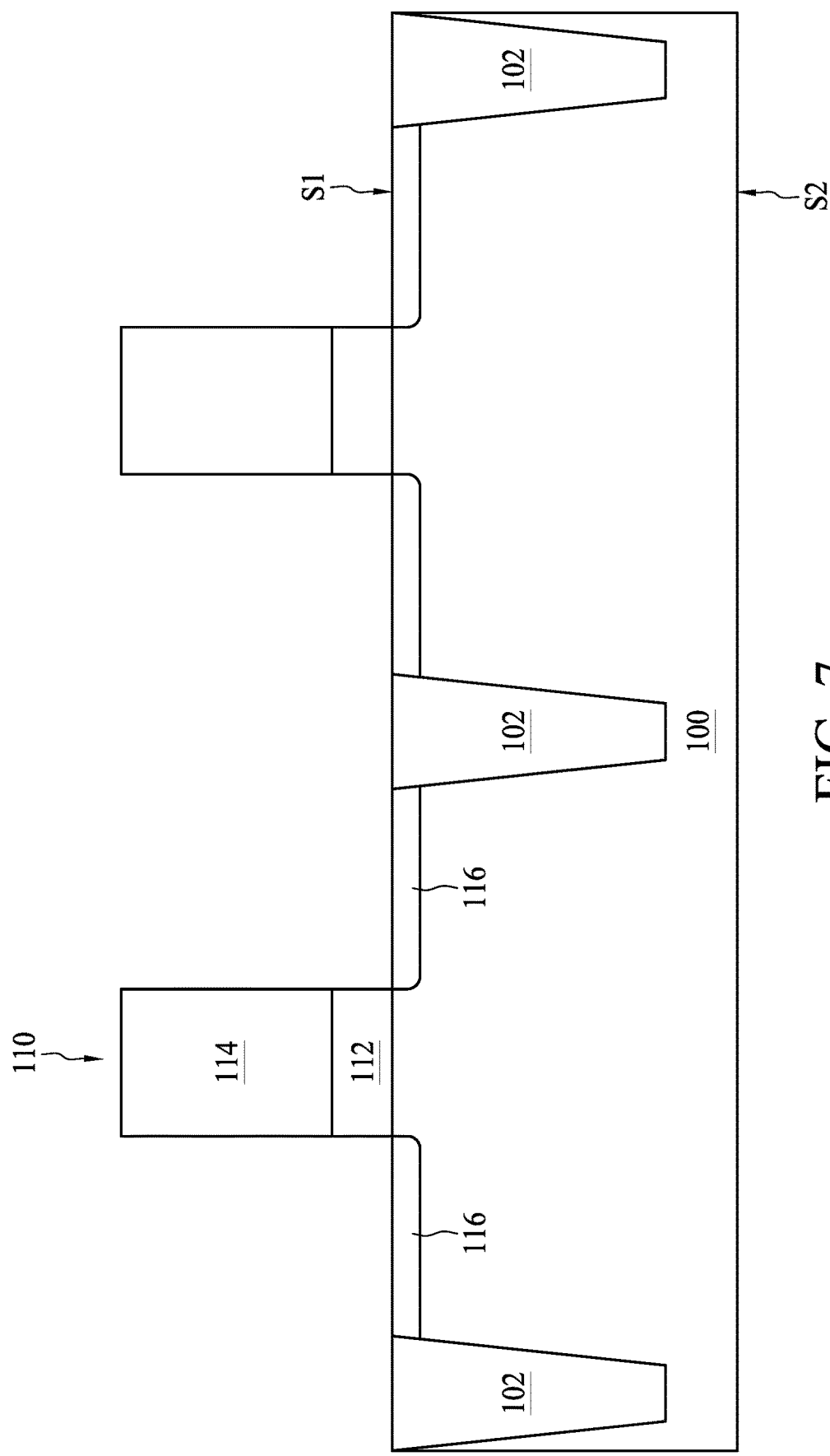

In operation 207 of FIG. 3, lightly doped source/drain (LDD) regions 116 are formed in the substrate 100, as shown in FIG. 7. An implant mask may be formed to cover the isolation structures 102 and the dummy gate structures 110, followed by an ion-implantation operation to form the LDD regions 116. For forming a P-type device, P-type dopants may be implanted into selected regions of the substrate 100 exposed by the implant mask. The LDD regions 116 may thus be P-type doped regions. For forming an N-type device, N-type dopants may be implanted into selected regions of the substrate 100 exposed by the implant mask. The LDD regions 116 may thus be N-type doped regions. The implant mask is then removed. An annealing operation, such as a rapid thermal annealing (RTA) operation, can be used to activate the implanted dopants.

Figure 8:
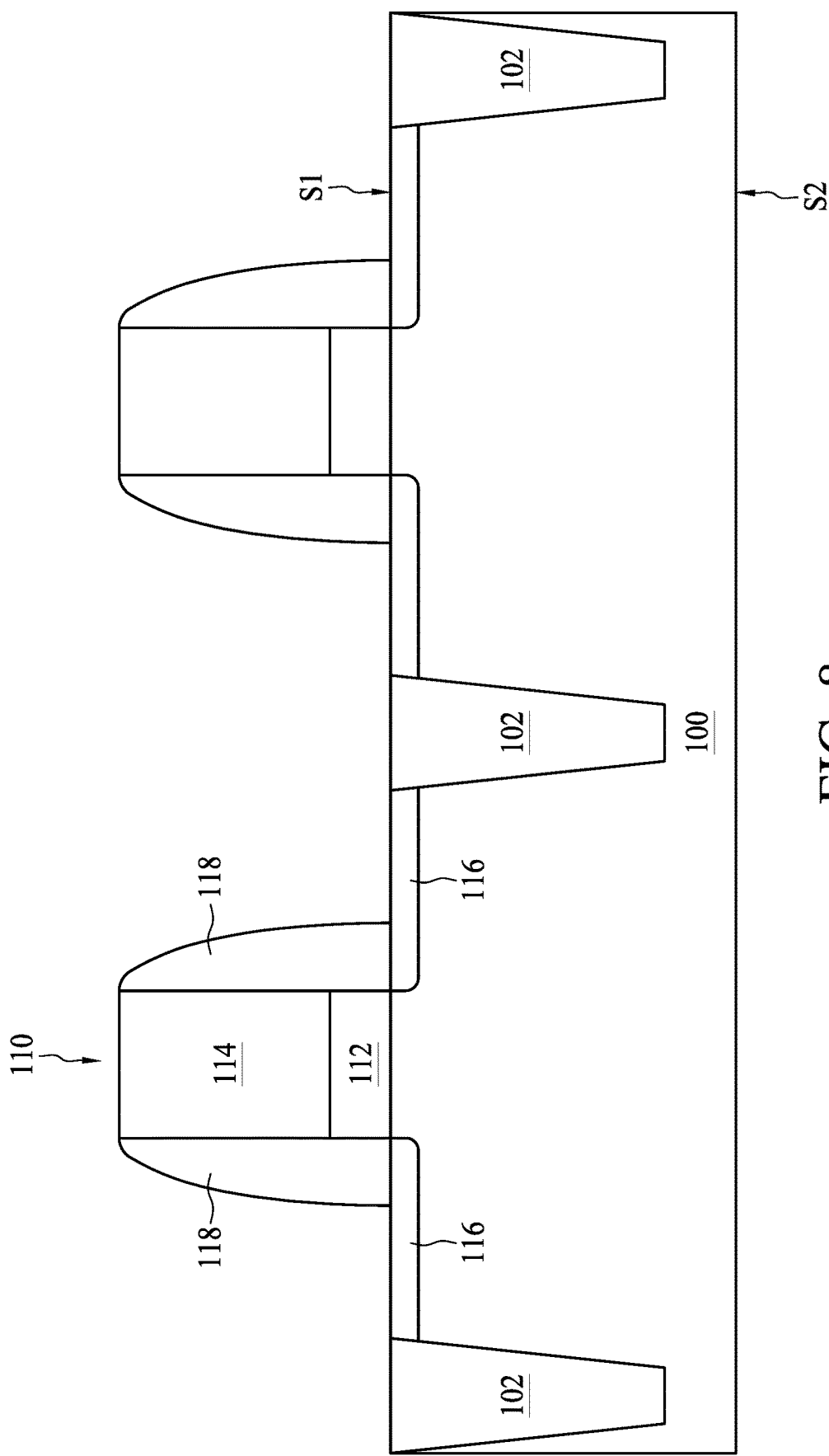

In operation 209 of FIG. 3, gate spacers 118 are formed around the dummy gate structures 110, respectively, as shown in FIG. 8. In some embodiments, the formation of the gate spacers 118 includes conformally forming a dielectric material on the substrate 100 and the dummy gate structures 110 using CVD or the like. The dielectric material may be silicon nitride, silicon carbon nitride, a combination thereof, or the like. An anisotropic etching operation is used to remove portions of the dielectric material and leave the dielectric material on sidewalls of the dummy gates 114 and the dummy gate dielectrics 112. The remaining dielectric material may form the gate spacers 118, and each gate spacer 118 surrounds a dummy gate structure 110.

Figure 9:
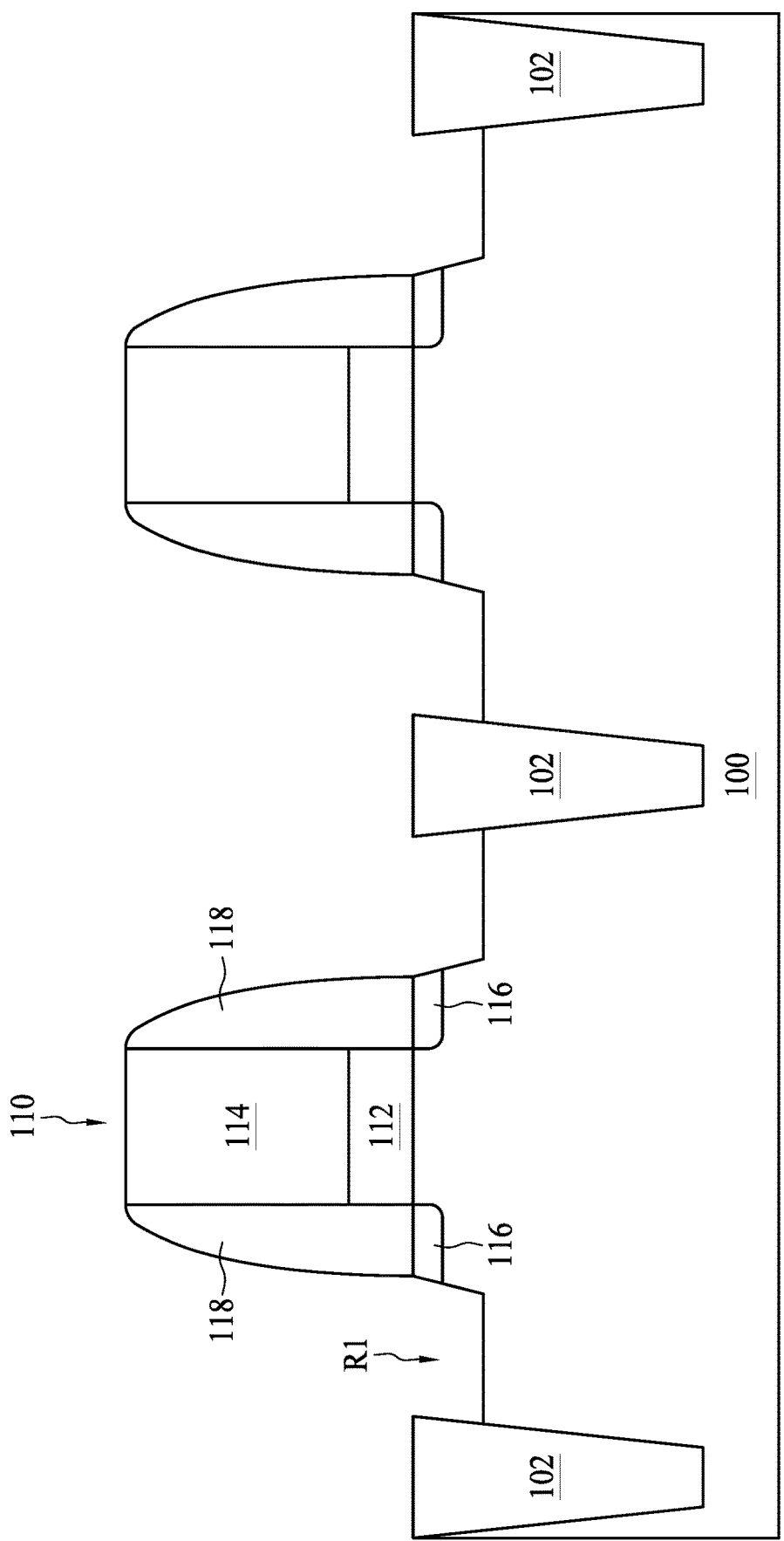
Figure 10:
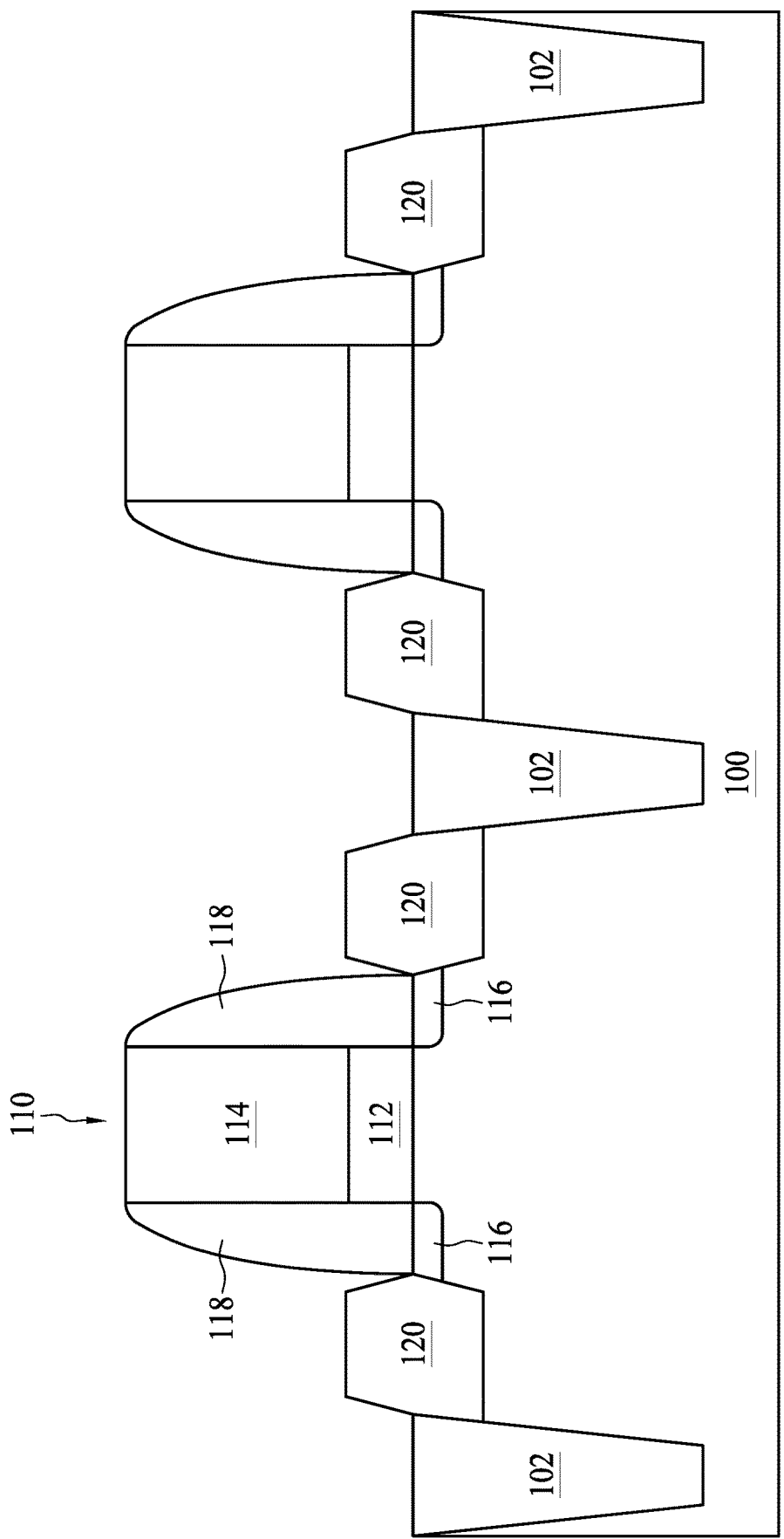

In operation 211 of FIG. 3, epitaxial features 120 are formed in the substrate 100, as shown in FIGS. 9 and 10. Referring to FIG. 9, in some embodiments, the formation of the epitaxial features 120 includes etching of portions of the substrate 100 between the isolation structures 102 and the gate spacers 118 to form multiple recesses R1. A formation method of the recesses R1 may include at least a lithographic operation and an etching operation. A patterned photoresist layer (not shown) may be used as an etching mask when performing the etching operation. In some embodiments, the gate spacers 118 also function as an etching mask. The etching operation may include an acceptable anisotropic or isotropic etching method, such as RIE, dry etching, wet etching or other suitable methods. A profile of the recesses R1 may be substantially triangular, trapezoidal, pentagonal, or hexagonal, depending on etching parameters of the etching operation. Subsequently, the etching mask may be removed using an etchant selective to the material of the etching mask.

Referring to FIG. 10, one epitaxial feature 120 is grown in each of the recesses R1 using an epitaxial growth operation. The epitaxial growth operation may include metal-organic chemical vapor deposition (MOCVD), selective epitaxial growth (SEG), molecular-beam epitaxy (MBE), vapor-phase epitaxy (VPE), liquid-phase epitaxy (LPE), and/or other suitable methods. In some embodiments, the epitaxial growth operation uses gaseous and/or liquid precursors, which interact with a composition of the substrate 100. The formation of the epitaxial features 120 may include doping with N-type or P-type dopants, which cause the epitaxial features 120 to be conductive. In some embodiments, the epitaxial features 120 are doped in-situ during the epitaxial growth operation. In some other embodiments, the epitaxial features 120 are undoped during the epitaxial growth operation, and are doped in a subsequent operation. The epitaxial features 120 may be exposed to an RTA operation, to diffuse the dopants in the epitaxial features 120.

Still referring to FIG. 10, each dummy gate structure 110 is between two epitaxial features 120. In some embodiments, the two epitaxial features 120 on either side of the dummy gate structure 110 may function as source/drain regions of a transistor formed in subsequent operations. In some embodiments, a silicide layer (not shown), such as cobalt-silicide (CoSi), nickel silicide (NiSi) or tungsten silicide (WSi), may be formed on a top surface of each epitaxial feature 120. The silicide layer may be used to increase compatibility between a material of the epitaxial feature 120 and a material of a conductive contact subsequently formed on the epitaxial feature 120. In addition, the silicide layer can reduce parasitic resistance or sheet resistance at a silicon/metal contact junction.

Although not illustrated, an etch-stop layer (not shown) can be formed on the isolation structures 102, the epitaxial features 120, the dummy gate structures 110 and the gate spacers 118. The etch-stop layer may be formed by conformally depositing a dielectric material onto the substrate 100 using atomic layer deposition (ALD), CVD and/or other suitable methods. The dielectric material of the etch-stop layer may include silicon oxide, silicon nitride, silicon carbon nitride, silicon oxynitride, silicon carbide, silicon oxycarbide, or other suitable materials.

Figure 11A:
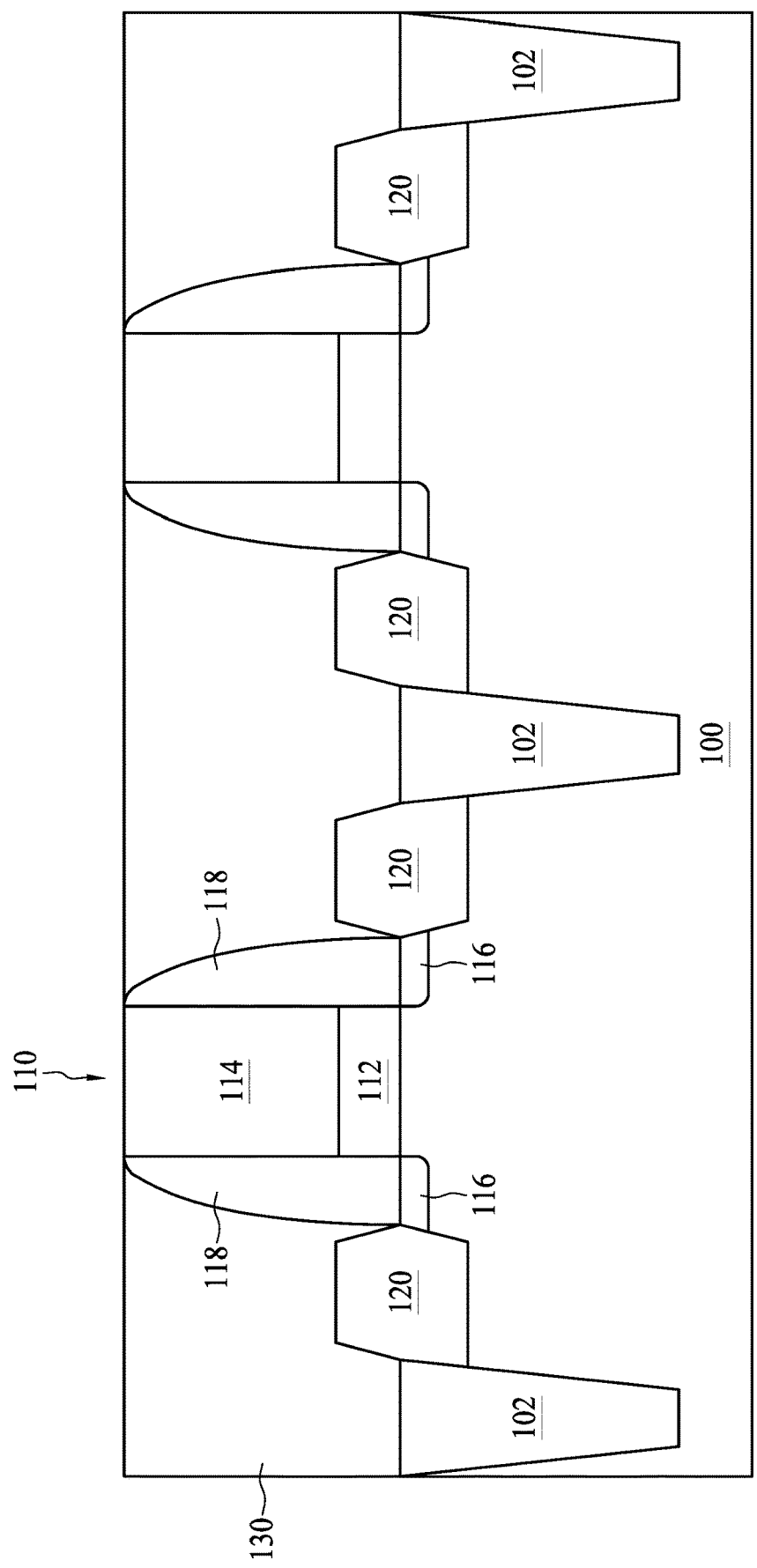
Figure 11B:
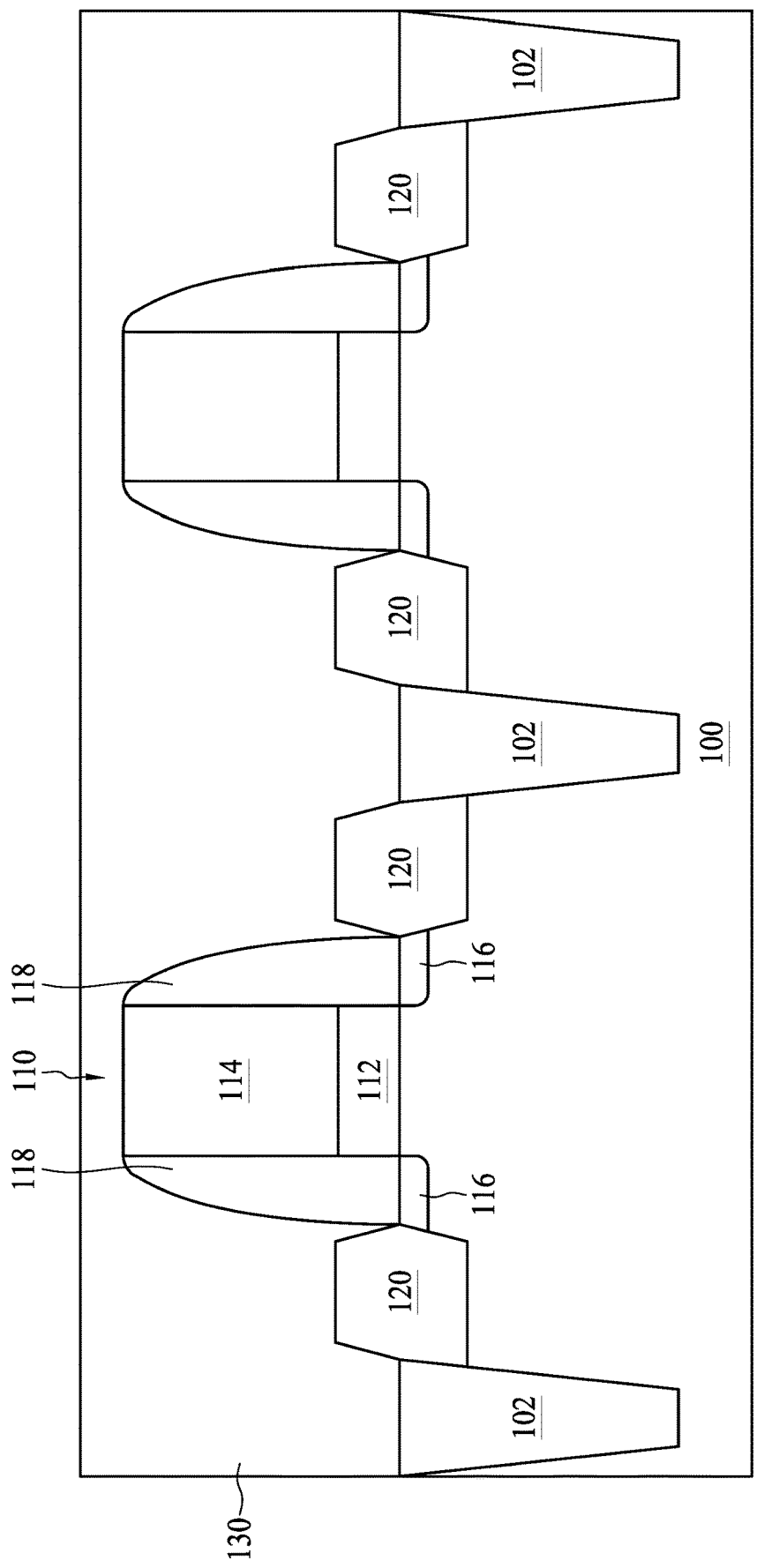

In operation 213 of FIG. 3, an inter-layer dielectric (ILD) layer 130 is formed over the substrate 100, as shown in FIG. 11A or FIG. 11B. The ILD layer 130 may be formed by depositing a dielectric material onto the isolation structures 102, the epitaxial features 120, the dummy gate structures 110, the gate spacers 118 and the etch-stop layer using spin-on coating, CVD, ALD, and/or other suitable methods. In some embodiments, the dielectric material of the ILD layer 130 includes silicon oxide, silicon nitride, undoped silicate glass (USG), phospho-silicate glass (PSG), boro-silicate glass (BSG), boron-doped phospho-silicate glass (BPSG), tetraethyl orthosilicate (TEOS), or other suitable materials. In some embodiments, the dielectric material of the ILD layer 130 includes an extreme low-k (ELK) dielectric, which has a dielectric constant between 2.0 and 3.0. A planarization operation, such as CMP, may be used to remove any excess dielectric material over the dummy gate structure 110. In some embodiments, the planarization operation removes the ILD layer 130 over the top surface of the dummy gate structure 110. In such embodiments, top surfaces of the planarized ILD layer 130 and the dummy gate structure 110 are substantially coplanar. The top surface of the dummy gate structure 110 may be exposed through the planarized ILD layer 130, as shown in FIG. 11A. In some other embodiments, the planarization operation planarizes the ILD layer 130 without exposing the top surface of the dummy gate structure 110. In such embodiments, the top surface of the planarized ILD layer 130 is higher than the top surface of the dummy gate structure 110, as shown in FIG. 11B.

Figure 12:
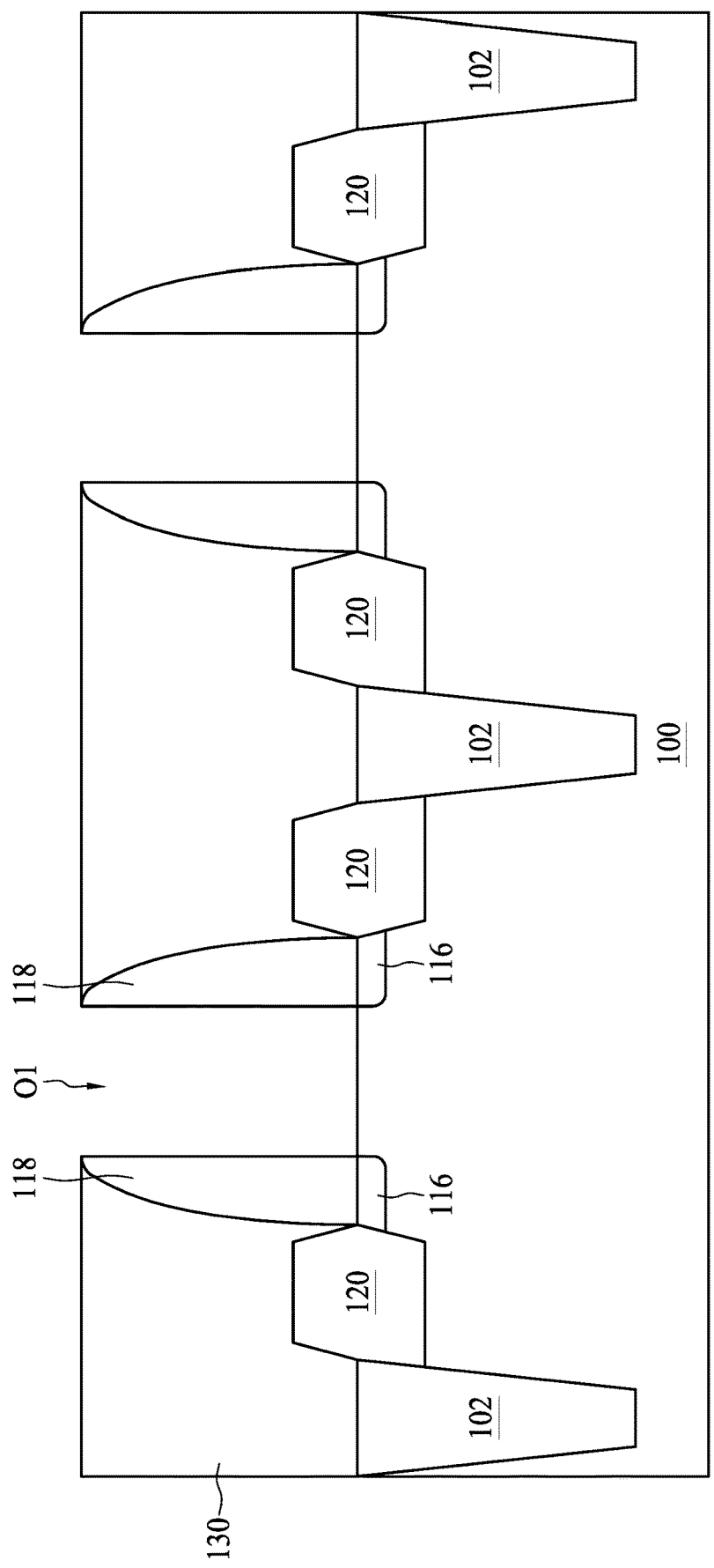

In operation 215 of FIG. 3, the dummy gate structures 110 are replaced by functional gate structures 140, as shown in FIGS. 12 to 16. Referring to FIG. 12, the dummy gate structures 110 are removed. The removal of the dummy gate structures 110 may include at least a lithographic operation and an etching operation. A patterned photoresist layer (not shown) may be used as an etching mask during the etching operation. The etching operation may include any acceptable anisotropic or isotropic etching method, such as RIE, dry etching, wet etching or another suitable method. The etching operation may be selective to the materials of the dummy gates 114 and the dummy gate dielectrics 112. During the etching operation, the dummy gate dielectrics 112 may be used as an etch-stop layer when the dummy gates 114 are etched. The dummy gate dielectrics 112 may then be etched after removal of the dummy gates 114. After the dummy gates 114 and the dummy gate dielectrics 112 are removed, multiple openings O1 exposing the underlying substrate 100 are formed. In some embodiments, the size of each opening O1 is defined by corresponding gate spacers 118. Each opening O1 may expose a channel region located between a corresponding pair of epitaxial features 120 and in the substrate 100.

Figure 13:
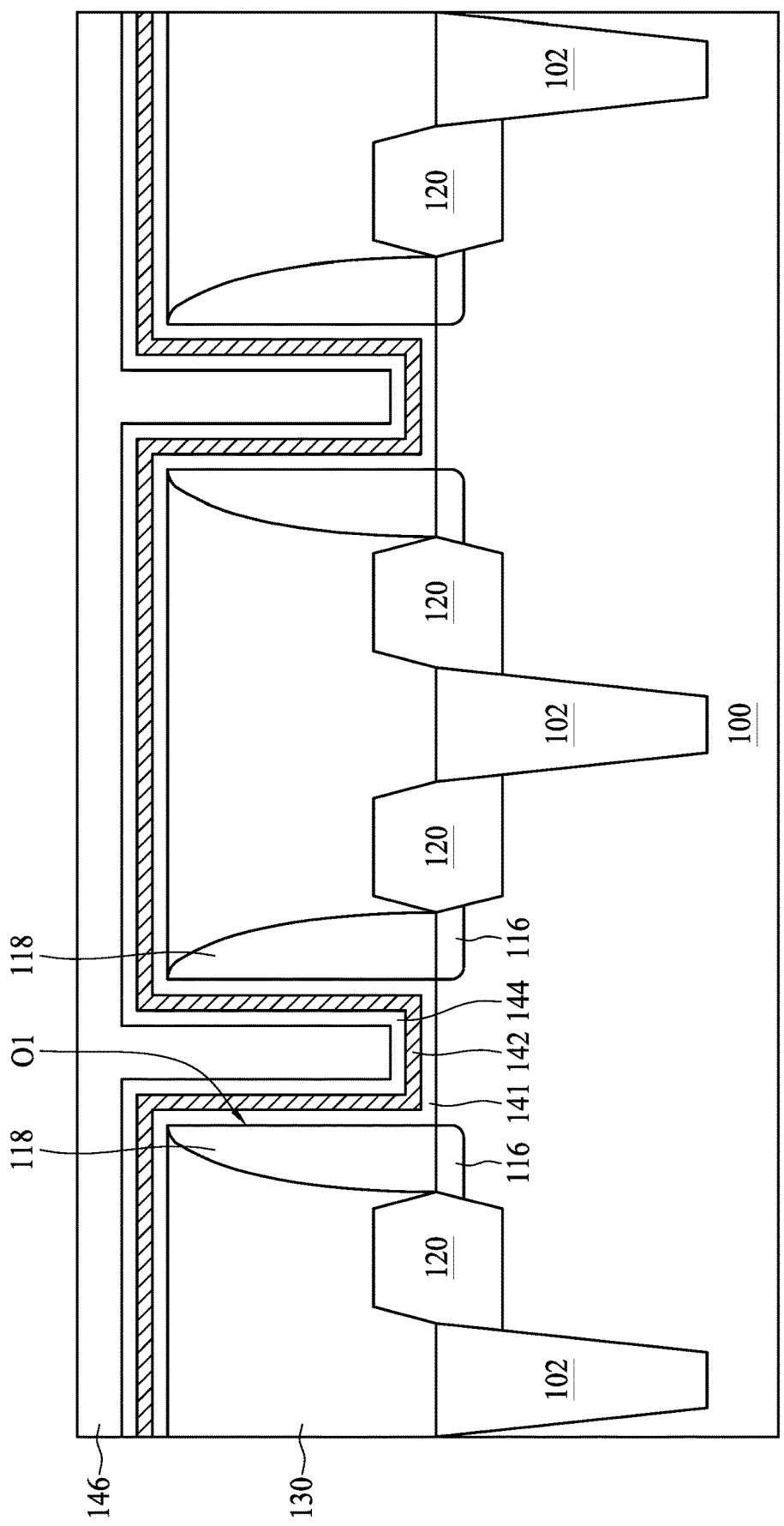

Referring to FIG. 13, a plurality of layers for forming the functional gate structures 140 are conformally deposited over the substrate 100. These layers may be formed using ALD, CVD or other suitable methods.

A gate dielectric layer 141 may be conformally formed on a top surface of the ILD layer 130 and in the openings O1 along inner sidewalls of the gate spacers 118. The gate dielectric layer 141 formed in the openings O1 may cover portions of the substrate 100. In some embodiments, the gate dielectric layer 141 includes a high-dielectric constant (high-k) material, and in such embodiments, the gate dielectric layer 141 may have a dielectric constant (k value) greater than about 7.0 and may include a metal oxide or a silicate of Hf, Al, Zr, La, Mg, Ba, Ti, Pb, or a combination thereof. Prior to the formation of the gate dielectric layer 141, an interfacial dielectric layer can be formed in each opening O1 and on the substrate 100. The interfacial dielectric layer may be, for example, an oxide formed by thermal oxidation, chemical oxidation, ALD or another suitable method.

A barrier layer 142 may be conformally formed on the gate dielectric layer 141. In some embodiments, the barrier layer 142 is a single layer. In some other embodiments, the barrier layer 142 includes multiple sub-layers. In some embodiments, the barrier layer 142 includes titanium nitride (TiN), tantalum nitride (TaN), the like, or a combination thereof. The barrier layer 142 may be used to prevent a subsequently-deposited metal-containing material from diffusing into the gate dielectric layer 141.

A work function tuning layer 144 may be conformally formed on the barrier layer 142. In some embodiments, the work function tuning layer 144 is a single layer. In some other embodiments, the work function tuning layer 144 includes multiple sub-layers. A gate material with a work function that can place its Fermi level close to the middle of the band gap of silicon is required. Therefore, in order to tailor a threshold voltage ($V_{TH}$) of the functional gate structures 140, the gate material for forming the functional gate structures 140 should have a tunable work function. The work function tuning layer 144 may be a suitable material used to tune a work function of the functional gate structures 140 to a desired level. In some embodiments, the work function tuning layer 144 includes TiN, TaN, titanium aluminide (TiAl), titanium aluminum nitride (TiAlN), the like, or a combination thereof.

A conductive layer 146 may be conformally formed on the work function tuning layer 144. The conductive layer 146 may be formed using physical vapor deposition (PVD), sputtering, electroplating, ALD or other suitable methods. The conductive layer 146 may include one or more conductive materials, such as W, Cu, Co, Al, Ni, Ta, Ti, Mo, Pd, Pt, Ru, Ir, Ag, Au, TiN, TaN, the like, or a combination thereof. In some embodiments, when the work function tuning layer 144 has a U-shaped profile, the conductive layer 146 is deposited in a cavity surrounded by the work function tuning layer 144. The conductive layer 146 may fill the unfilled portions of the openings O1.

Figure 14:
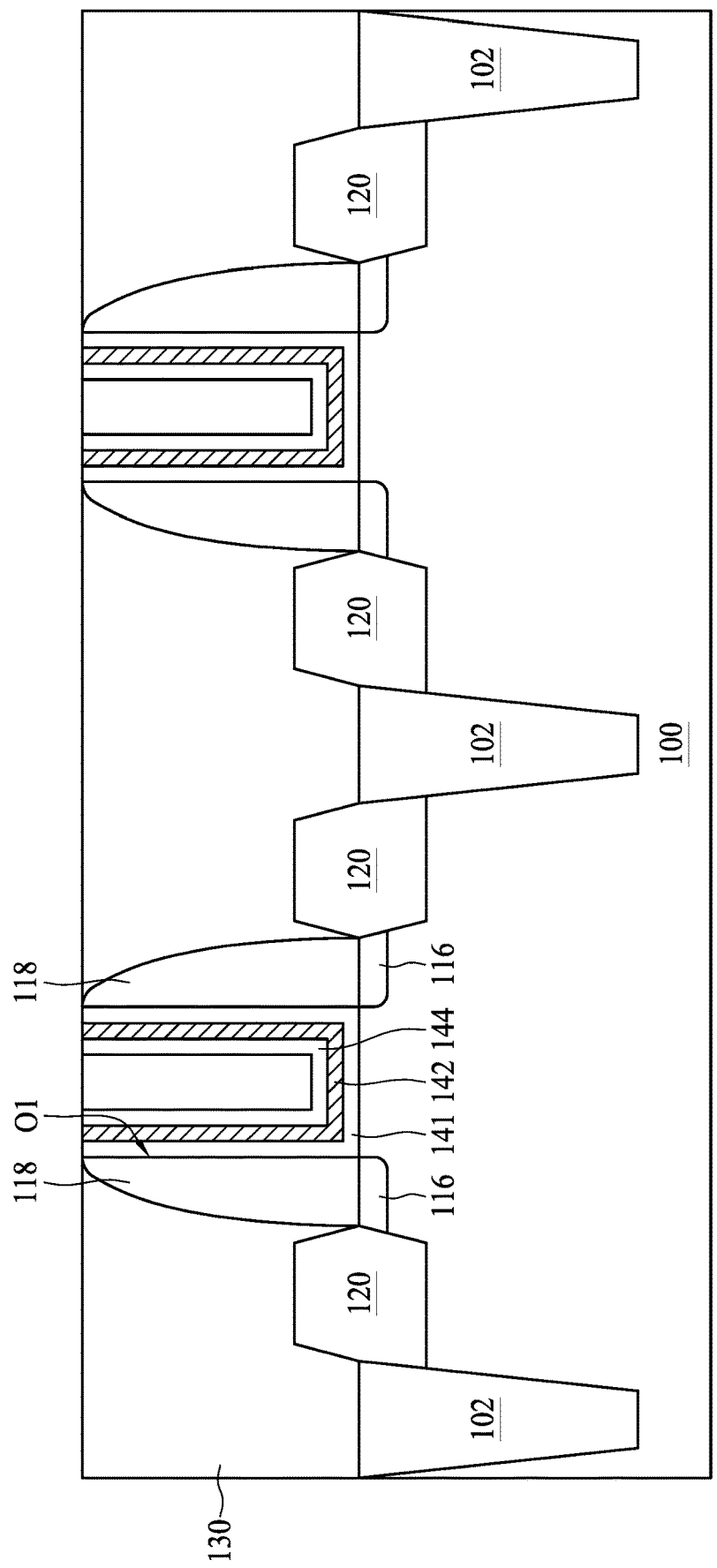

Referring to FIG. 14, a planarization operation, such as CMP, may be used to remove portions of the conductive layer 146, the work function tuning layer 144, the barrier layer 142 and the gate dielectric layer 141 over the top surface of the ILD layer 130. Thus, remaining portions of the conductive layer 146, the work function tuning layer 144, the barrier layer 142 and the gate dielectric layer 141 may be disposed in the openings O1 and surrounded by the gate spacers 118.

Figure 15A:
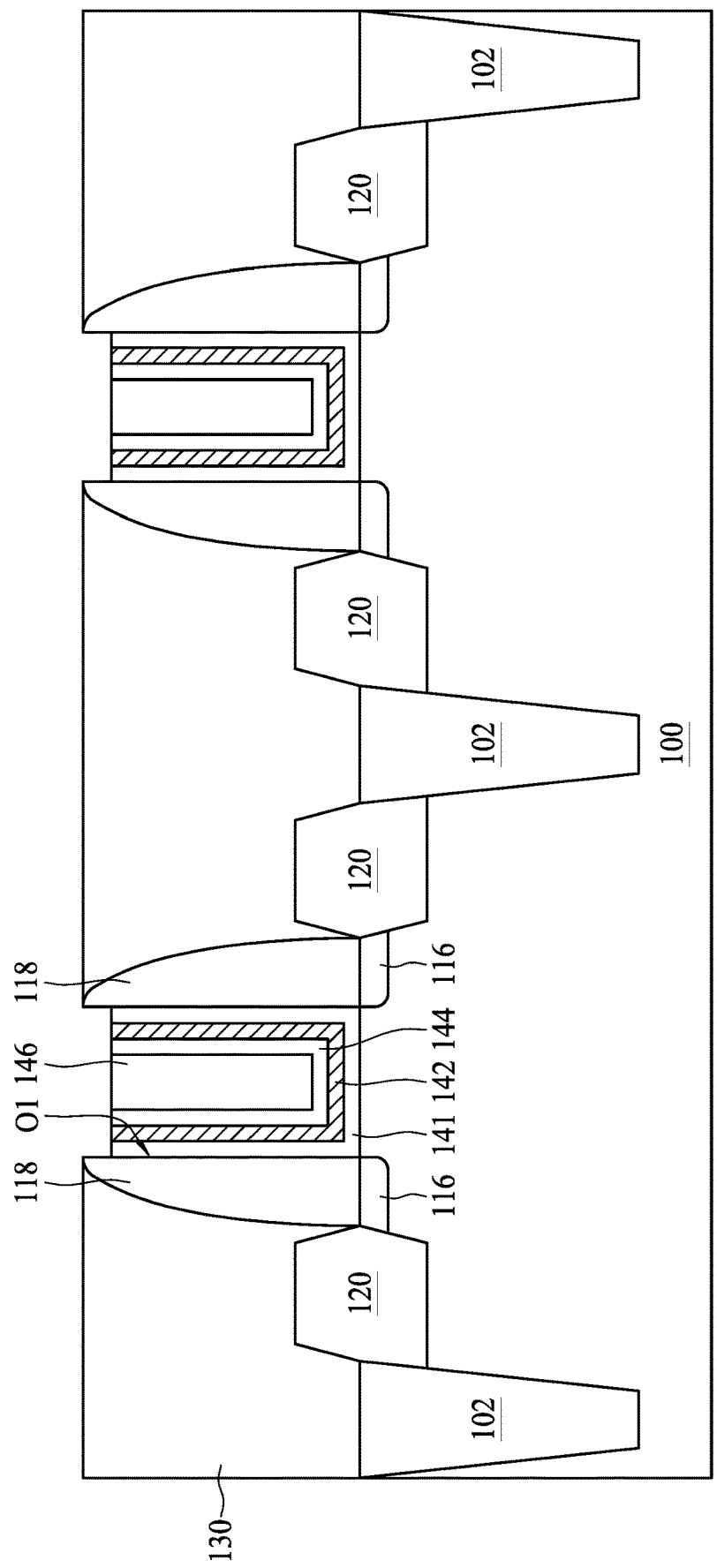
Figure 15B:
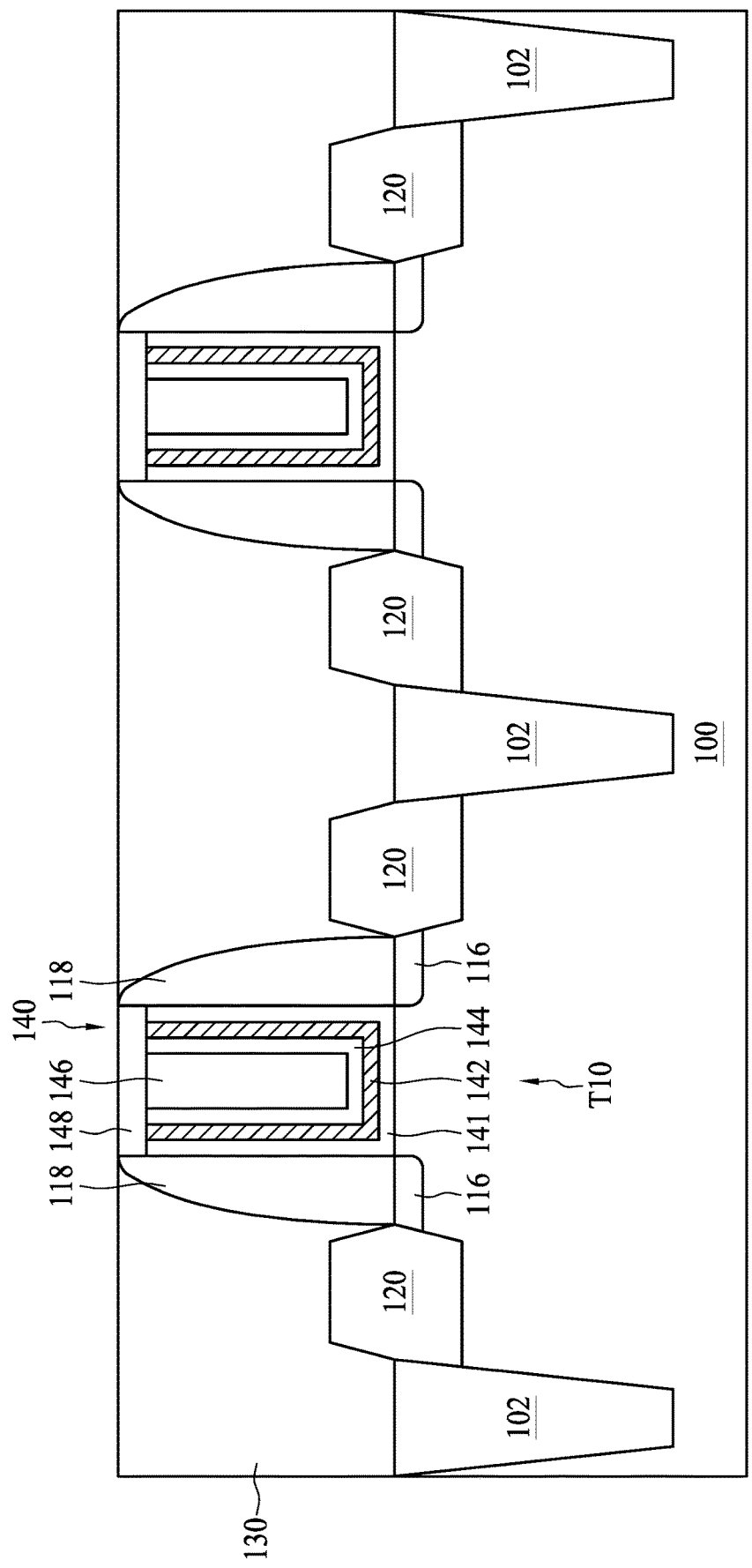

Referring to FIGS. 15A and 15B, a cap layer 148 may be formed on the conductive layer 146, the work function tuning layer 144, the barrier layer 142 and the gate dielectric layer 141. Referring to FIG. 15A, a controlled etch-back operation is used to recess portions of the conductive layer 146, the work function tuning layer 144, the barrier layer 142 and the gate dielectric layer 141 such that a common top surface of the above layers may be lower than the top surface of the ILD layer 130. The etch-back operation may include RIE, dry etching or other suitable methods.

Referring to FIG. 15B, to form the cap layer 148, a dielectric material such as silicon nitride, silicon carbon nitride or the like may be deposited over the ILD layer 130 to fill space in the openings O1 created by the etch-back operation. The dielectric material may be deposited using CVD, PECVD or another suitable method. A planarization operation, such as CMP, can be used to level the top surface of the dielectric material such that top surfaces of the dielectric material and the ILD layer 130 are substantially coplanar, thereby forming the cap layer 148. At this stage, operations for forming the functional gate structures 140 have been completed. Each of the functional gate structures 140 may include the gate dielectric layer 141, the barrier layer 142, the work function tuning layer 144, the conductive layer 146 and/or the cap layer 148. Each gate spacer 118 may surround one functional gate structure 140.

Comparing FIGS. 11A and 15B, each of the dummy gate structures 110 is replaced by a corresponding functional gate structure 140. The conversion of the dummy gate structure 110 into the functional gate structure 140 uses a method which may be referred to as a "replacement polysilicon gate (RPG)" technique. The RPG technique may also be called a "gate last" technique. After the formation of the functional gate structures 140, transistors T10 are completed. Each of the transistors T10 may include a functional gate structure 140 serving as a gate terminal and its corresponding epitaxial features 120 serving as source/drain terminals.

FIGS. 16 to 28 show formation of multiple conductive contacts (vias) and conductive lines over the substrate 100. In operation 217 of FIG. 3, conductive contacts 132 and conductive lines 134 are formed over the epitaxial features 120, as shown in FIGS. 16A to 16C.

Figure 16A:
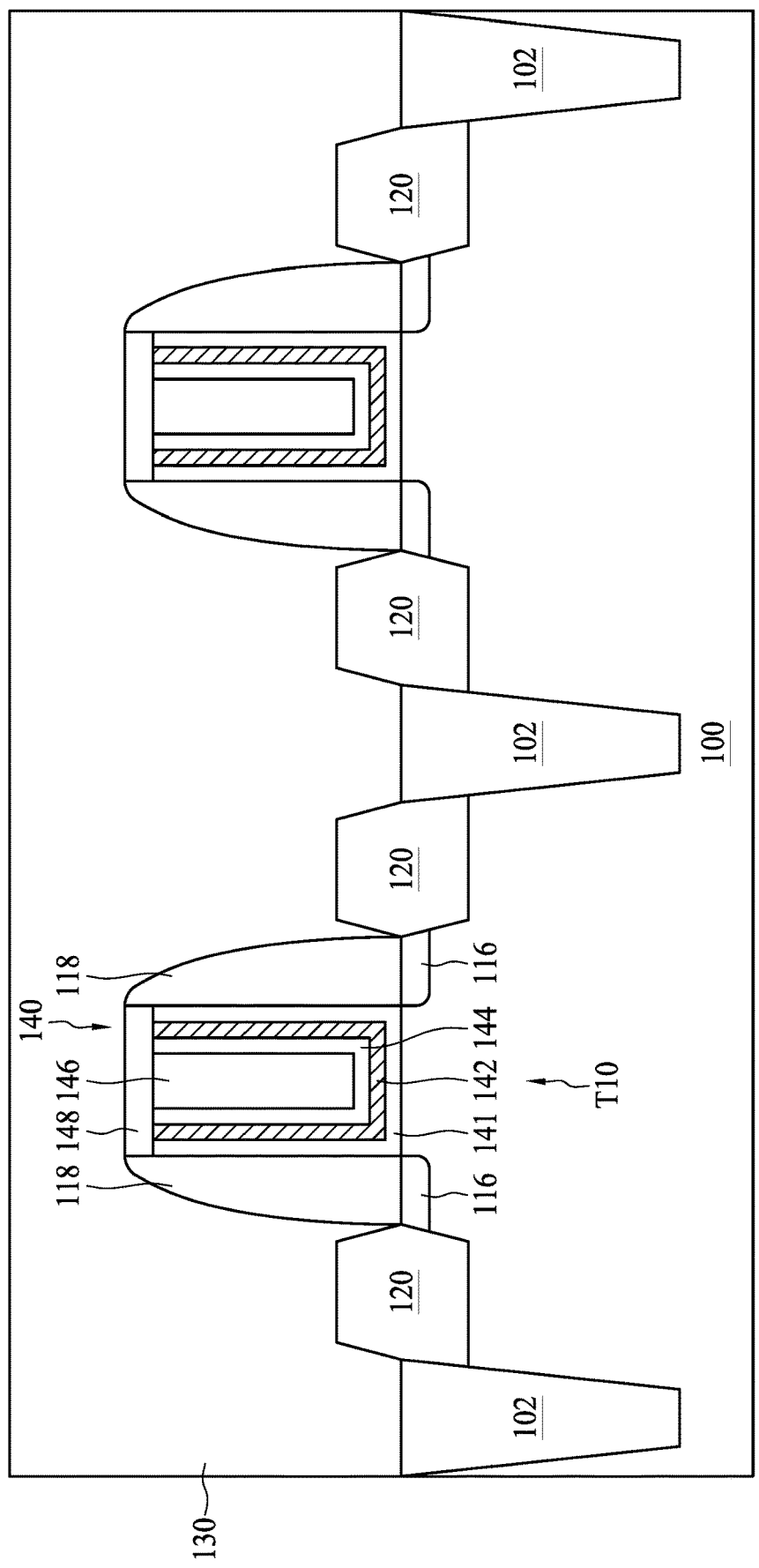

Referring to FIG. 16A, more ILD layer can be formed on the ILD layer 130 for subsequent operations, and thus the combined ILD layers are referred to as the ILD layer 130 for simplicity.

Figure 16B:
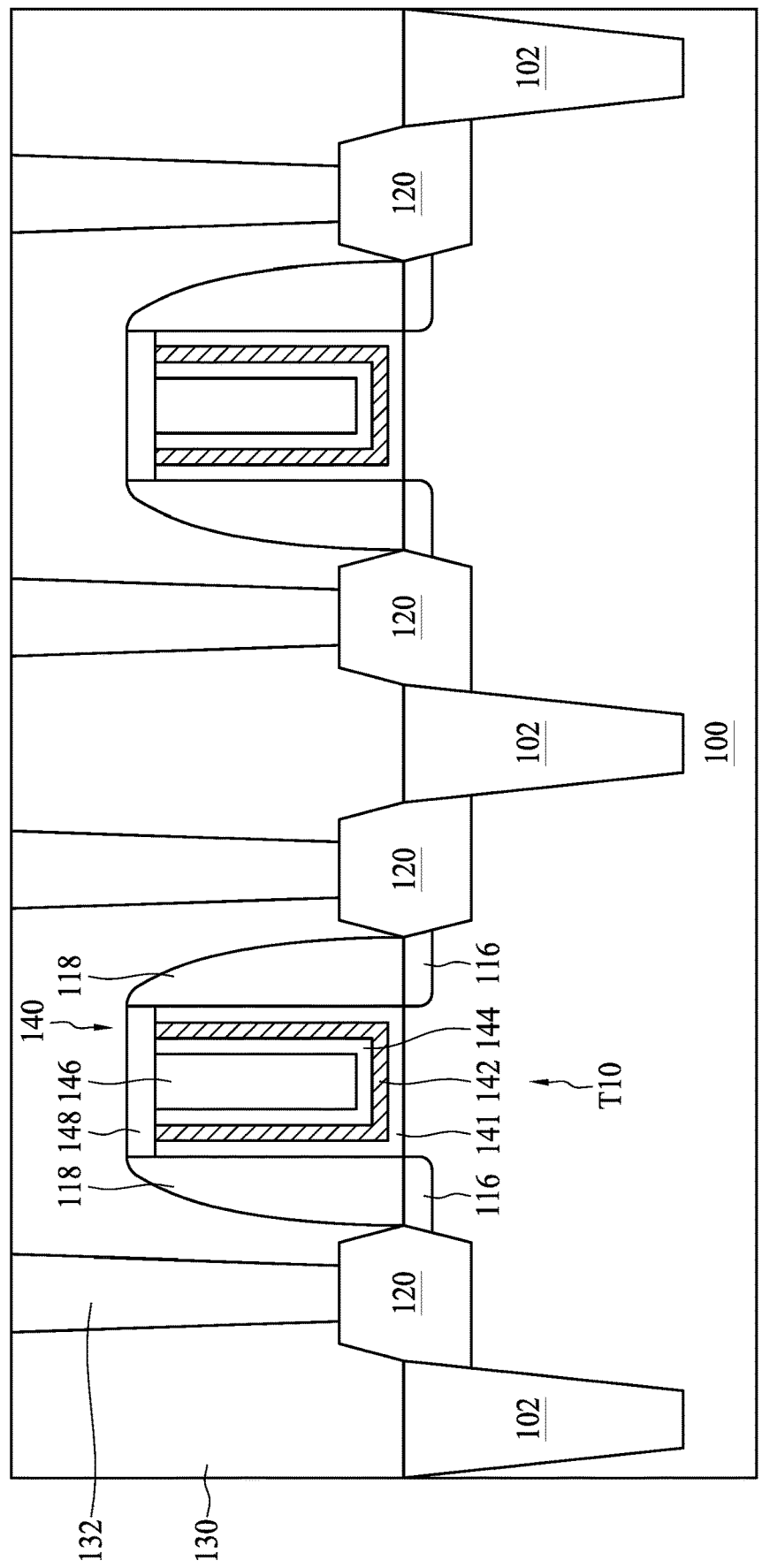

Referring to FIG. 16B, the conductive contact 132 is formed on the epitaxial feature 120. Although not illustrated, the conductive contacts 132 may be formed using a series of lithographic, etching, deposition and planarization operations. For example, multiple contact holes can be formed in the ILD layer 130 to expose the epitaxial features 120. One or more conductive materials, such as W, Cu, Co, Al, Ni, Ta, Ti, Mo, Pd, Pt, Ru, Ir, Ag, Au, the like, or a combination thereof, can then be deposited into the contact holes, using sputtering, electroplating, PVD or other suitable methods to form the conductive contacts 132. Each of the conductive contacts 132 is electrically coupled to each of the epitaxial features 120.

Figure 16C:
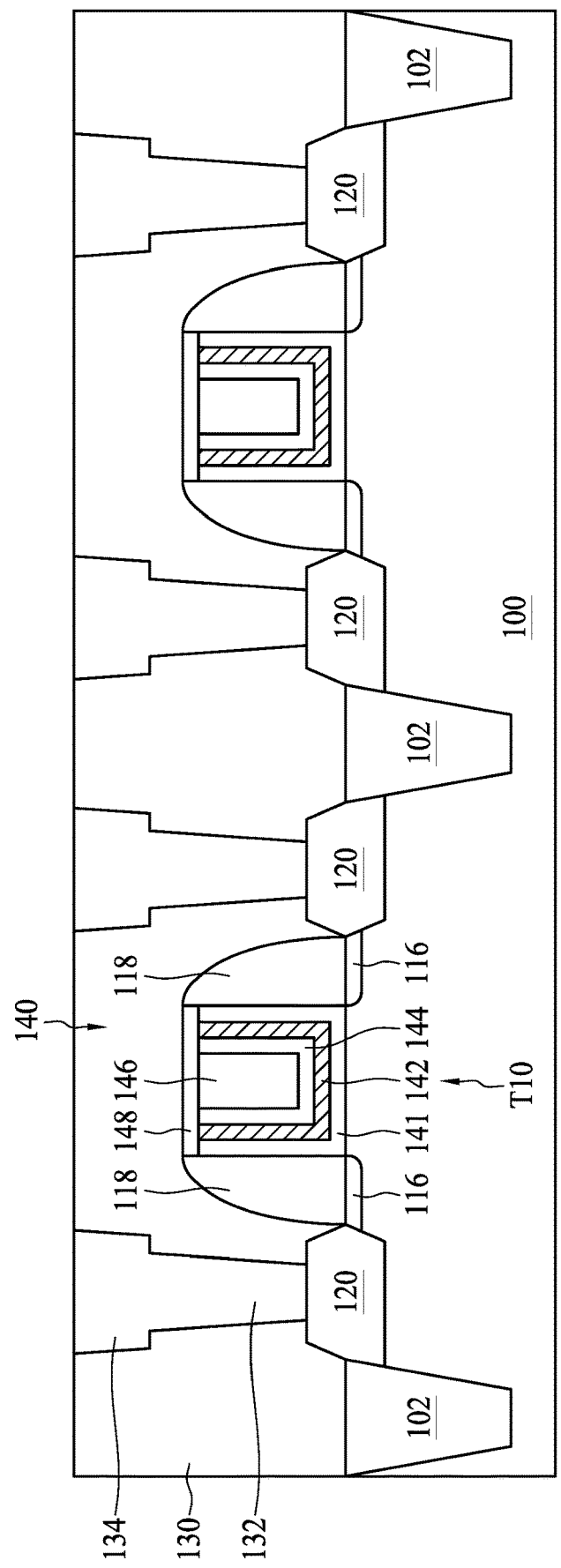

Referring to FIG. 16C, more ILD layer can be formed on the ILD layer 130 for subsequent operations, and thus the combined ILD layers are referred to as the ILD layer 130 for simplicity. The conductive line 134 is formed on the conductive contact 132. Although not illustrated, the operation for forming the conductive lines 134 may be similar to that for forming the conductive contacts 132. Each of the conductive lines 134 is electrically coupled to each of the conductive contacts 132. A barrier layer (not shown) may be disposed between each of the conductive contacts 132 and the ILD layer 130, and between each of the conductive lines 134 and the ILD layer 130. The barrier layer may be formed of TiN, TaN, Ta, Ti, TiSN, TaSN, W, WN, or combinations thereof, using ALD, PVD or other suitable methods. The barrier layer may be used to prevent the conductive material of the conductive contact 132 or the conductive line 134 from diffusing into the ILD layer 130.

Figure 17:
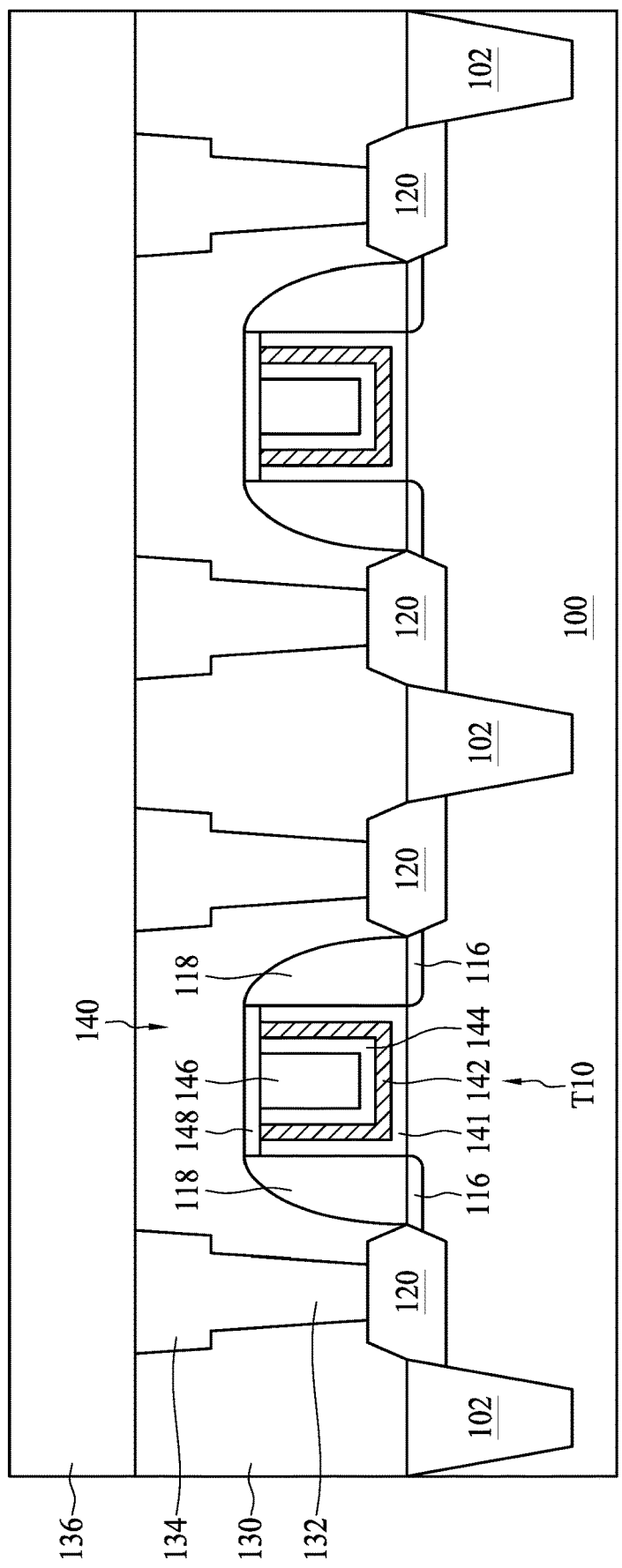
Figure 18:
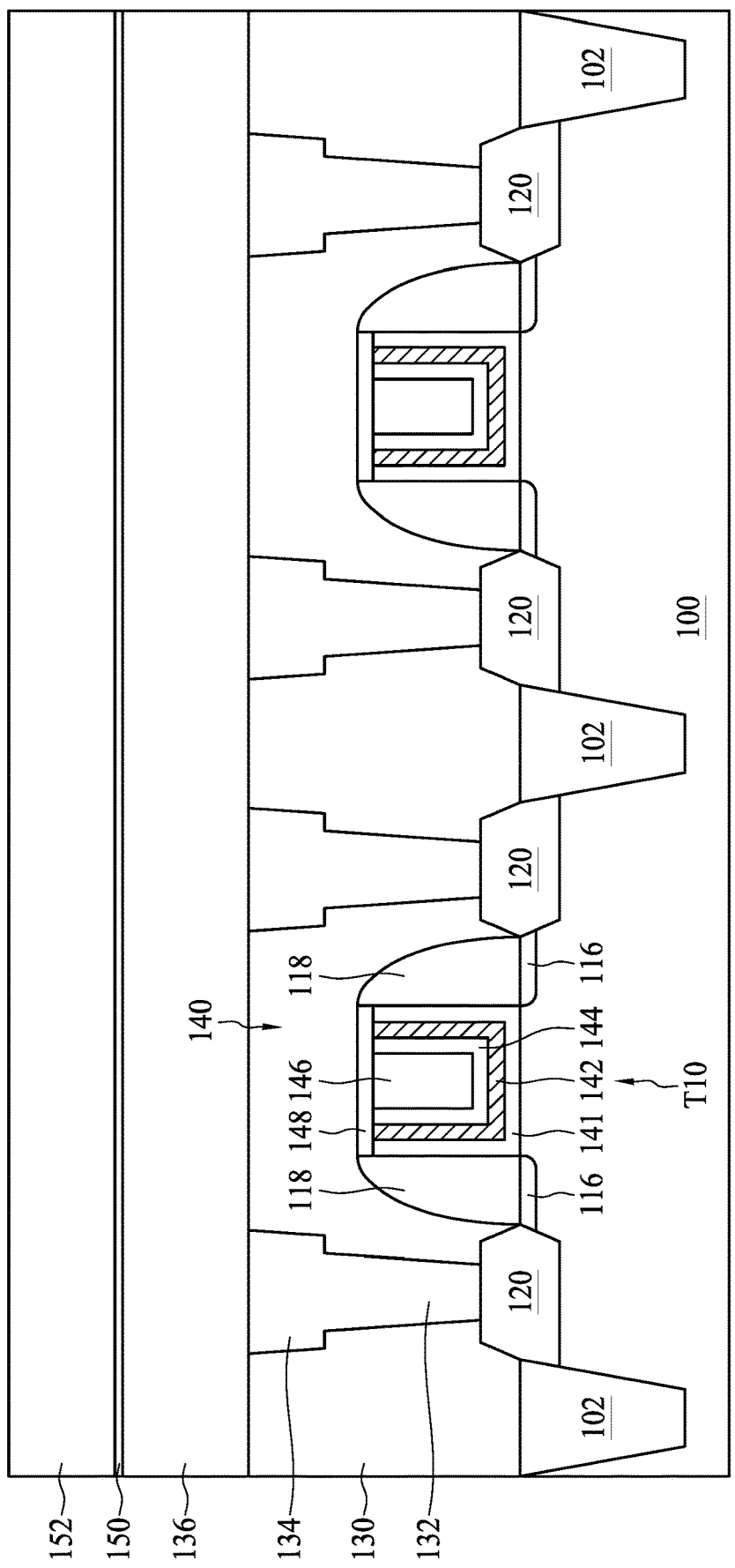

Multiple connected conductive vias and conductive lines may be formed over the conductive lines 134 in the back-end-of-line (BEOL) stage. The conductive vias and the conductive lines may be formed using a dual-damascene method. In operation 219 of FIG. 3, multiple inter-metal dielectric (IMD) layers are formed over the ILD layer 130, as shown in FIGS. 17 and 18. Referring to FIG. 17, an IMD layer 136 is formed on the ILD layer 130 and the conductive lines 134. The IMD layer 136 may include a material similar to that of the ILD layer 130. The operation for forming the IMD layer 136 may be similar to that for forming the ILD layer 130.

Referring to FIG. 18, an etch-stop layer (ESL) 150 is formed on the IMD layer 136, and an IMD layer 152 is formed on the ESL 150. The ESL 150 may be formed of silicon oxide, silicon nitride, silicon carbon nitride, silicon oxynitride, silicon carbide, silicon oxycarbide, or combinations thereof, using CVD, ALD or other suitable methods. The ESL 150 is used for controlling an end point when a contact hole is formed during a subsequent etching operation. In some embodiments, the IMD layer 152 includes a material similar to that of the IMD layer 136. The operation for forming the IMD layer 152 may be similar to that for forming the IMD layer 136. In some other embodiments, if the etching rates of the IMD layer 152 and the IMD layer 136 are sufficiently different, the IMD layer 152 can be formed directly on the IMD layer 136, i.e., with no interposing ESL 150. In some embodiments, the dielectric constant of the IMD layer 152 is less than the dielectric constant of the IMD layer 136, for example, with a difference of greater than about 0.3.

Figure 19:
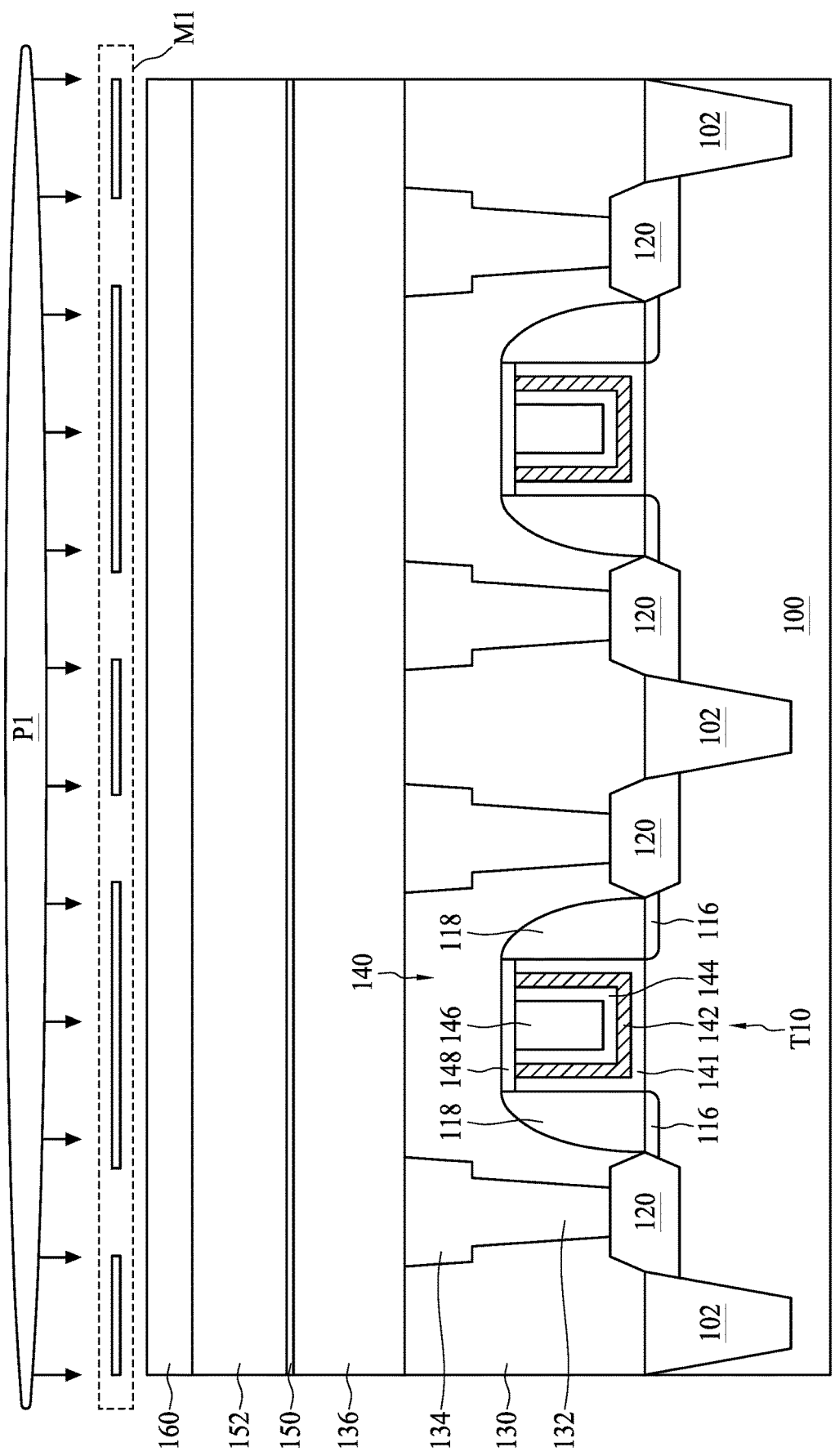
Figure 20:
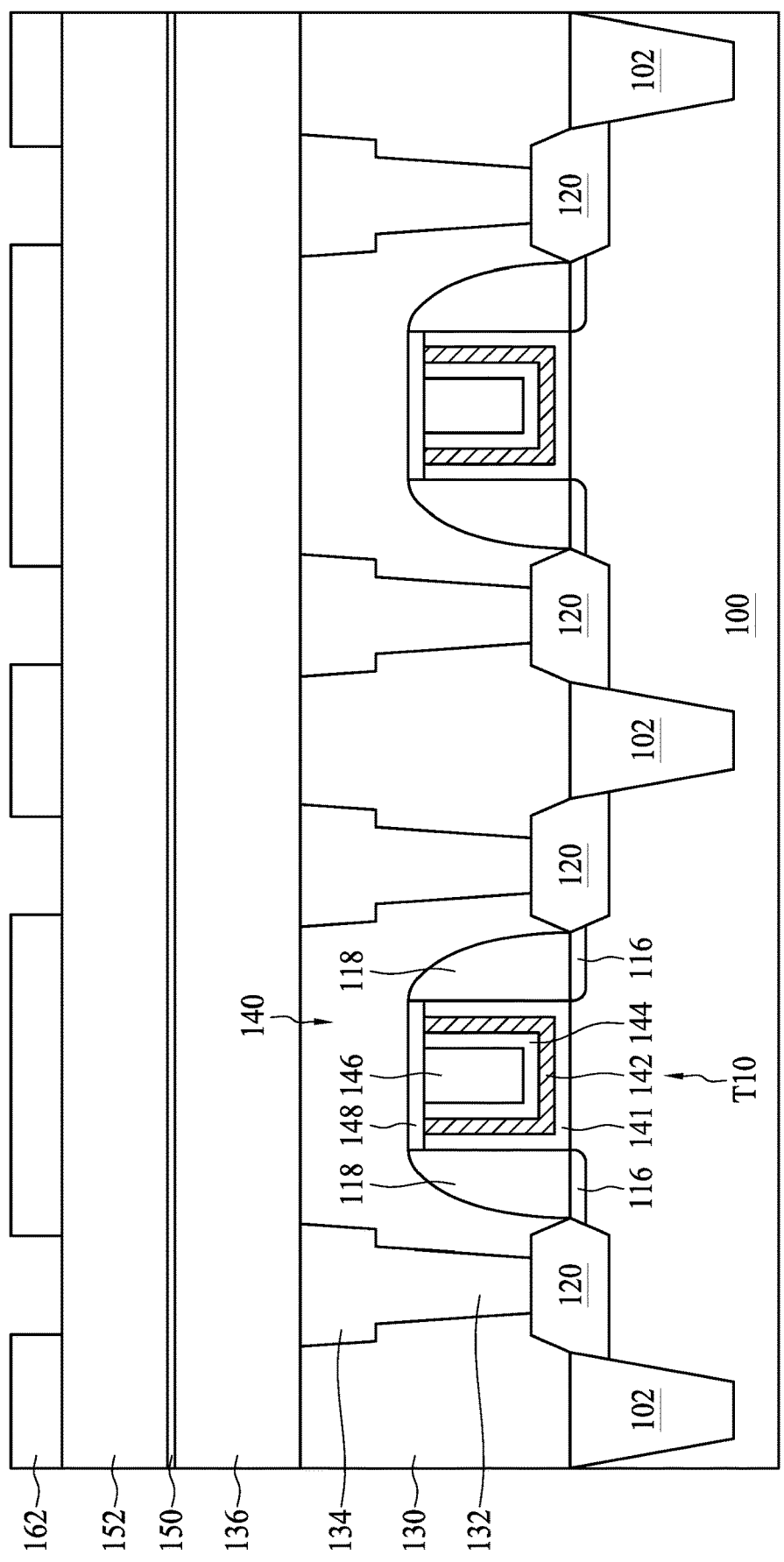
Figure 21:
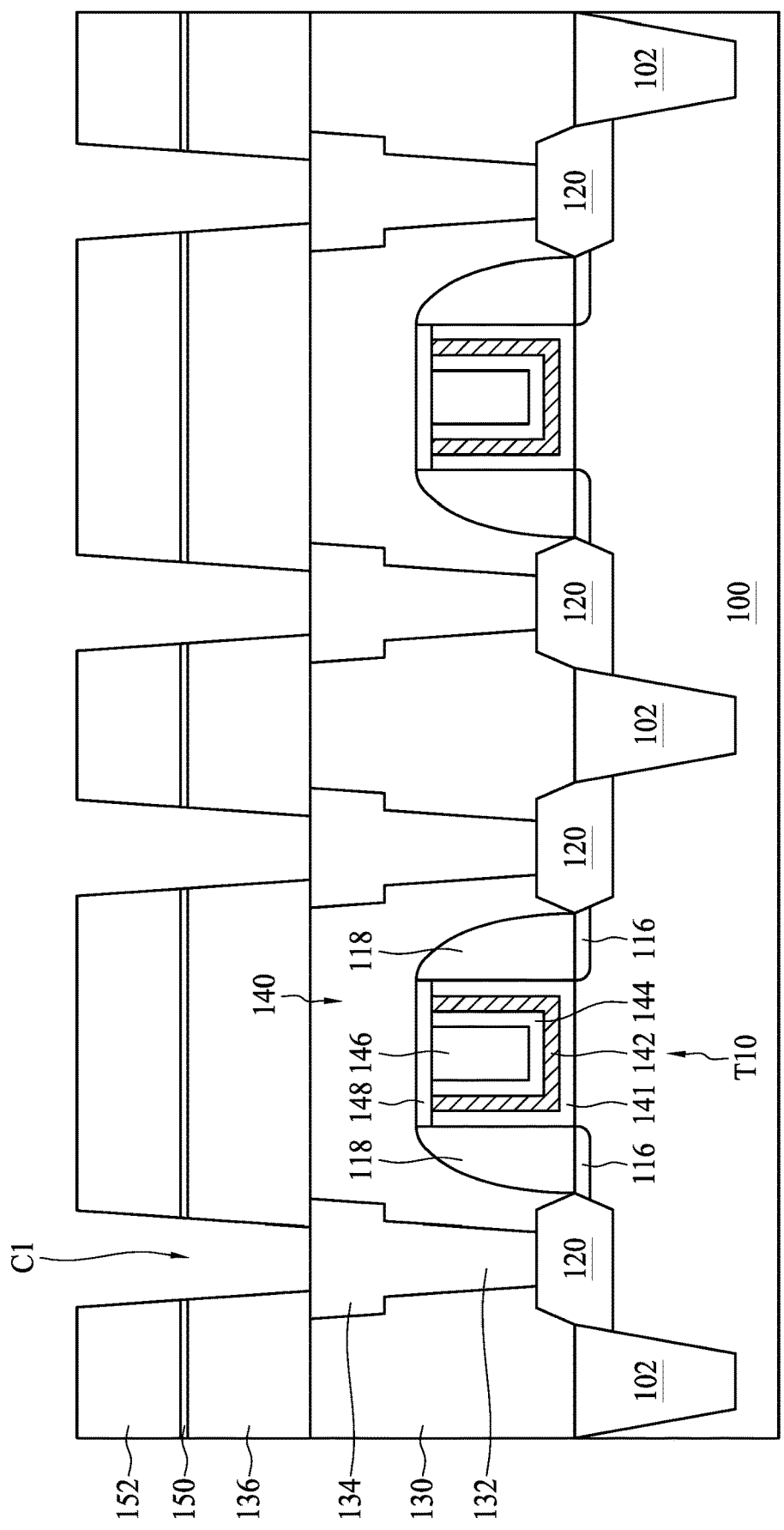

In operation 221 of FIG. 3, multiple contact holes C1 are formed to penetrate the IMD layer 152, the ESL 150 and the IMD layer 136, as shown in FIGS. 19 to 21. Referring to FIG. 19, a photoresist layer 160 is coated on the IMD layer 152. The photoresist layer 160 is exposed to a radiation P1 such as deep ultraviolet (DUV) or extreme ultraviolet (EUV) through a photomask M1. Referring to FIG. 20, after development, the exposed photoresist layer 160 may form a patterned photoresist layer 162 that remains on the IMD layer 152. Referring to FIG. 21, an etching operation is performed on the IMD layer 152, the ESL 150 and the IMD layer 136 to form the contact holes C1 using the patterned photoresist layer 162 as an etching mask. The pattern of the patterned photoresist layer 162 may be transferred to the IMD layers 136 and 152. The etching operation may include RIE, dry etching, or the like. The conductive lines 134 may be exposed by the contact holes C1. Subsequently, the patterned photoresist layer 162 may be stripped using a wet clean operation, an ashing operation, or the like.

Figure 22:
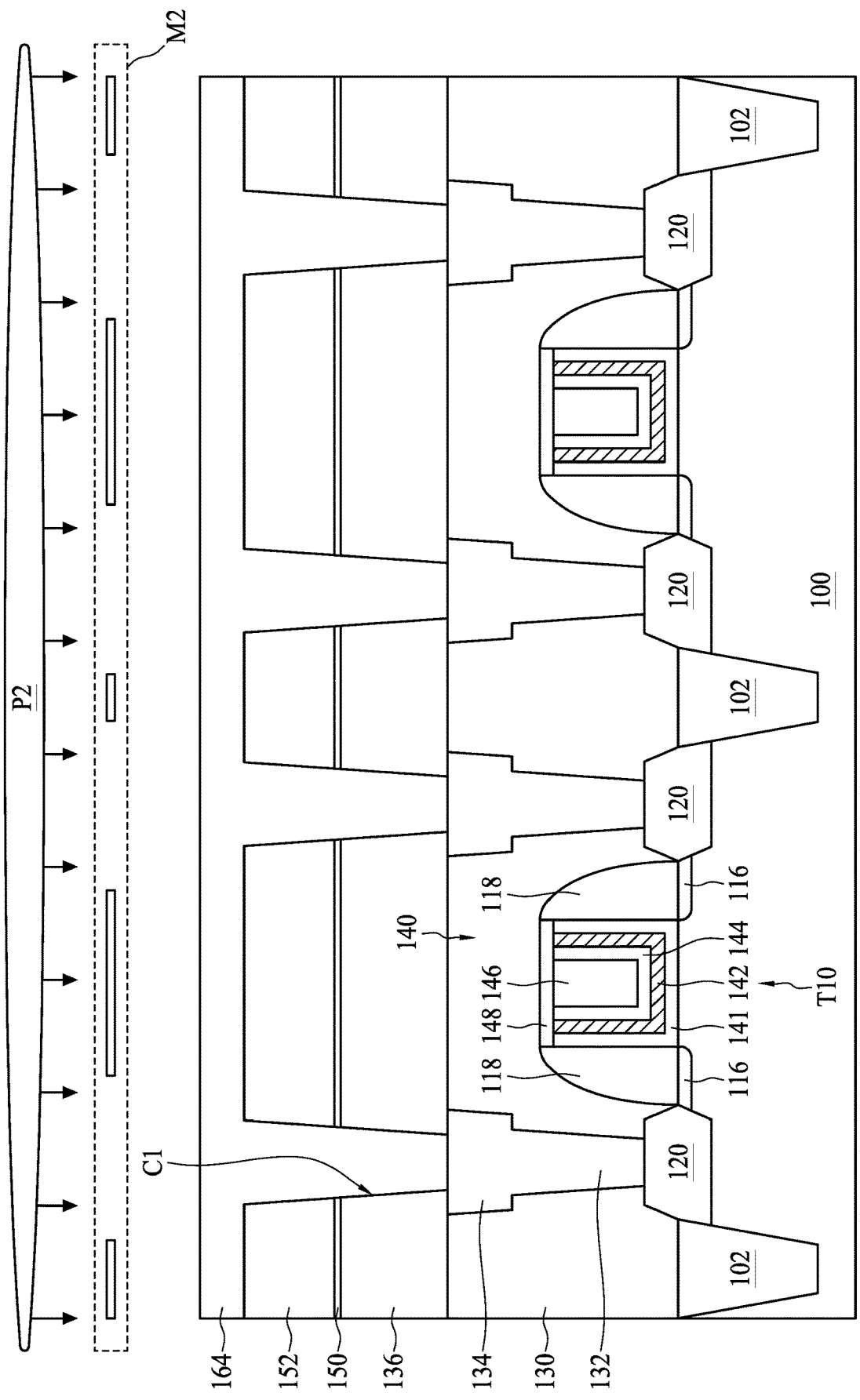
Figure 23:
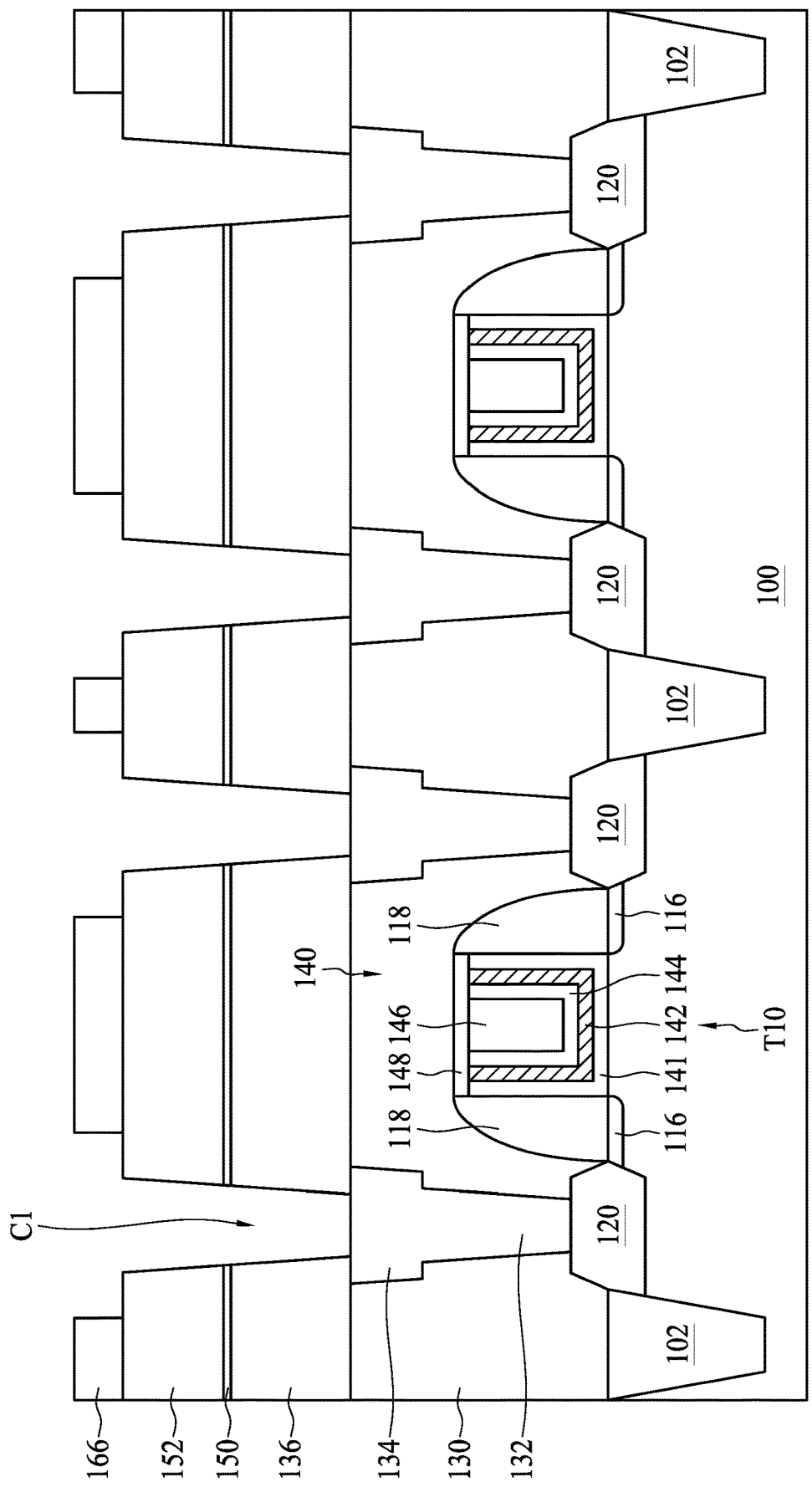
Figure 24:
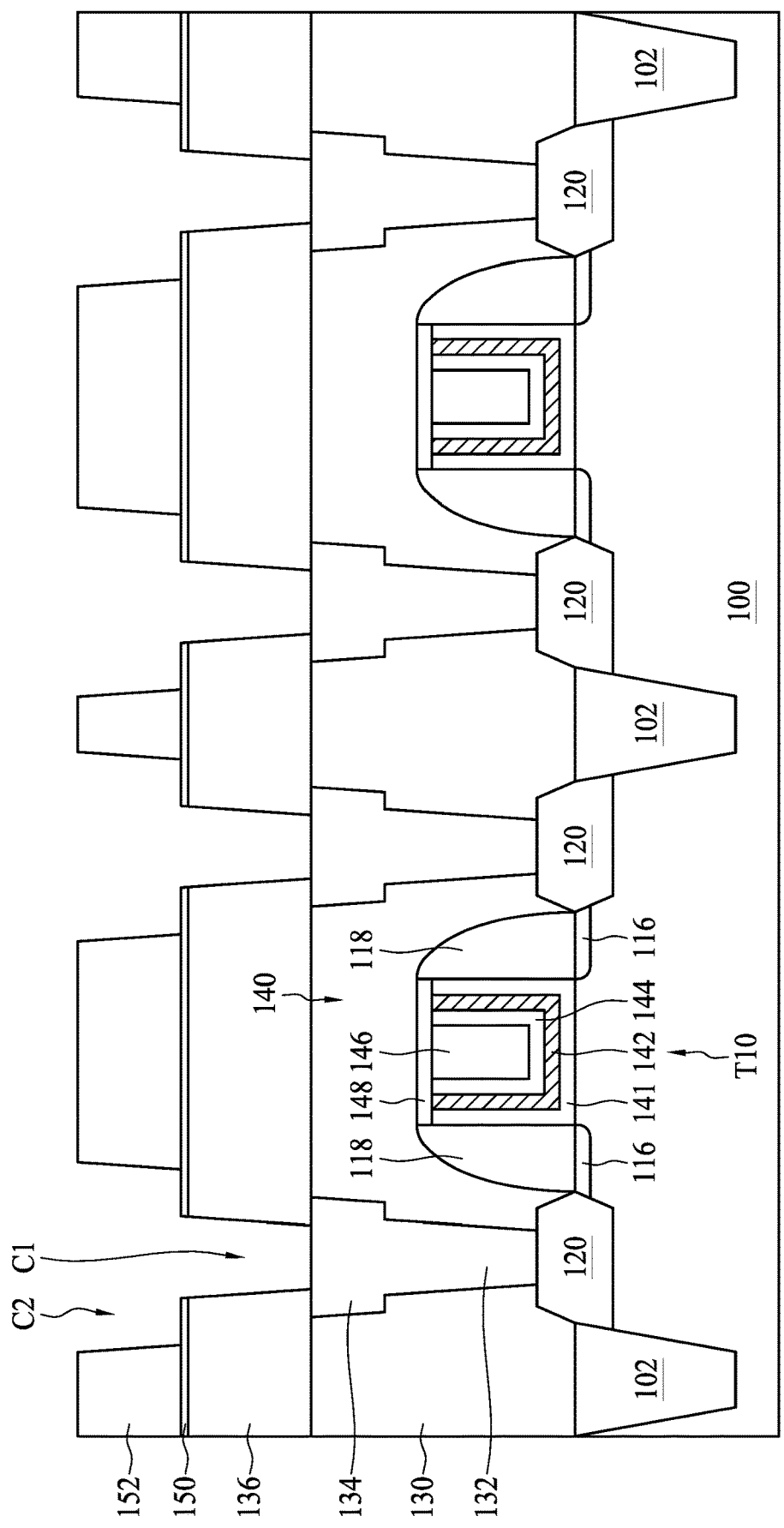

In operation 223 of FIG. 3, multiple contact holes C2 are formed in the IMD layer 152, as shown in FIGS. 22 to 24. Referring to FIG. 22, a photoresist layer 164 is coated on the IMD layer 152. The photoresist layer 164 may fill the contact holes C1. The photoresist layer 164 is exposed to a radiation P2 such as DUV or EUV through a photomask M2. Referring to FIG. 23, after development, the exposed photoresist layer 164 may form a patterned photoresist layer 166 that remains on the IMD layer 152. Referring to FIG. 24, an etching operation is performed on the IMD layer 152 to form the contact holes C2 using the patterned photoresist layer 166 as an etching mask. The pattern of the patterned photoresist layer 166 may be transferred to the IMD layer 152. The etching operation may include RIE, dry etching, or the like. In some embodiments, once an end point is detected, i.e., when the etching reaches the ESL 150, the etching operation is stopped. In such embodiments, the IMD layer 152 is etched while the IMD layer 136 is not etched. Therefore, portions of the ESL 150 and inner sidewalls of the IMD layer 152 may be exposed by the contact holes C2. Each of the contact hole C2 is connected to each of the contact hole C1. Next, the patterned photoresist layer 166 may be removed using a wet clean operation, an ashing operation, or the like.

Figure 25:
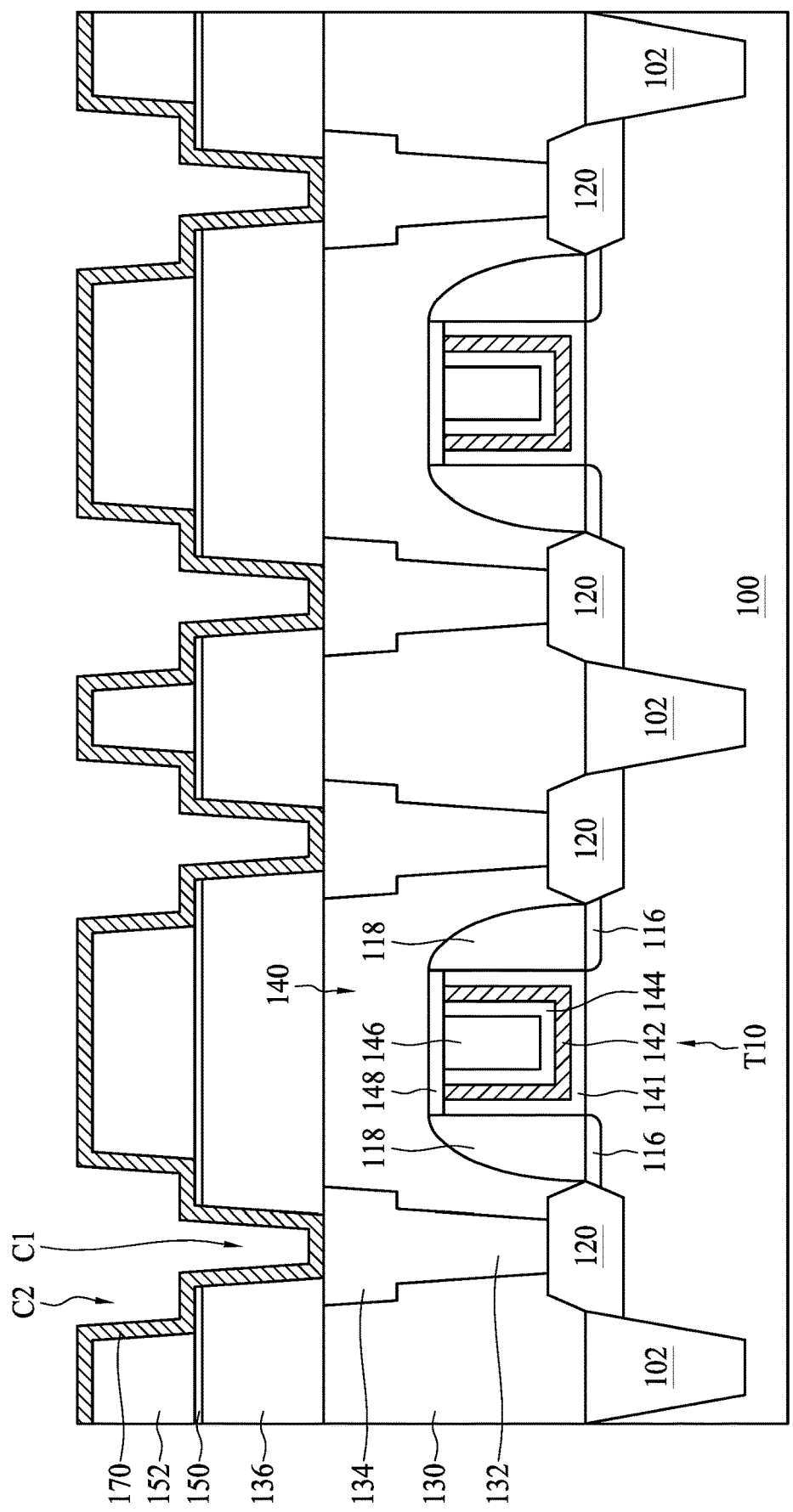

In operation 225 of FIG. 3, a barrier layer 170 is formed on the IMD layers 136 and 152, as shown in FIGS. 25 and 26A to 26C. Referring to FIG. 25, in some embodiments, the barrier layer 170 is formed on sidewalls of the contact holes C2 and the contact holes C1. The barrier layer 170, which may also be referred to as a diffusion barrier layer, is used to prevent a subsequently-formed conductive material, such as copper (Cu), from diffusing into the IMD layer 136 or the IMD layer 152. The barrier layer 170 may be formed before the conductive lines or the conductive contacts (vias) are formed. In some embodiments, the barrier layer 170 includes multiple layers.

Figure 26B:
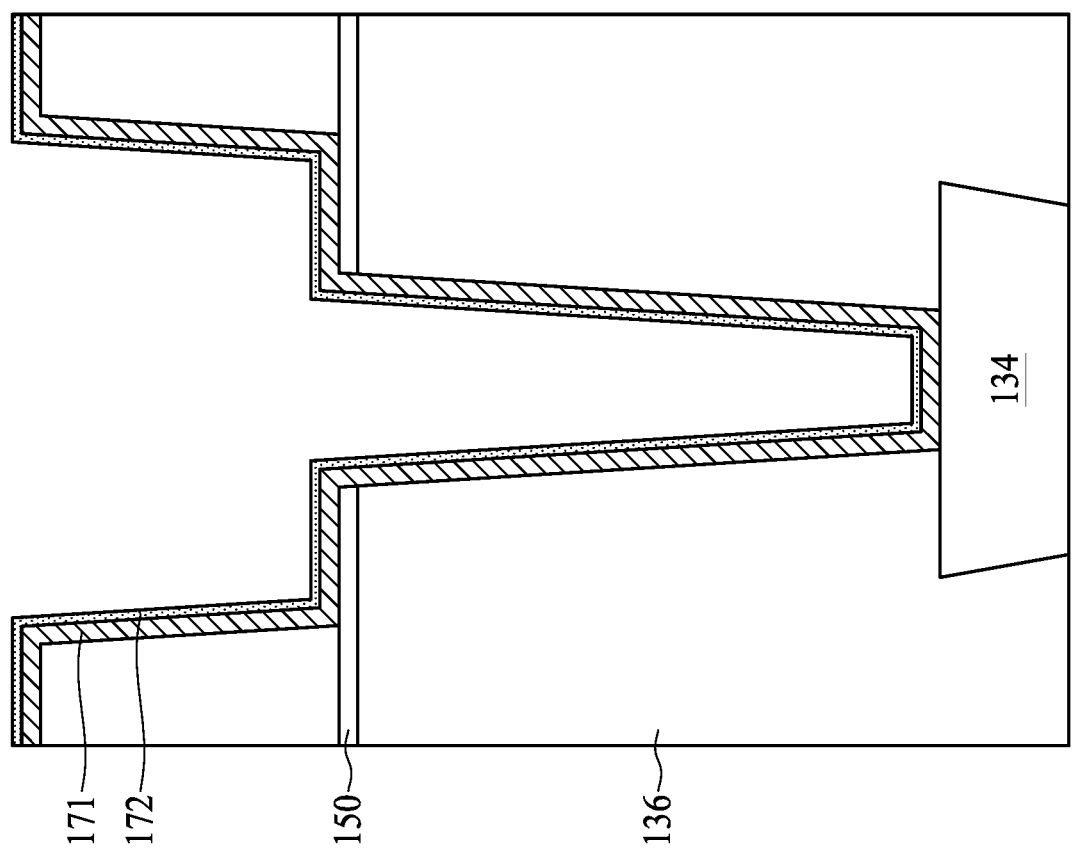
Figure 26C:
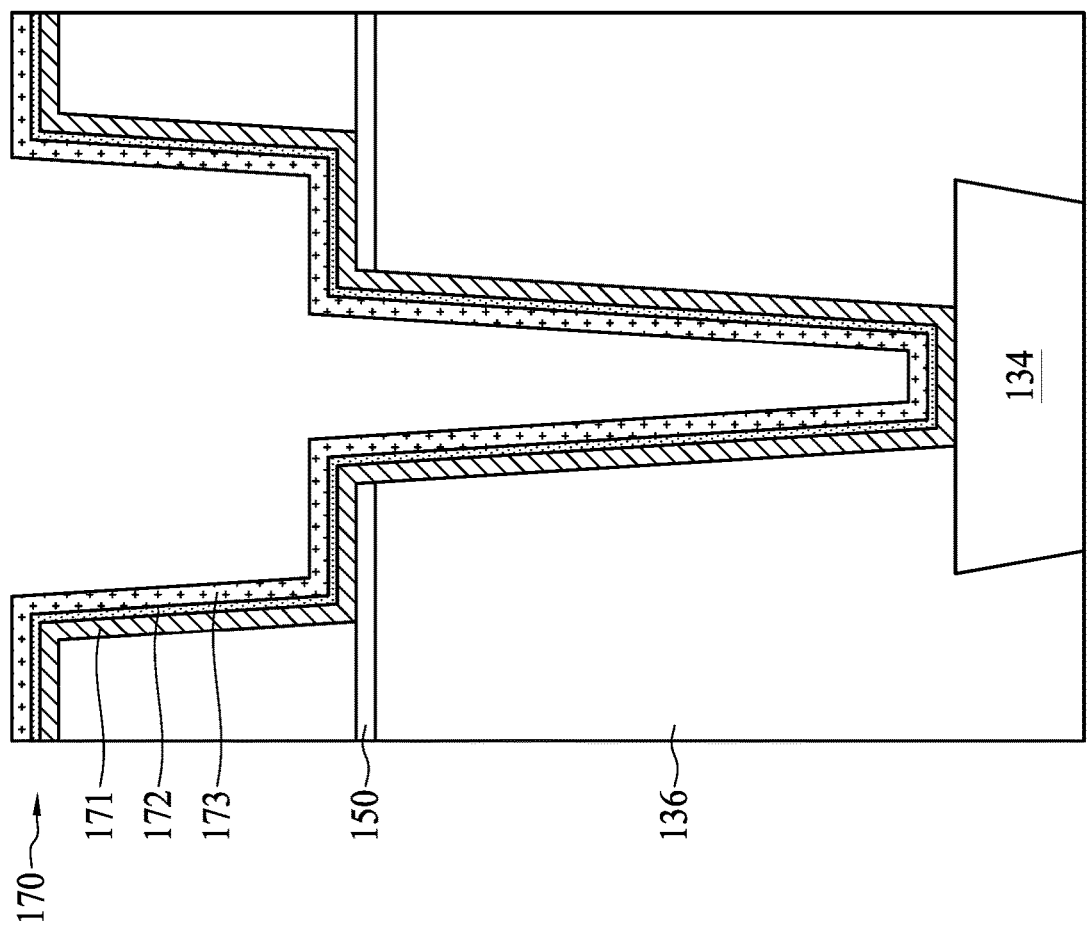

FIGS. 26A to 26C show details regarding the composition and the formation method of the barrier layer 170. Referring to FIG. 26A, in some embodiments, a first layer 171 is conformally formed along inner sidewalls of the IMD layer 152, the ESL 150 and the ILD layer 150 which are exposed by the contact holes C2 and the contact holes C1. The first layer 171 also covers the epitaxial feature 120. The first layer 171 may be formed of TiN, TaN, Ta, Ti, TiSN, TaSN, W, WN, or combinations thereof, using ALD, PVD or other suitable methods. The compound of the first layer may be highly crystalline. In some embodiments, the first layer 171 is formed in a processing chamber under a pressure between about $10^{-8}$ torr and $10^{-7}$ torr.

Referring to FIG. 26B, the substrate 100 including the elements formed thereon is then transferred to a CVD chamber without breaking the vacuum. In some embodiments, after the substrate 100 is in the CVD chamber and before a source gas is introduced, the pressure in the CVD chamber is slowly increased to about $10^{-6}$ torr. In such embodiments, there is sufficient trace oxygen ($O_2$) in the CVD chamber that can slowly react with the first layer 171.

A second layer 172 may be formed by an oxidation reaction between the first layer 171 and oxygen. For example, the top portion of the first layer 171 may slowly oxidized and converted to the second layer 172. In some embodiments, the second layer 172 is an oxide of TiN, TaN, Ta, Ti, TiSN, TaSN, W or WN, which may be respectively referred to as, for example, TiON, TaON, TaO, TiO, TiSON, TaSON, WO or WON. There compounds may still maintain highly crystalline because the small amount of oxygen does not affect the crystallinity significantly. The TiON, TaON, TaO, TiO, TiSON, TaSON, WO or WON may be used as an effective diffusion barrier for a subsequently-formed conductive material, such as Cu, from diffusing into the IMD layer 136 or 152. In some cases, when the pressure in the CVD chamber is greater than $10^{-6}$ torr, undesired amorphous or low-crystalline titanium oxide, tantalum oxide or tungsten oxide may be significant formed. These amorphous or low-crystalline oxide may lose its function of diffusion barrier. In some embodiments, the second layer 172 has an atomic ratio of oxygen to tantalum (O/Ta) between about 0.02 and about 1. The atomic ratio of oxygen to tantalum of the second layer 172 may be measured using analytical methods such as energy-dispersive X-ray spectroscopy (EDX) or X-ray photoelectron spectroscopy (XPS).

Referring to FIG. 26C, in some embodiments, a third layer 173 is conformally formed on the second layer 172 using CVD. In some embodiments, the third layer 173 is cobalt (Co) or other suitable materials. In some embodiments, the second layer 172 is simultaneously formed when the source gas for forming Co is introduced. That is, the second layer 172 may be formed at the same time with or shortly before the formation of the third layer 173. In some embodiments, the second layer 172 is formed in-situ when the third layer 173 is formed. The first layer 171, the second layer 172 and the third layer 173 may collectively form the barrier layer 170. The third layer may be used as a glue layer that may directly contact a conductive material, such as a metal. In some embodiments, the second layer 172 has strong affinity to the third layer 173. The second layer 172 may have a chemical bond with the third layer 173 once the third layer 173 is formed. For example, the second layer 172 may bond to or react with the third layer 173 to form $Ta_2CoO_6$.

Figure 27:
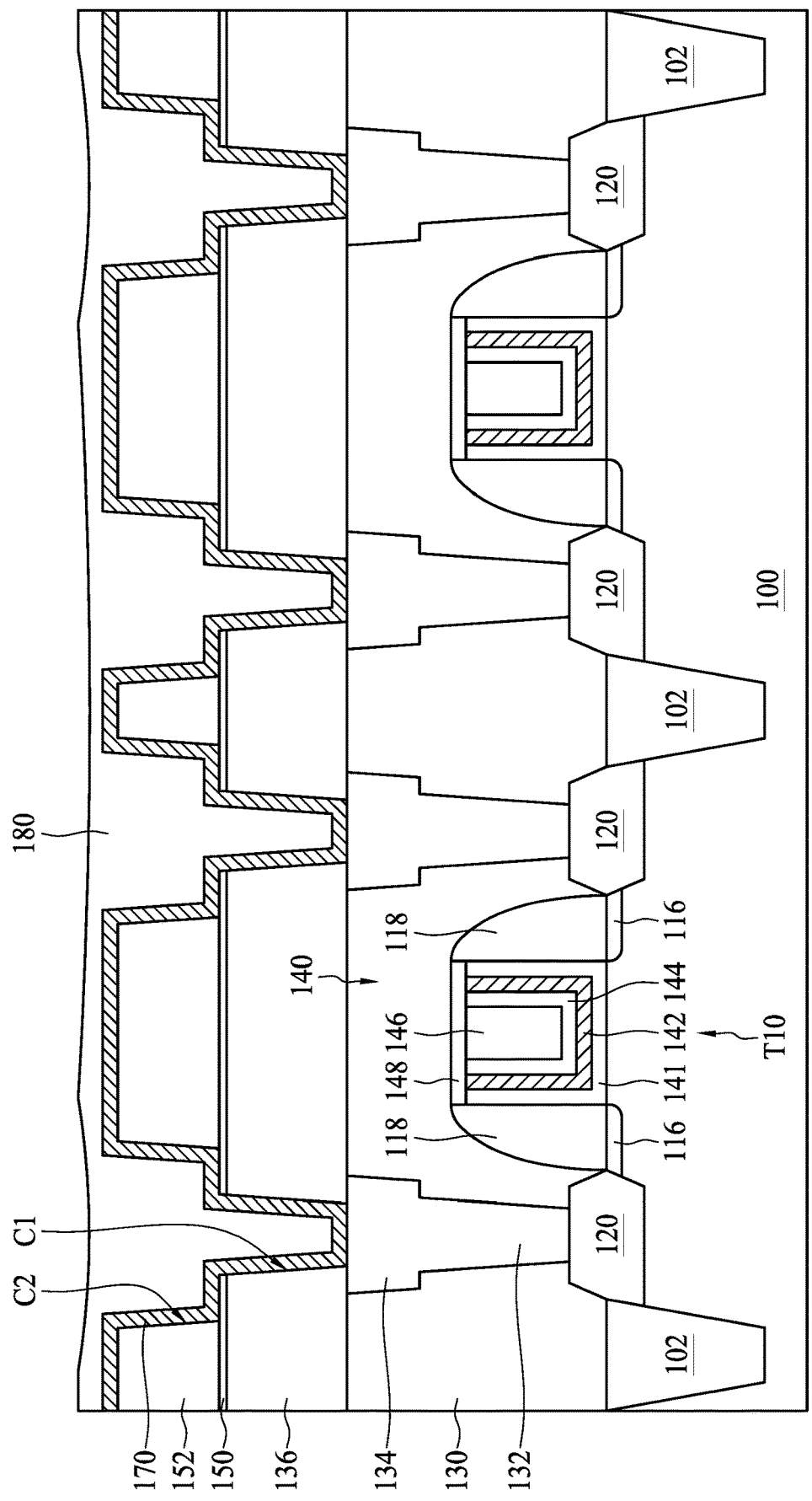
Figure 28:
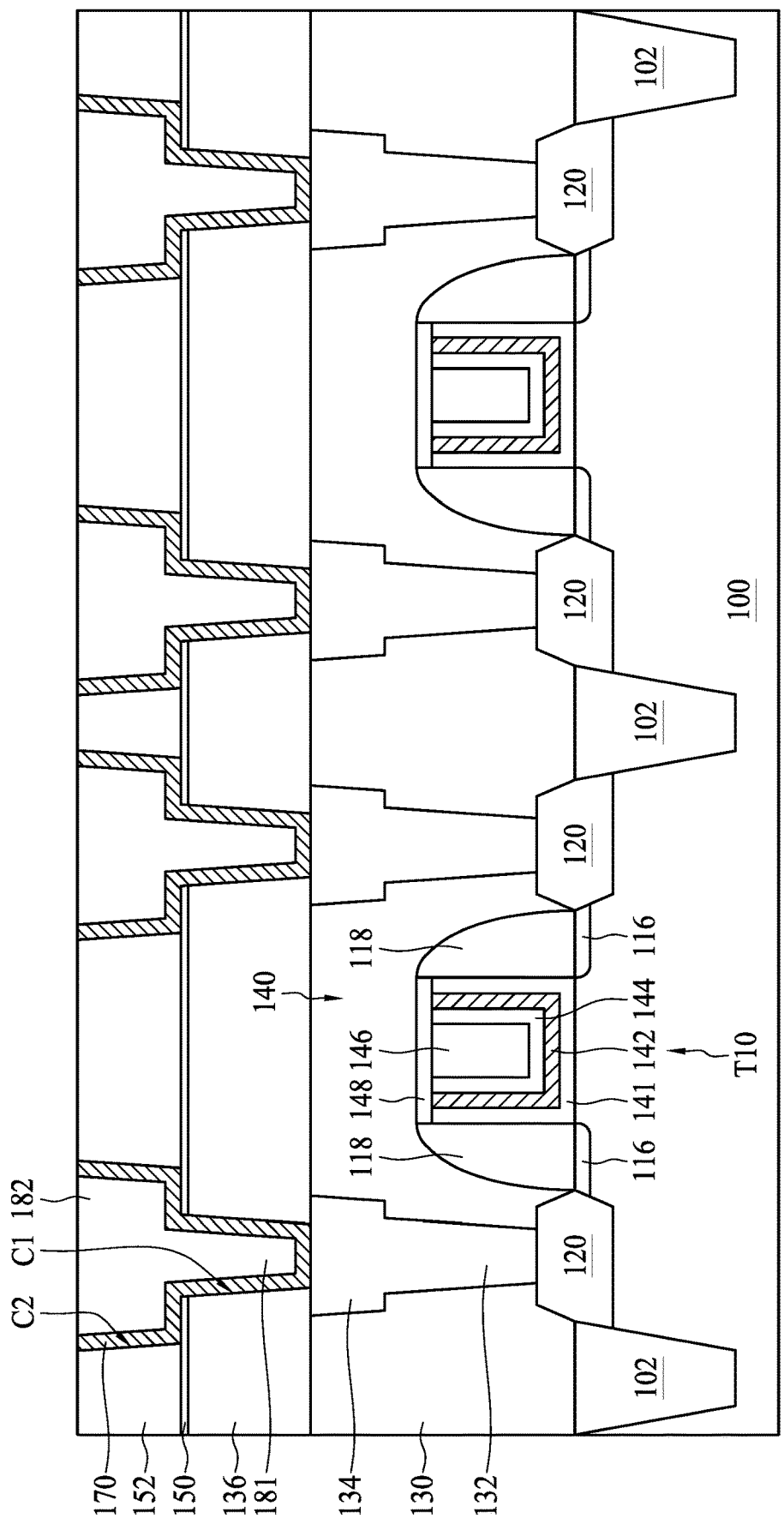

In operation 227 of FIG. 3, conductive vias 181 and conductive lines 182 are formed over the barrier layer 170, as shown in FIGS. 27 and 28. Referring to FIG. 27, the contact holes C1 and C2 may be filled with a conductive layer 180 using PVD, sputtering, electroplating, ALD or other suitable methods. The conductive layer 180 may include one or more conductive materials, such as W, Cu, Co, Al, Ni, Ta, Ti, Mo, Pd, Pt, Ru, Ir, Ag, Au, the like, or a combination thereof. Referring to FIG. 28, a planarization operation, such as CMP, may be used to remove portions of the conductive layer 180 and the barrier layer 170 over the top surface of the IMD layer 152. Thus, the top surface of the IMD layer 152 may be exposed. Remaining portions of the conductive layer 180 may form the conductive vias 181 in the contact holes C1 and the conductive lines 182 in the contact holes C2. The conductive line 182 may be connected to and electrically coupled to the conductive via 181. The conductive via 181 and the conductive line 182 may be surrounded by the barrier layer 170. The conductive line 182 and the conductive via 181 may be electrically coupled to the epitaxial feature 120. The barrier layer 170 disposed between the epitaxial feature 120 and the conductive via 181 can reduce parasitic resistance at the silicon/metal contact junction. Although not illustrated, other conductive contacts and conductive lines may be formed directly above the functional gate structures 140 using the dual-damascene method as previously described, or using a single-damascene method. Such conductive contacts and conductive lines may be electrically coupled to the functional gate structures 140. In some embodiments, neighboring conductive vias 181 or neighboring conductive lines 182 have a pitch between about 10 nanometers (nm) and about 500 nm.

Figure 29:
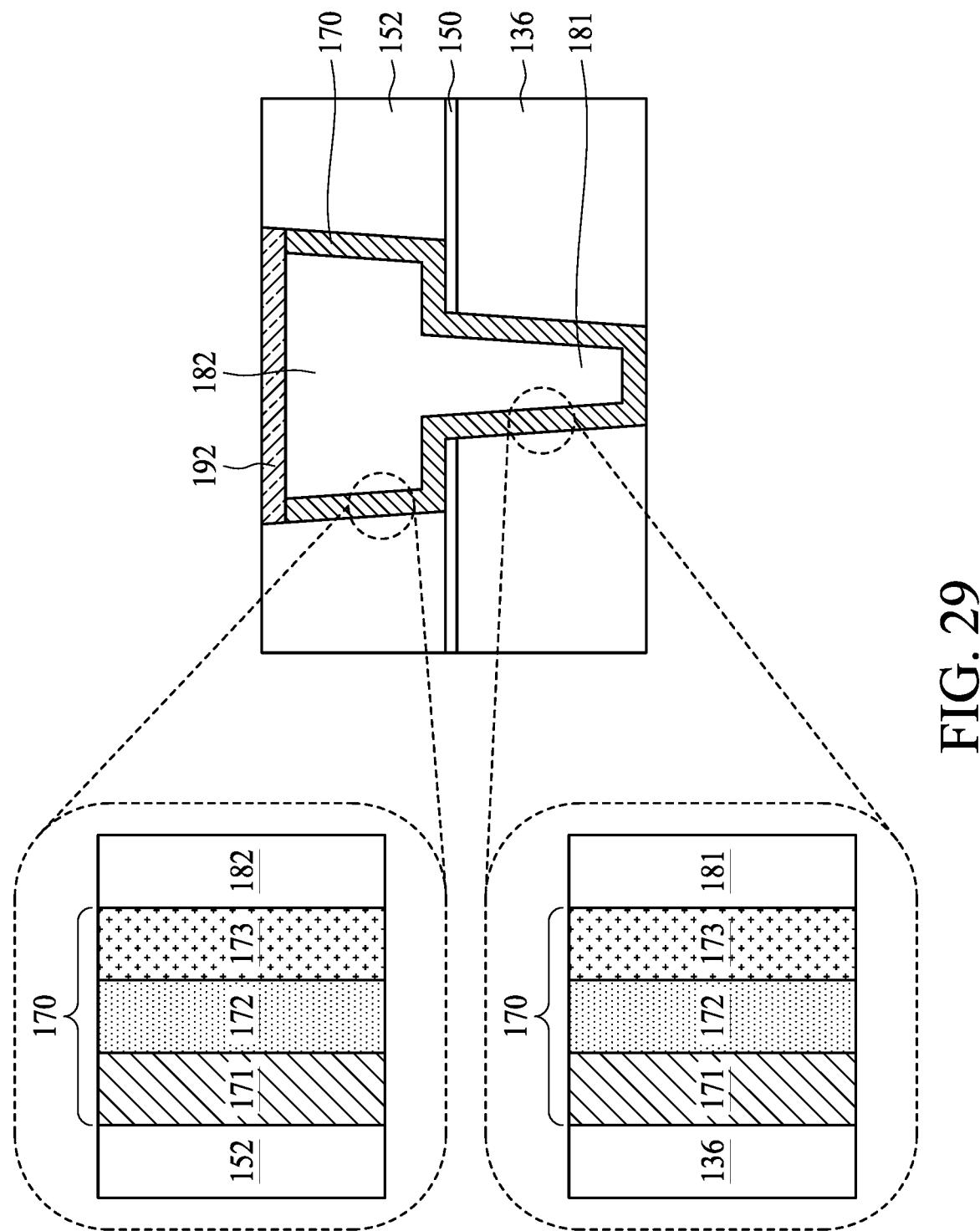

FIG. 29 is an enlarged view of the barrier layer 170. The barrier layer embedded in the IMD layer 136 separates the IMD layer 136 and the conductive via 181. The barrier layer embedded in the IMD layer 152 separates the IMD layer 152 and the conductive line 182. In some embodiments, the barrier layer 170 includes the first layer 171, the second layer 172 and the third layer 173. The first layer 171 is disposed on the IMD layer 136, the ESL 150 and the ILD 152. The second layer 172 is between the first layer 171 and the second layer 173. The third layer 173 is adjacent to the conductive via 181 or the conductive line 182. In some embodiments, the barrier layer 170, which separates a dielectric material and a conductive material, is used to suppress a copper electromigration from the conductive via 181 or the conductive line 182 to the IMD layer 136 or the ILD 152.

Figure 30A:
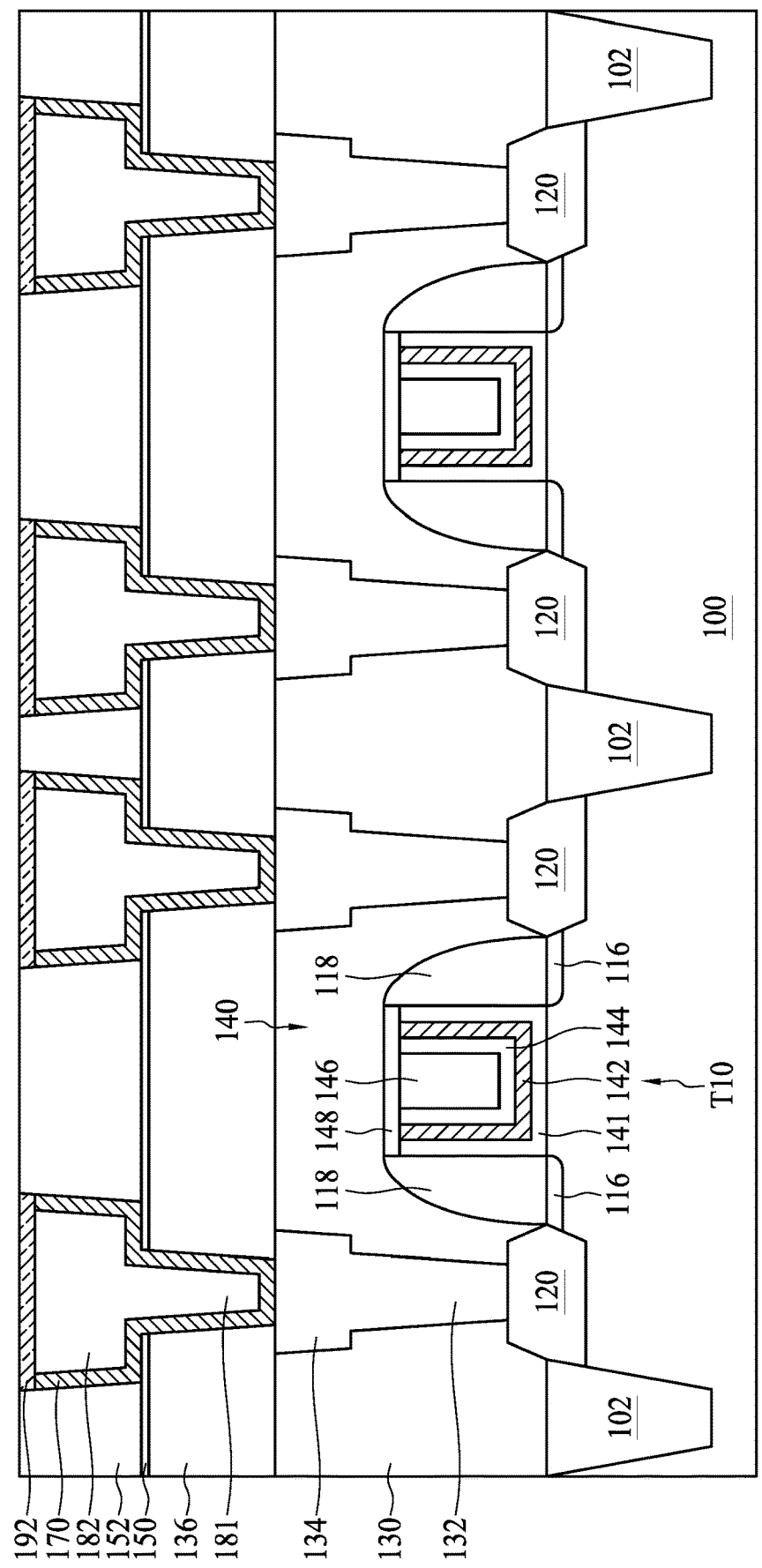
Figure 30B:
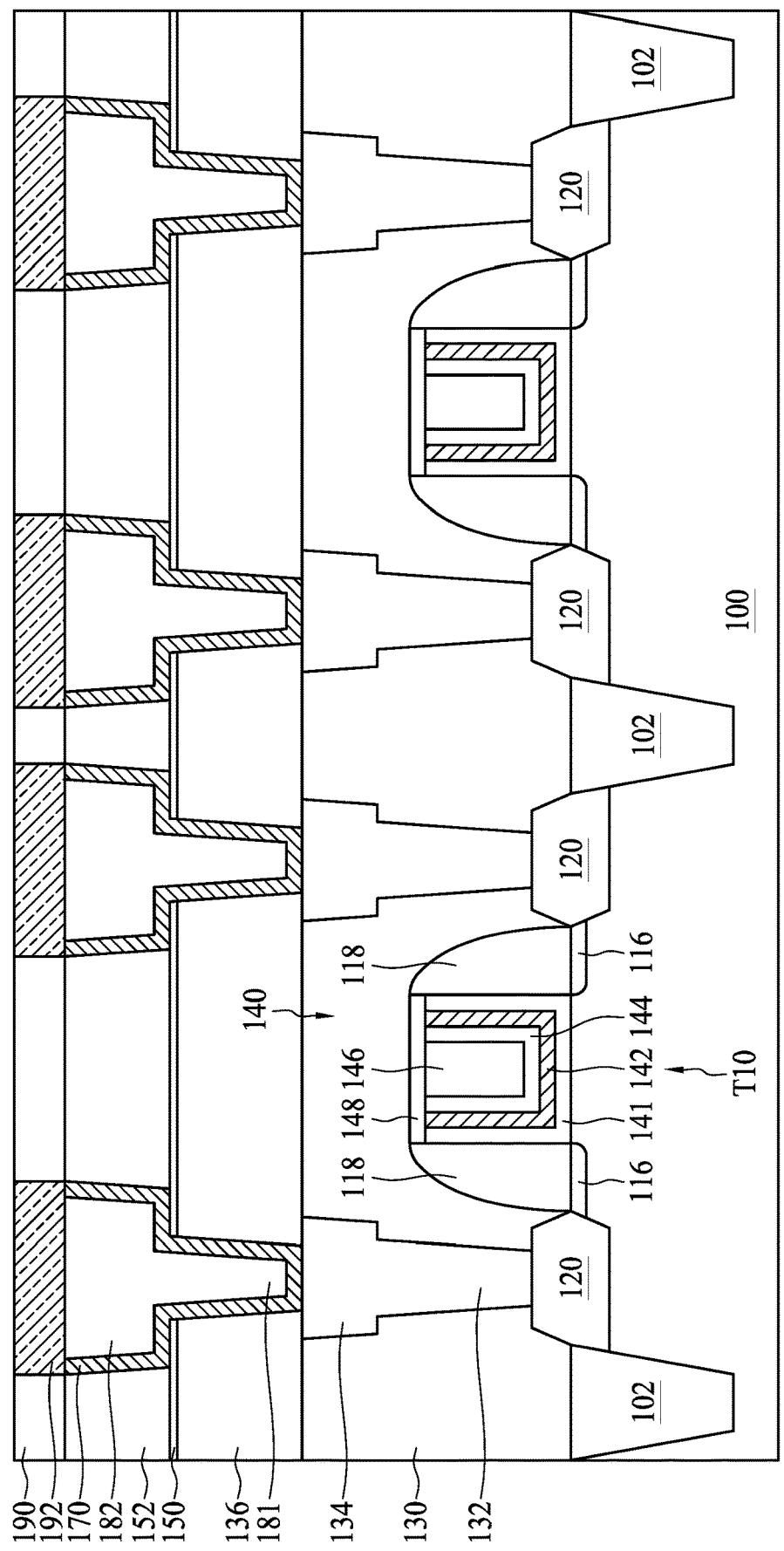

In operation 229 of FIG. 3, a conductive cap layer 192 is formed on each of the conductive lines 182, as shown in FIG. 30A or FIG. 30B. Referring to FIG. 30A, the formation of the conductive cap layer 192 is similar to that of the cap layer 148 in FIG. 17. In some embodiments, the formation of the conductive cap layer 192 includes using a controlled etch-back operation to recess portions of the barrier layer 170 and the conductive line 182 such that a common top surface of the barrier layer 170 and the conductive line 182 is lower than the top surface of the IMD layer 152. A conductive material, such as W, Co, Ni, Ta, Mo, the like, or a combination thereof, is deposited into a space created by the etch-back operation. The conductive material may be deposited using PVD, CVD, sputtering, electroplating, electroless plating or other suitable methods. The conductive material can then be planarized, such as by CMP, to form top surfaces coplanar with the top surface of the IMD layer 152, thereby forming the conductive cap layer 192.

Referring to FIG. 30B, in some other embodiments, the formation of the conductive cap layer 192 is free of an etch-back operation. An ILD layer 190 may be formed on the IMD layer 152. Portions of the ILD layer 190 are then recessed to expose the underlying barrier layer 170 and the IMD layer 152 conductive line 182. The conductive cap layer 192 can be formed in a space surrounded by the ILD layer 190 and over the barrier layer 170 and the conductive line 182.

Referring to FIGS. 30A and 30B, in some embodiments, the conductive cap layer 192 has a better characteristic match with an overlying or neighboring dielectric layer than the conductive line 182, and thus acts as a buffer layer between the conductive line 182 and the overlying or neighboring dielectric layer. Furthermore, the conductive cap layer 192 may help reduce electro-migration and stress-migration and thus improves device reliability.

Figure 31A:
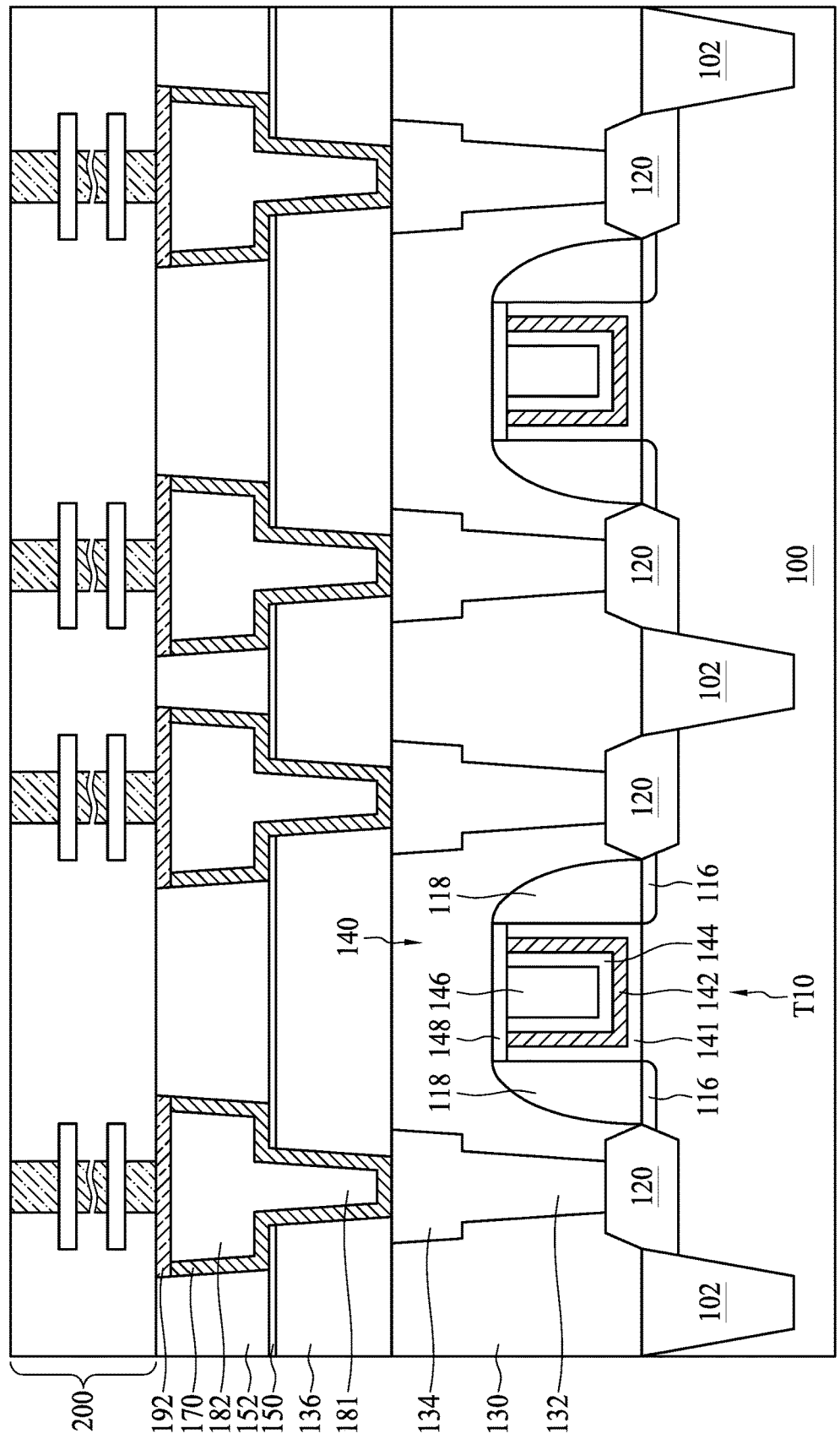
Figure 31B:
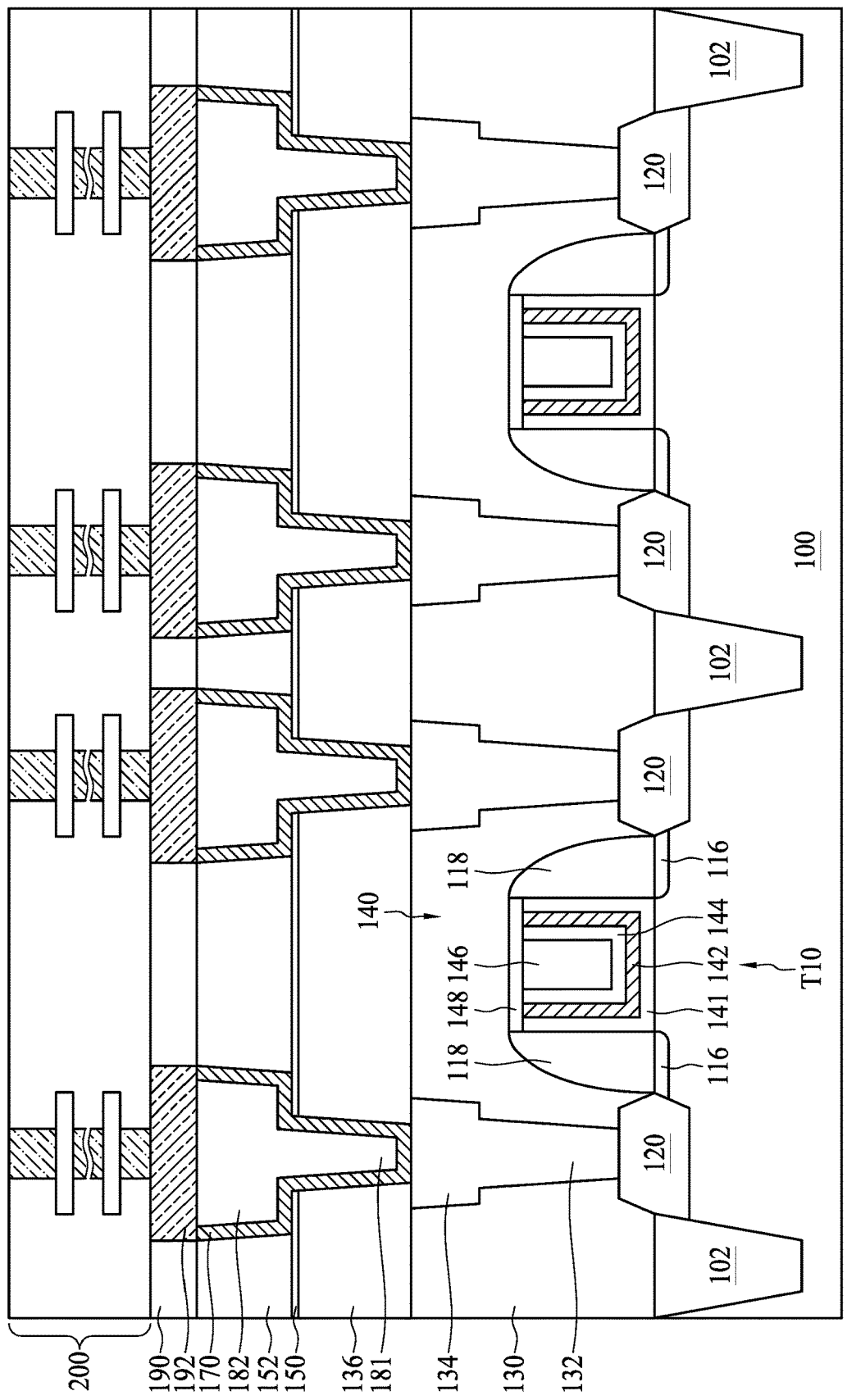

In operation 231 of FIG. 3, an interconnect structure 200 is formed above the conductive lines 182, as shown in FIGS. 31A and 31B. The interconnect structure 200 may include multiple higher-level metal layers such as conductive vias and conductive lines embedded in one or more dielectric layers. The interconnect structure 200 may be electrically coupled to the conductive lines 182, the conductive vias 181 and the epitaxial features 120. Although not illustrated, the interconnect structure 200 may be formed using a series of lithographic, etching, deposition and planarization operations. At this stage, operations for forming the semiconductor structure 10 have been completed.

FIGS. 32 to 41 show formation of multiple conductive contacts (vias) and conductive lines using a single-damascene method. The single-damascene method may be similar to the dual-damascene method illustrated in FIGS. 18 to 28, and thus descriptions of similar details will not be repeated.

Figure 32:
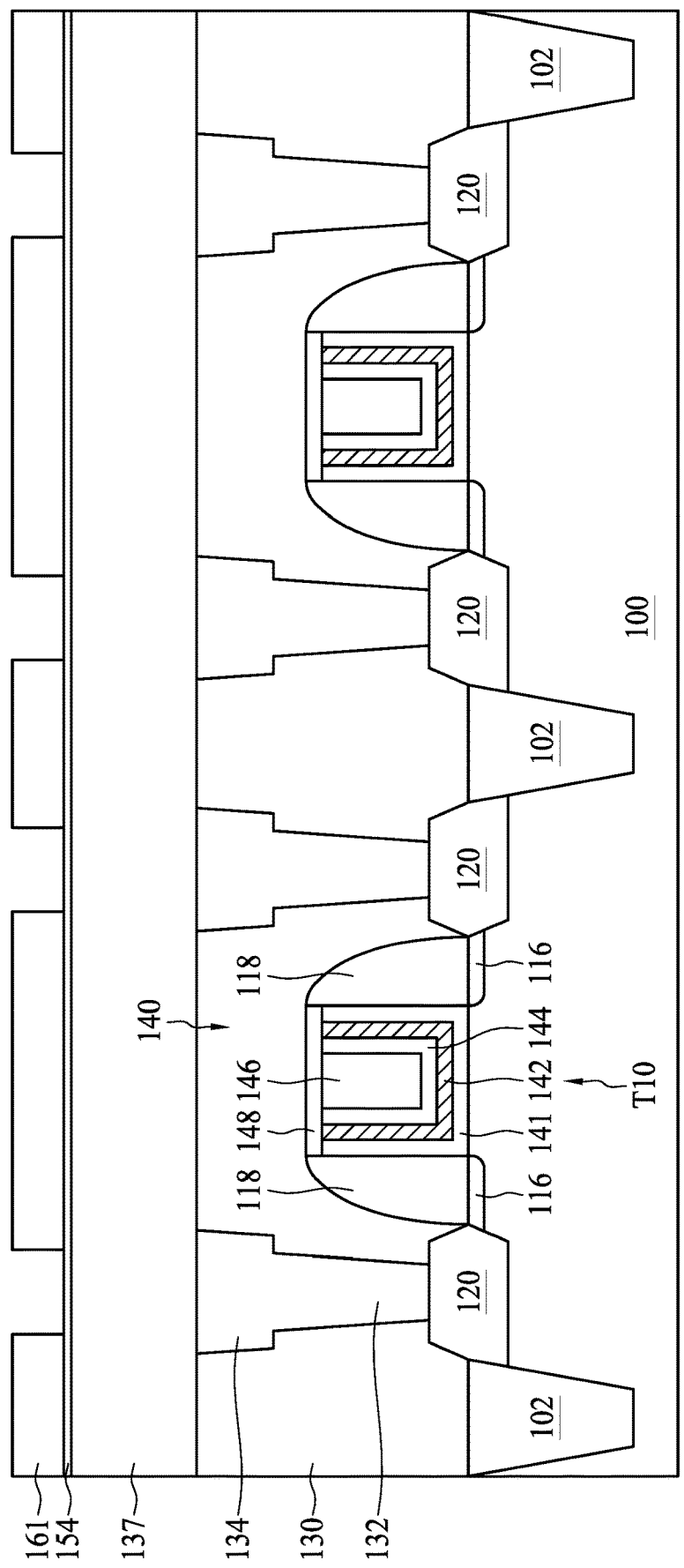

Continued from FIG. 17, and referring to FIG. 32, an IMD layer 137 is formed on the ILD layer 130 and the conductive lines 134, and an ESL 154 is formed on the IMD layer 137. Materials of the IMD layer 137 and the ESL 154 and may be the same as or similar to those of the IMD layer 136 and the ESL 150, respectively. For patterning the IMD layer 137, a patterned photoresist layer 161 is formed on the ESL 154.

Figure 33:
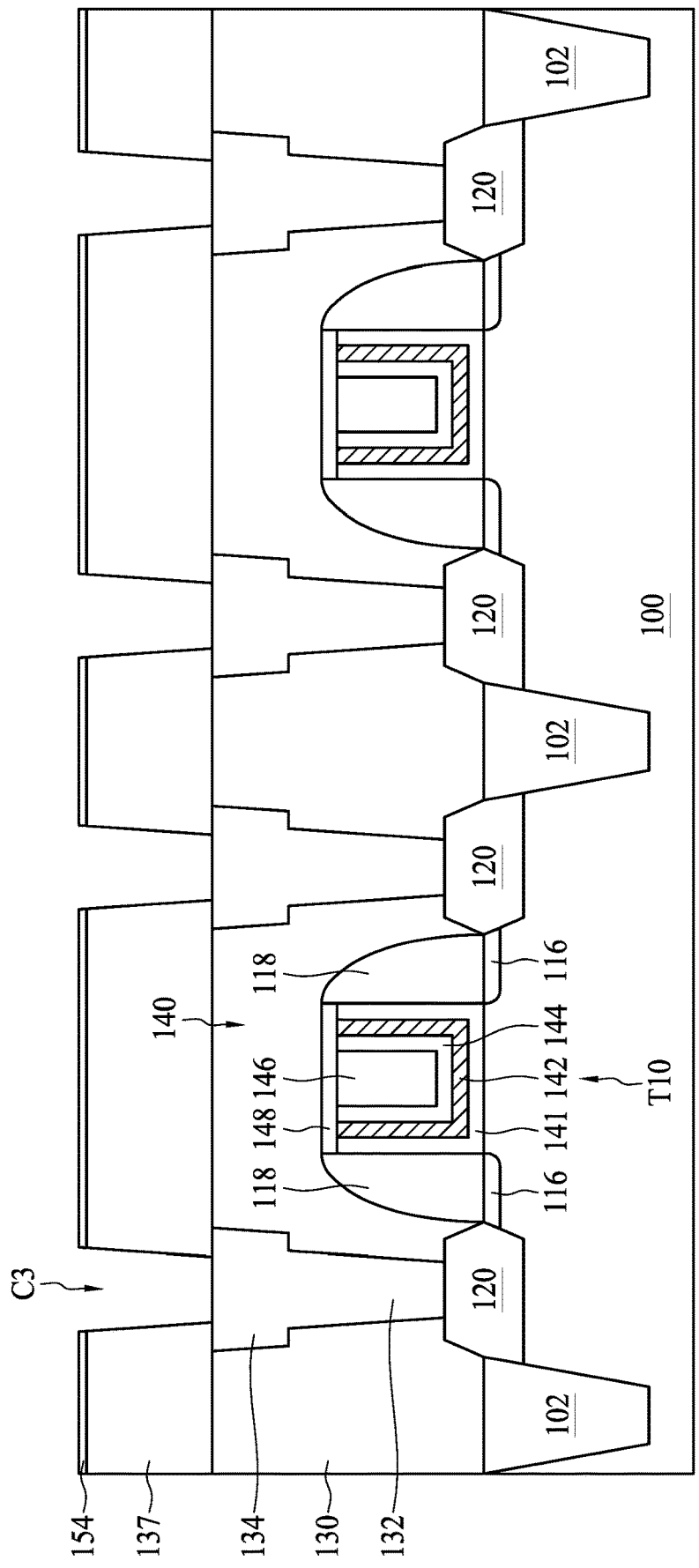

Referring to FIG. 33, an etching operation is performed on the ESL 154 and the IMD layer 137 to form a contact hole C3 using the patterned photoresist layer 161 as an etching mask. The pattern of the patterned photoresist layer 161 may be transferred to the IMD layer 137. The formed contact hole C3 penetrates the ESL 154 and the IMD layer 137, and exposes the conductive line 134.

Figure 34:
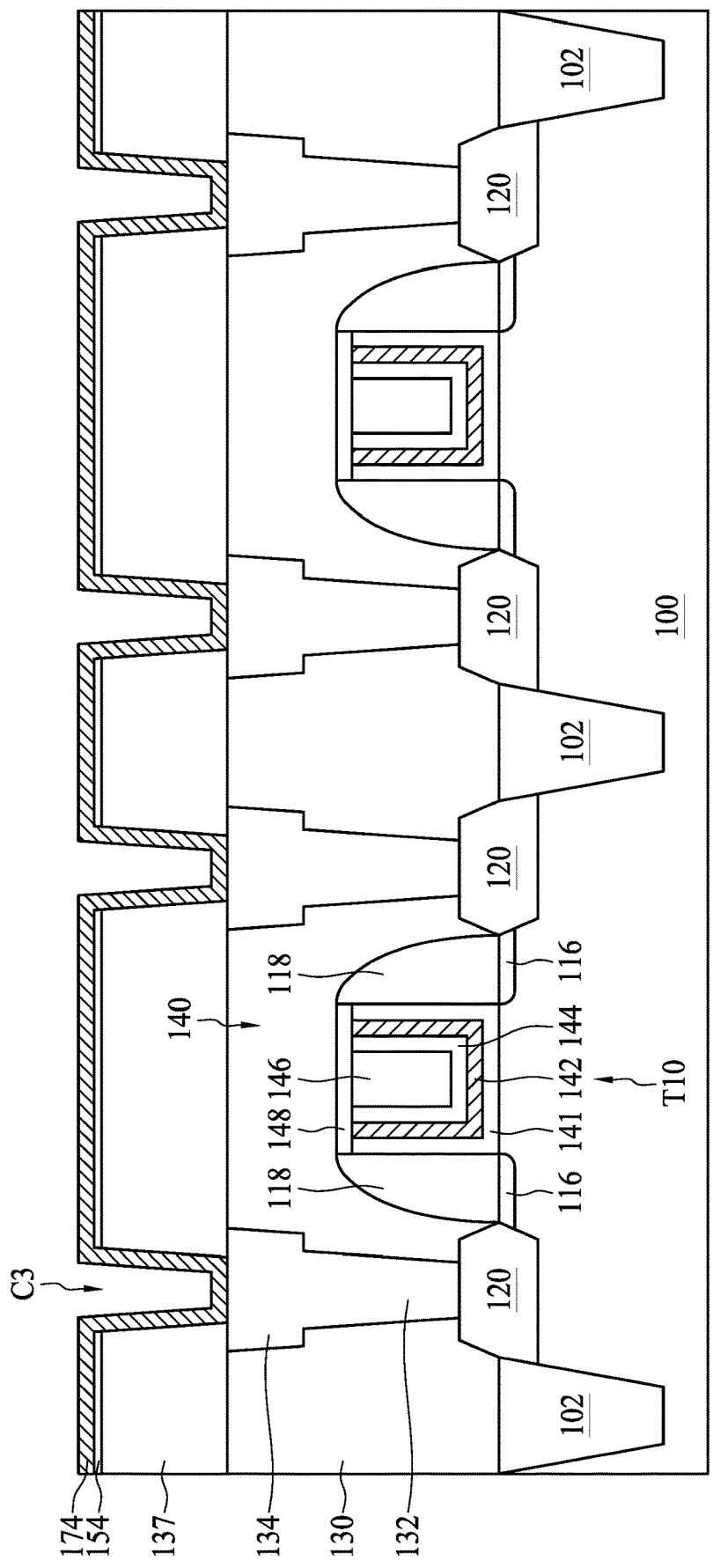

Referring to FIG. 34, a barrier layer 174 is formed on sidewalls of the contact holes C3. The barrier layer 174 may cover portions of the ESL 154, the IMD layer 137 and the conductive lines 134. The barrier layer 176, which may include materials and compositions that are same as or similar to those of the barrier layer 170, is used to prevent a subsequently-formed conductive material, such as Cu, from diffusing into the IMD layer 137.

Figure 35:
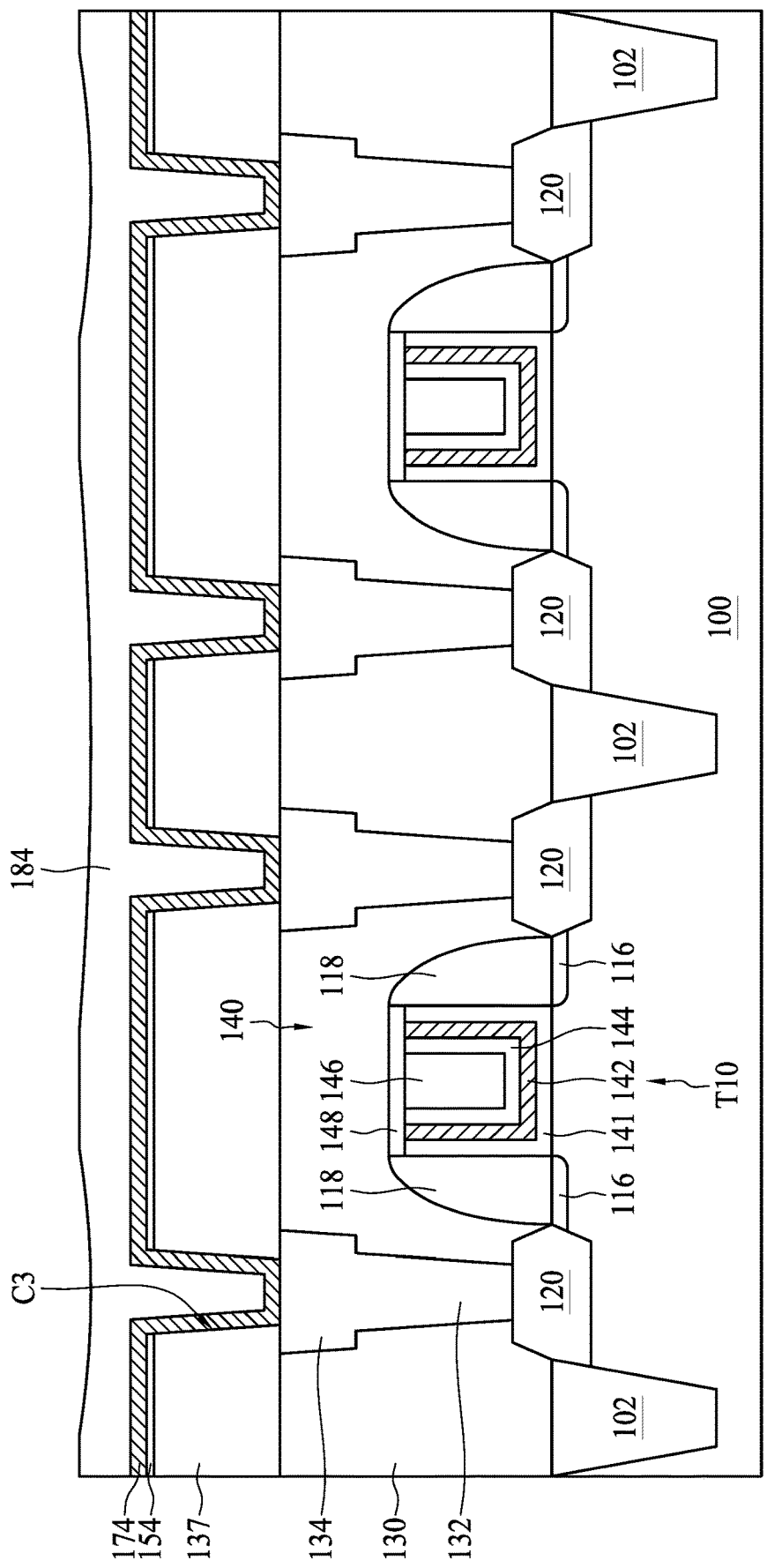

Referring to FIG. 35, a conductive layer 184 is formed over the barrier layer 174 and deposited into the contact hole C3. The material of the conductive layer 184 may be the same as or similar to that of the conductive layer 180.

Figure 36:
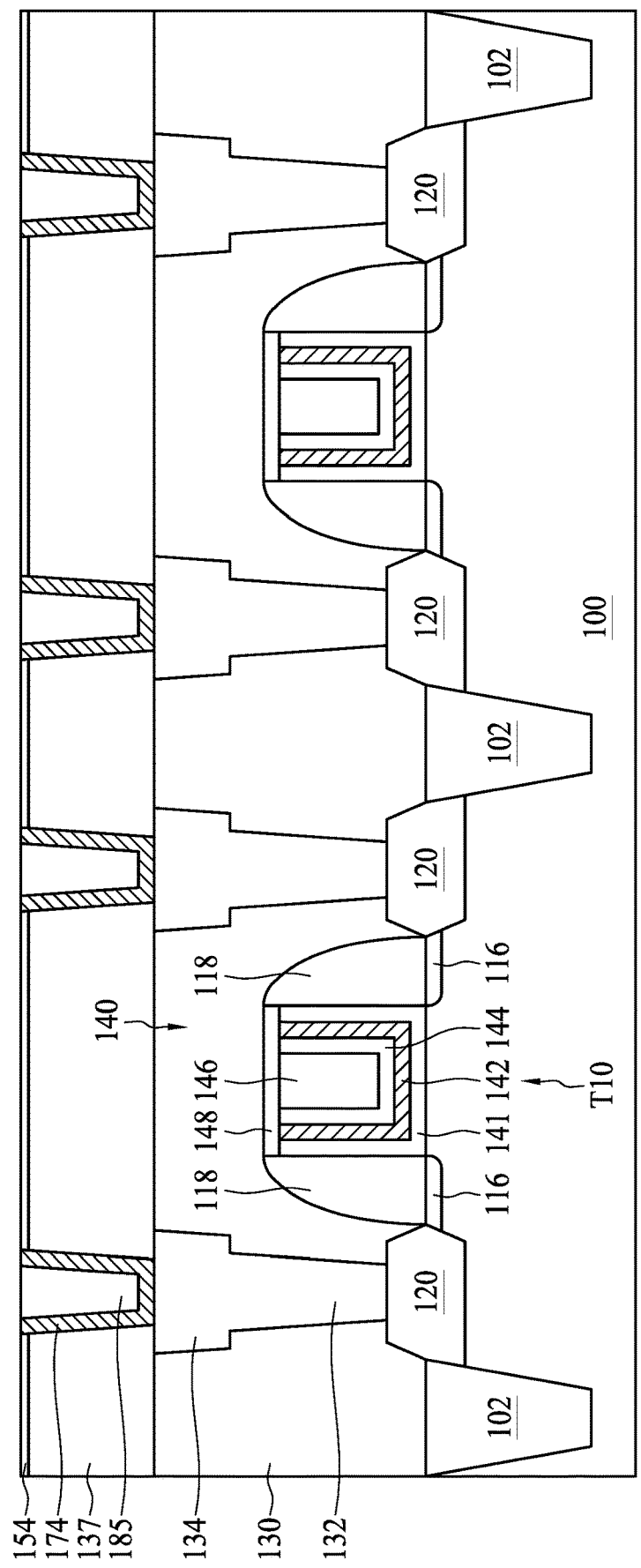

Referring to FIG. 36, a planarization operation, such as CMP, may be used to remove the conductive layer 184 and the barrier layer 174 over the ESL 154. A remaining portion of the conductive layer 184 may form a conductive contact 185. The conductive contact 185 may be electrically coupled to the conductive line 134 through the barrier layer 174. The conductive contact 185 may be further electrically coupled to the epitaxial feature 120. The silicide layer formed on the epitaxial feature 120 can reduce parasitic resistance at a silicon/metal contact junction.

Figure 37:
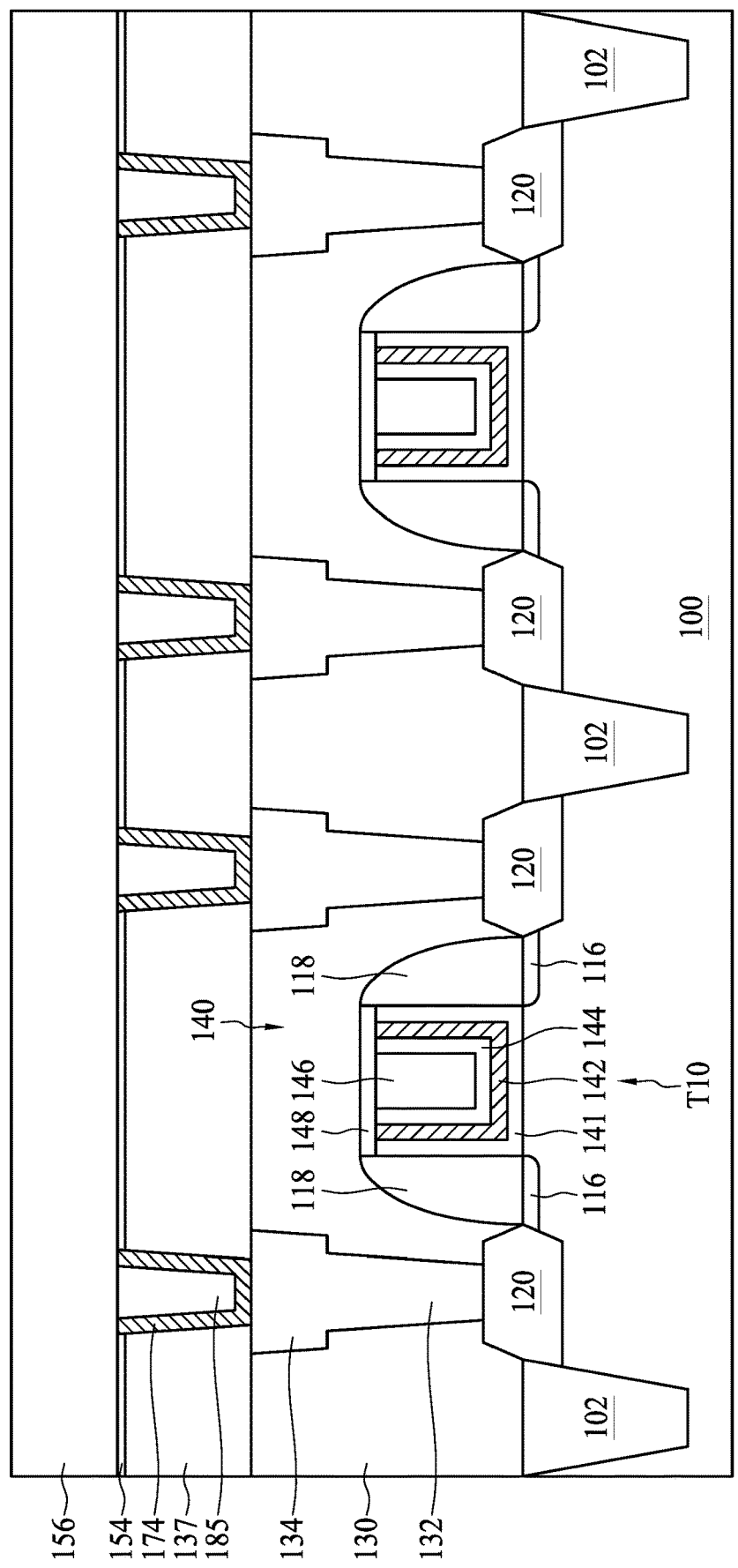

Referring to FIG. 37, an IMD layer 156 is formed on the ESL 154, the barrier layer 174 and the conductive contact 185. The material of the IMD layer 156 may be the same as or similar to that of the IMD layer 152.

Figure 38:
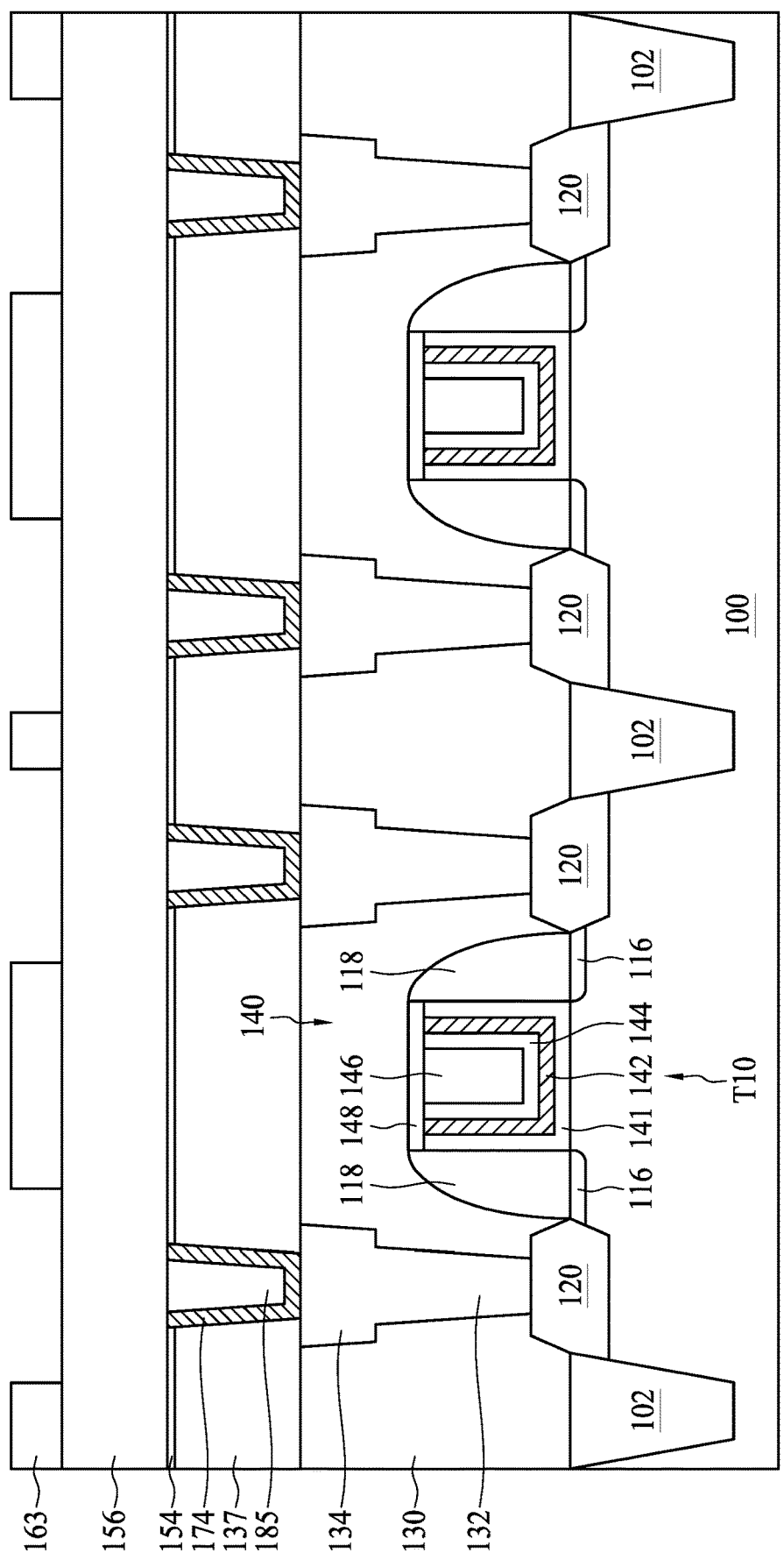

Referring to FIG. 38, a patterned photoresist layer 163 is formed on the IMD layer 156.

Figure 39:
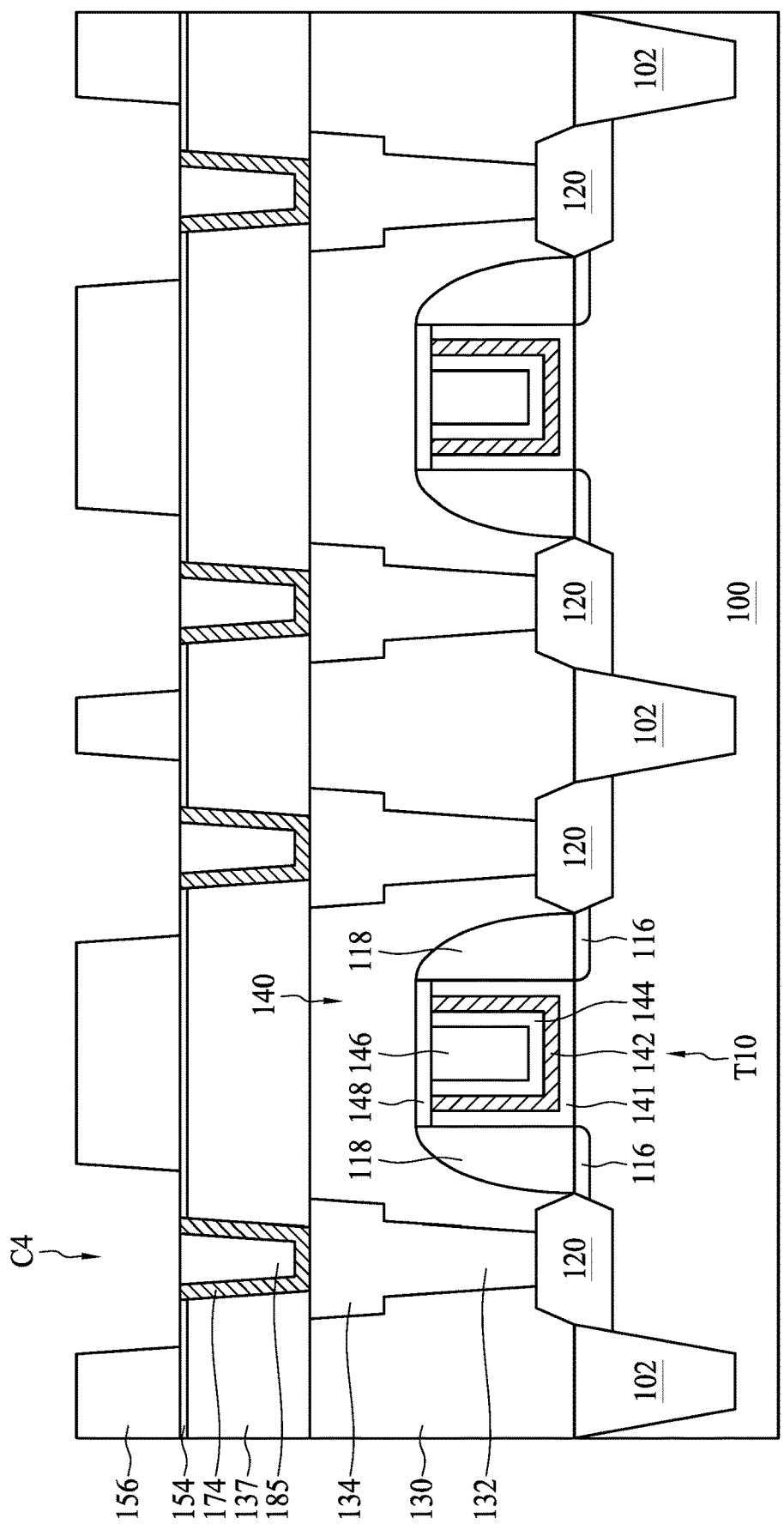

Referring to FIG. 39, an etching operation is performed on the IMD layer 156 to form a contact hole C4 using the patterned photoresist layer 163 as an etching mask. The pattern of the patterned photoresist layer 163 may be transferred to the IMD layer 156. The formed contact hole C4 penetrates the IMD layer 156, and exposes portions of the ESL 154, the barrier layer 174 and the conductive contact 185. In some embodiments, if the etching rates of the IMD layer 156 and the IMD layer 137 are sufficiently different, the IMD layer 156 can be formed directly on the IMD layer 137, i.e., with no interposing ESL 154.

Figure 40:
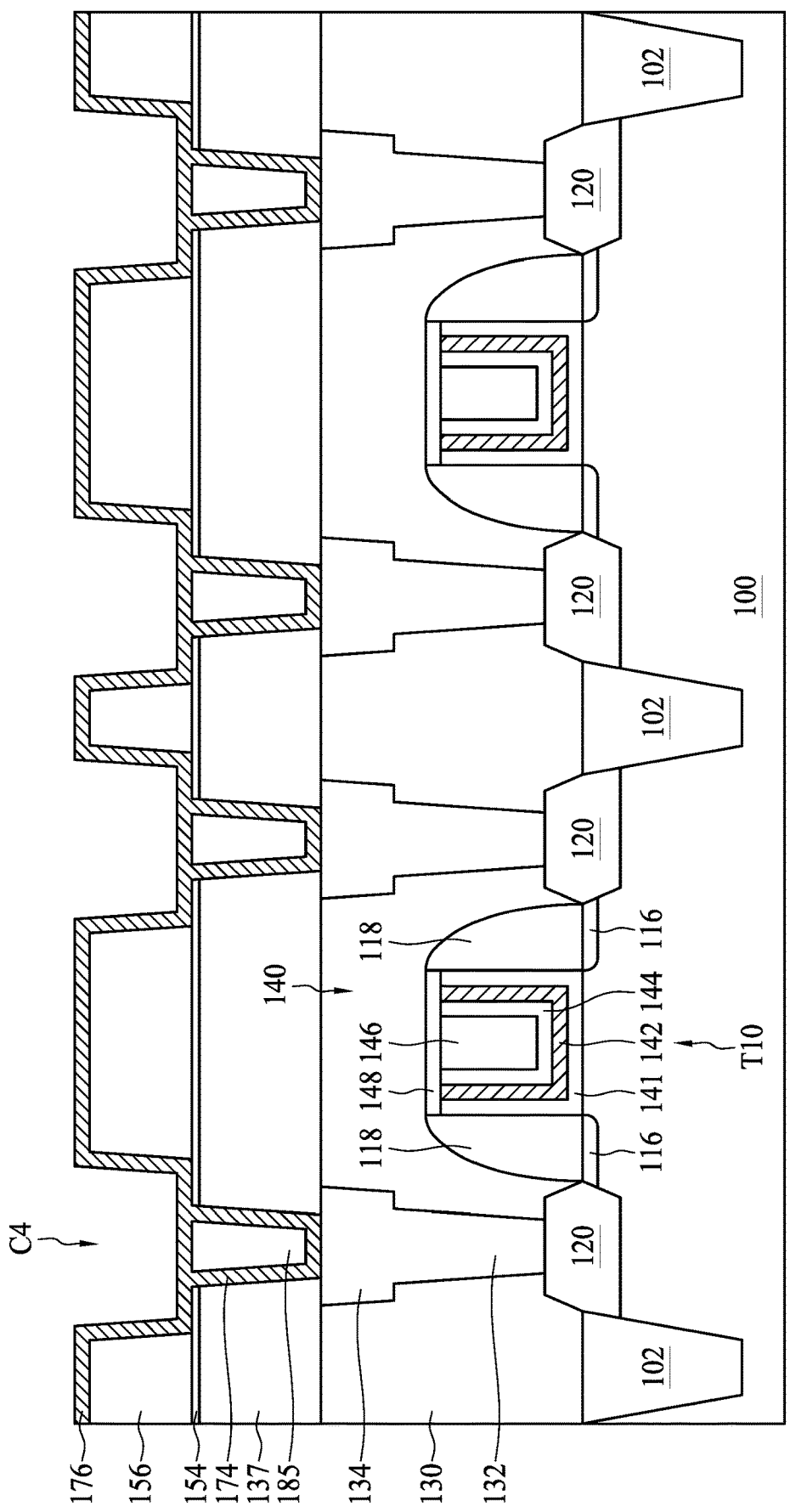

Referring to FIG. 40, a barrier layer 176 is formed on sidewalls of the contact hole C4. The barrier layer 176 may cover portions of the IMD layer 156, the ESL 154, the barrier layer 174 and the conductive contact 185. The barrier layer 176, which may include a material same as or similar to that of the barrier layer 170 or 174, is used to prevent a subsequently-formed conductive material, such as Cu, from diffusing into the IMD layer 156.

Figure 41:
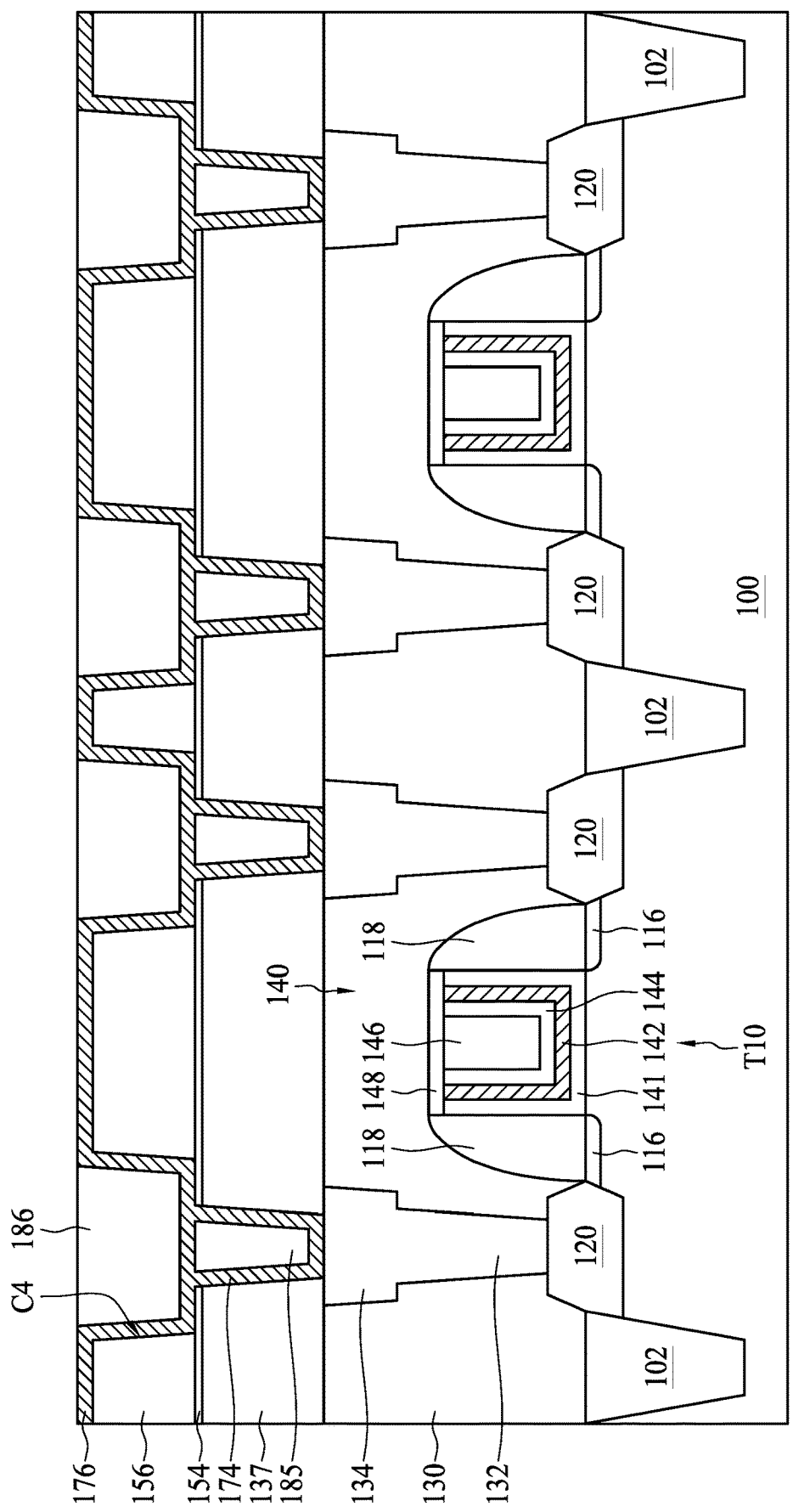

Referring to FIG. 41, a conductive line 186 is formed by depositing a conductive material over the barrier layer 176 and in the contact hole C4. The material of the conductive line 186 may be the same as or similar to that of the conductive line 182.

Figure 42A:
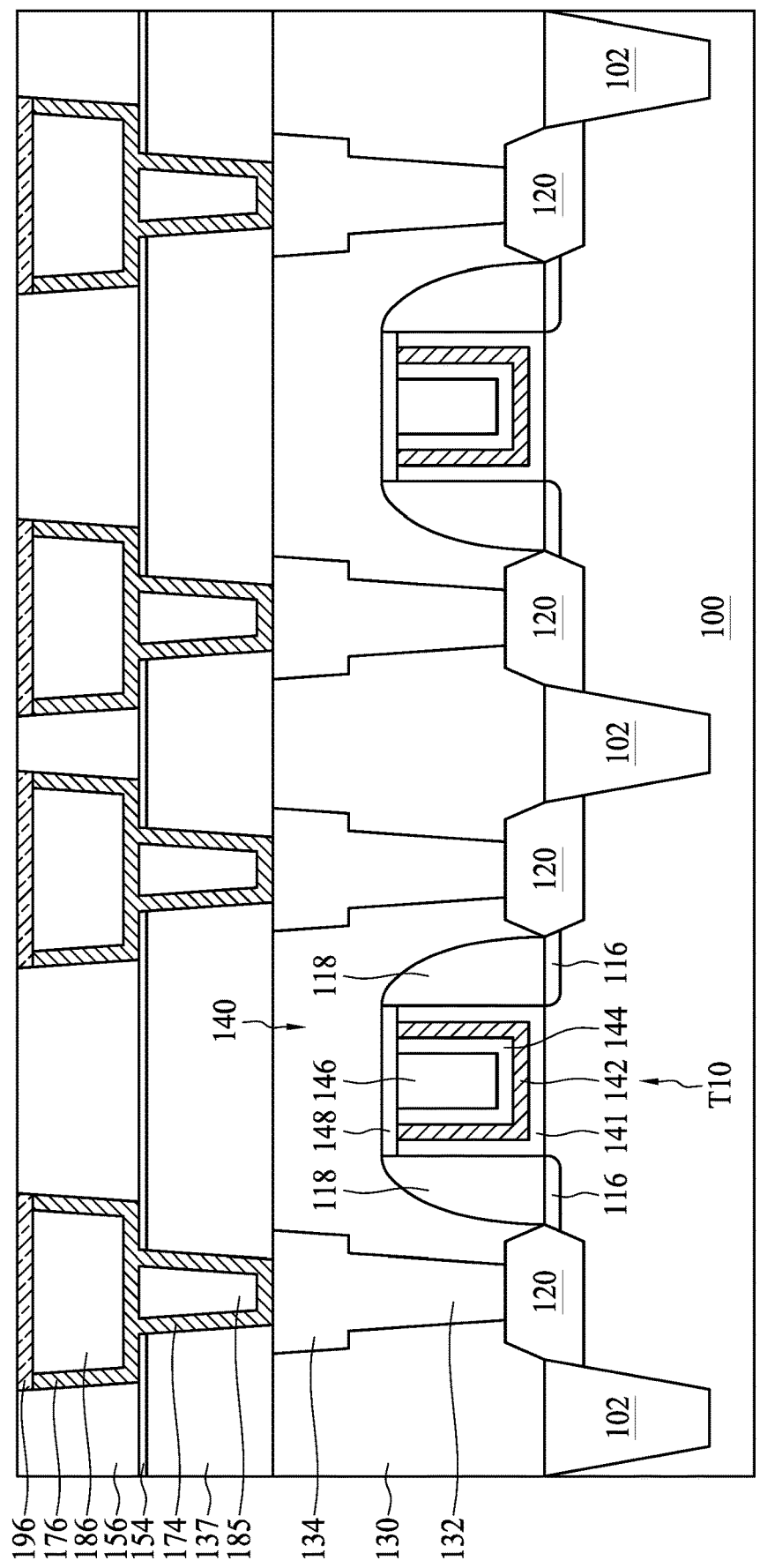
Figure 42B:
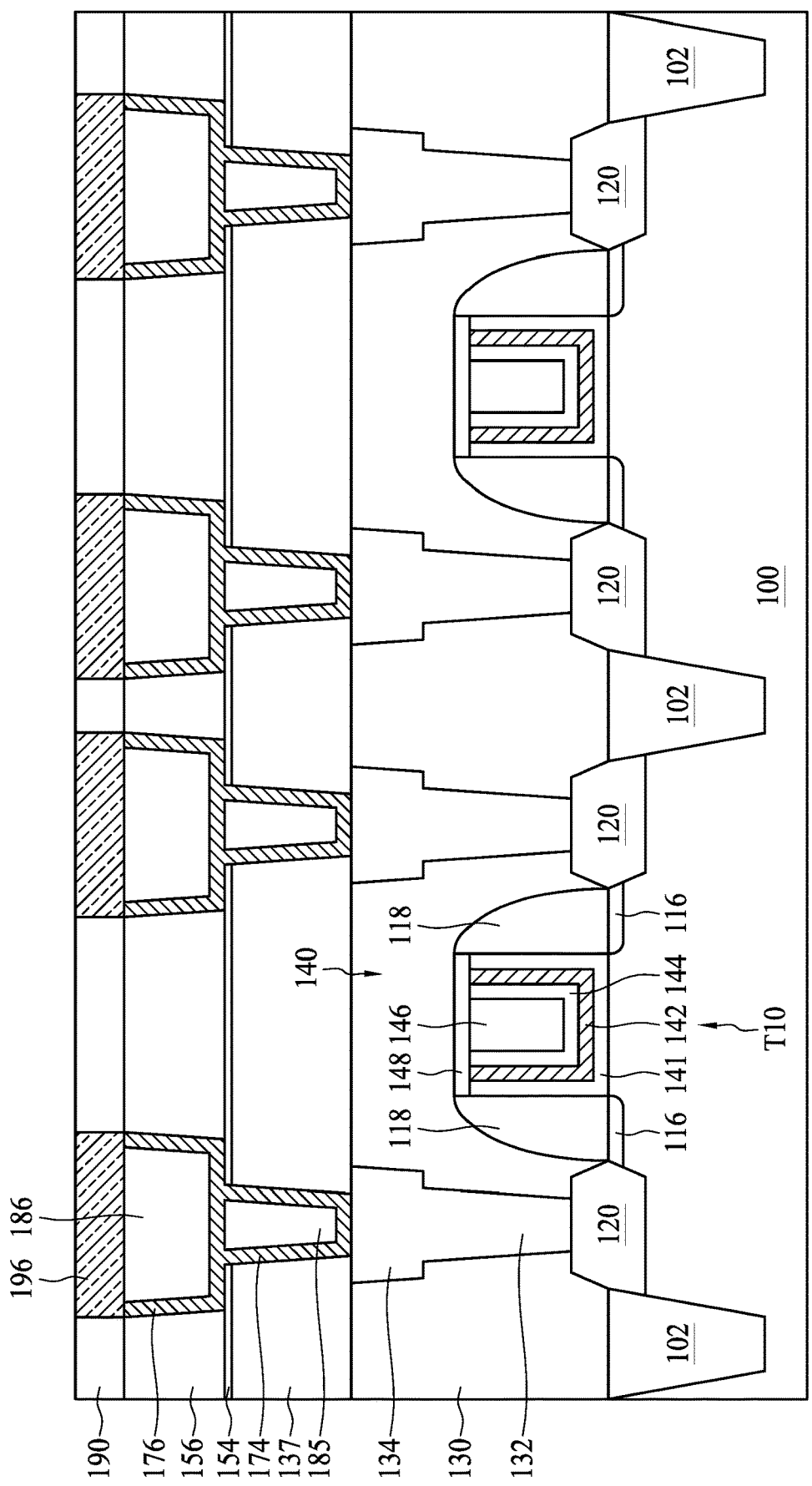

Referring to FIGS. 42A and 42B, a conductive cap layer 196 is formed on the conductive line 186. The formation of the conductive cap layer 196 in FIG. 42A may be similar to that of the conductive cap layer 192 in FIG. 30A. The formation method of the conductive cap layer 196 in FIG. 42B may be similar to that of the conductive cap layer 192 in FIG. 30B.

Figure 43A:
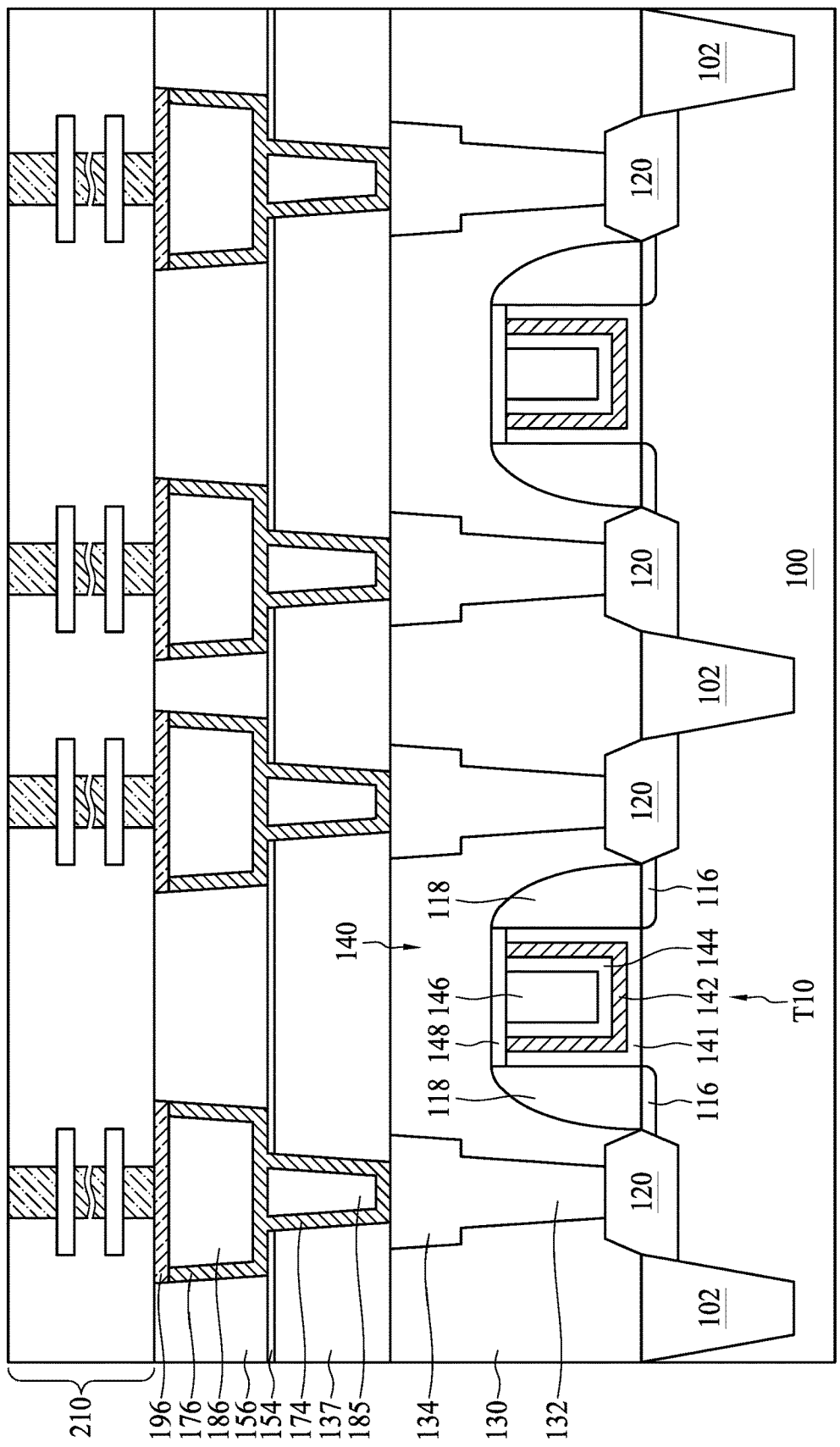
Figure 43B:
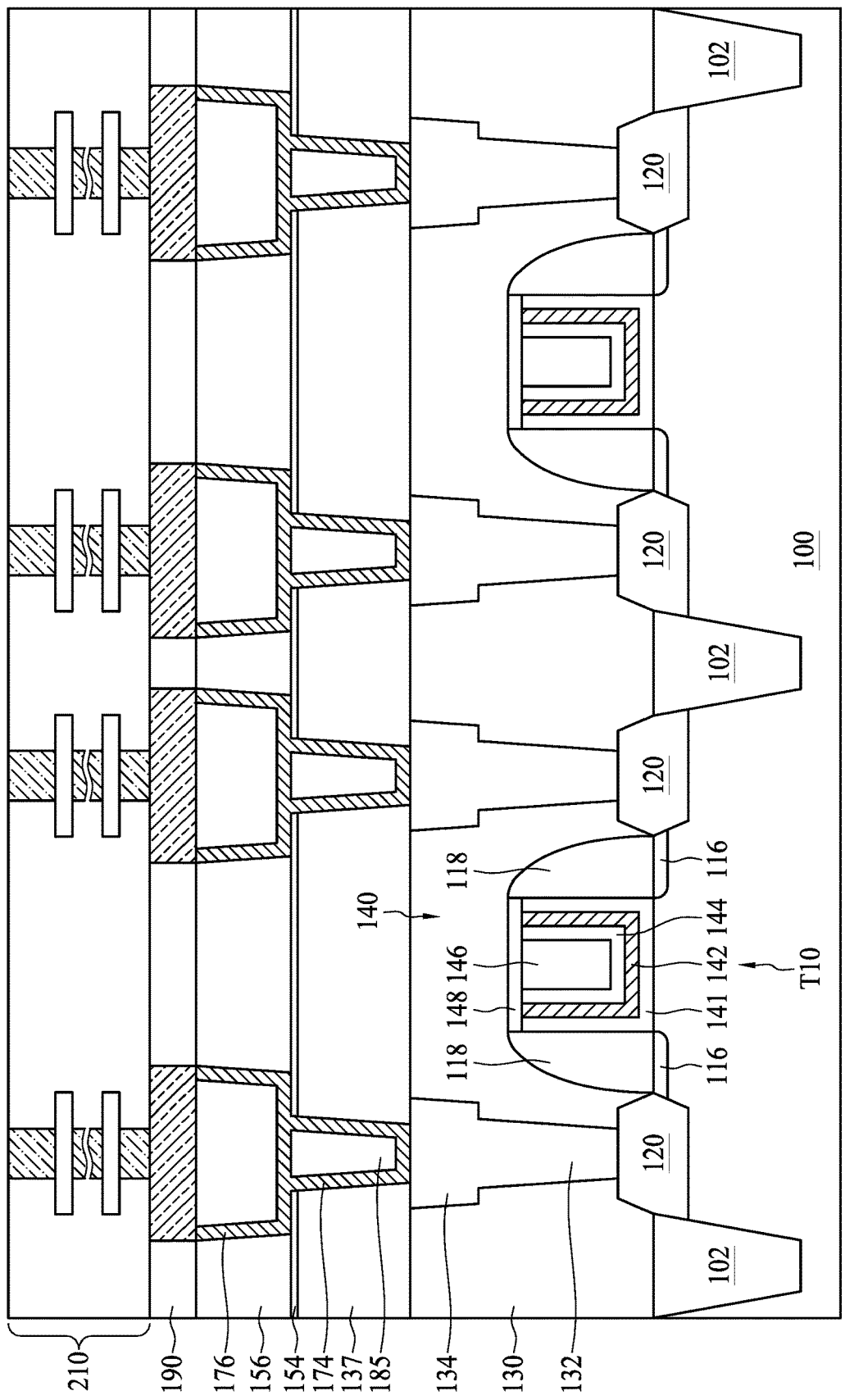

Referring to FIGS. 43A and 43B, an interconnect structure 210 is formed above the conductive lines 186. The interconnect structure 210 may be similar to the interconnect structure 200 in FIG. 31A or 31B and include multiple higher-level metal layers such as conductive vias and conductive lines embedded in one or more dielectric layers. The interconnect structure 210 may be electrically coupled to the conductive lines 186, the conductive contacts 185 and the epitaxial features 120. Although not illustrated, the interconnect structure 210 may be formed using a series of lithographic, etching, deposition and planarization operations. At this stage, operations for forming the semiconductor structure 20 have been completed.

The present disclosure provides a method of manufacturing a barrier layer between a dielectric layer and a conductive structure such as a conductive via or conductive line. The method includes partially oxidizing a material of TiN, TaN, Ta, Ti, TiSN, TaSN, W or WN to form a metal oxide or metal oxynitride on a top portion of the material, followed by forming a glue layer including, for example, cobalt, on the metal oxide or metal oxynitride. Therefore, the barrier layer may at least include three layers. When the metal oxide or metal oxynitride includes tantalum, the metal oxide or metal oxynitride has an atomic ratio of oxygen to tantalum (O/Ta) between about 0.02 and about 1. Since amorphous or low-crystalline oxides may lose their function as a diffusion barrier layer. The metal oxide or metal oxynitride in the barrier layer of the present disclosure having a controlled amount of oxygen atoms can still remain sufficiently crystalline. Therefore, the barrier layer of the present disclosure can be used to effectively prevent a conductive material, such as copper, from diffusing into a neighboring dielectric material. Furthermore, the crystalline metal oxide or metal oxynitride can have a strong affinity to the glue layer.

One aspect of the present disclosure provides a method of manufacturing a semiconductor structure. The method includes: providing a substrate; forming a transistor on the substrate; forming a first dielectric layer over the transistor; forming a second dielectric layer over the first dielectric layer; etching the first dielectric layer to form a first contact hole; etching the second dielectric layer to form a second contact hole connected with the first contact hole; forming a barrier layer within the first contact hole and the second contact hole; and depositing a conductive material on the barrier layer to fill the first contact hole and the second contact hole. The forming of the barrier layer includes: forming a first layer including titanium or tantalum along inner sidewalls of the first dielectric layer and the second dielectric layer under a first pressure; oxidizing a top portion of the first layer under a second pressure to form a second layer, wherein the second layer includes an oxide of titanium or tantalum; and forming a third layer including cobalt on the second layer.

One aspect of the present disclosure provides another method of manufacturing a semiconductor structure. The method includes: forming a transistor on a substrate; forming a first dielectric layer over the transistor; forming a second dielectric layer over the first dielectric layer; recessing the first dielectric layer and the second dielectric layer to form a contact hole; conformally forming a tantalum-containing layer within the contact hole under a first pressure; oxidizing a top portion of the tantalum-containing layer under a second pressure greater than the first pressure to form an oxide of tantalum; conformally forming a cobalt-containing layer over the oxide; and filling the contact hole by depositing a conductive material on the third layer.

Another aspect of the present disclosure provides a semiconductor structure. The semiconductor structure includes: a substrate; a transistor on the substrate; a first dielectric layer over the transistor; a second dielectric layer over the first dielectric layer; a barrier layer extending from the second dielectric layer to the first dielectric layer; and a conductive structure separated from the second dielectric layer and the first dielectric layer by the barrier layer. The barrier layer includes: a first layer, including titanium or tantalum along inner sidewalls of the first dielectric layer and the second dielectric layer; a second layer, being an oxide of titanium or tantalum and over the first layer; and a third layer, including cobalt and over the second layer.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    providing a substrate;
    forming a transistor on the substrate;
    forming a first dielectric layer over the transistor;
    forming a second dielectric layer over the first dielectric layer;
    etching the first dielectric layer to form a first contact hole;
    etching the second dielectric layer to form a second contact hole connected with the first contact hole;
    forming a barrier layer within the first contact hole and the second contact hole; and
    depositing a conductive material on the barrier layer to fill the first contact hole and the second contact hole, wherein the forming of the barrier layer comprises:
        forming a first layer including titanium or tantalum along inner sidewalls of the first dielectric layer and the second dielectric layer under a first pressure; and
        introducing a source gas including cobalt to the first layer under a second pressure greater than the first pressure to form a second layer comprising an oxide of the first layer and a third layer comprising a cobalt-containing layer including a portion of the oxide.

2. The method of claim 1, wherein the first pressure is between about $10^{-8}$ torr and about $10^{-7}$ torr.

3. The method of claim 1, wherein the second pressure is greater than about $10^{-7}$ torr.

4. The method of claim 1, wherein the second layer and the third layer are in-situ formed.

5. The method of claim 1, wherein the first layer is formed in a first chamber and the third layer is formed in a second chamber different from the first chamber, and the substrate is transferred from the first chamber to the second chamber without breaking vacuum.

6. The method of claim 5, wherein the first layer is oxidized in the second chamber.

7. The method of claim 1, wherein the second layer binds the third layer after the third layer is formed.

8. A method of manufacturing a semiconductor structure, comprising:
    forming a transistor on a substrate;
    forming a first dielectric layer over the transistor;
    forming a second dielectric layer over the first dielectric layer;
    recessing the first dielectric layer and the second dielectric layer to form a contact hole;
    conformally forming a tantalum-containing layer within the contact hole under a first pressure;
    introducing a source gas including cobalt to the tantalum-containing layer to form an oxide of the tantalum-containing layer and a cobalt-containing layer including a portion of the oxide; and
    filling the contact hole by depositing a conductive material on the cobalt-containing layer.

9. The method of claim 8, wherein the oxide is simultaneously formed when forming the cobalt-containing layer.

10. The method of claim 8, wherein the oxide is formed in-situ during the formation of the cobalt-containing layer.

11. The method of claim 8, wherein the oxide has a strong affinity to the cobalt-containing layer.

12. The method of claim 8, wherein the oxide is crystalline.

13. The method of claim 12, wherein the oxide of the tantalum-containing layer has an atomic ratio of oxygen to tantalum less than about 1.

14. The method of claim 12, wherein the oxide of the tantalum-containing layer has an atomic ratio of oxygen to tantalum more than about 0.02.

15. A method of manufacturing a semiconductor structure, comprising:
    forming a dielectric layer over a transistor;
    recessing the dielectric layer to form a contact hole;
    conformally forming a barrier layer within the contact hole; and
    depositing a conductive material on the barrier layer to fill the contact hole, wherein the forming of the barrier layer includes:
        forming a first layer including titanium along inner sidewalls of the dielectric layer under a first pressure; and
        introducing a source gas including cobalt to the first layer to form a second layer comprising an oxide of the first layer and a third layer comprising a cobalt-containing layer including a portion of the oxide.

16. The method of claim 15, wherein a thickness ratio between the first layer and the second layer is about 5:1.

17. The method of claim 15, wherein a thickness ratio between the second layer and the third layer is about 1:2.

18. The method of claim 15, wherein the second layer is crystalline.

19. The method of claim 15, wherein the second layer is formed in-situ during the formation of the third layer.

20. The method of claim 15, wherein the first layer, the second layer and the third layer are formed in a same chamber.

* * * * *